(12) United States Patent
Takefman et al.

(10) Patent No.: US 9,779,020 B2
(45) Date of Patent: Oct. 3, 2017

(54) SYSTEM AND METHOD FOR PROVIDING AN ADDRESS CACHE FOR MEMORY MAP LEARNING

(71) Applicant: Diablo Technologies Inc., Ottawa, Ontario (CA)

(72) Inventors: Michael L. Takefman, Nepean (CA); Maher Amer, Nepean (CA); Riccardo Badalone, St. Lazare (CA)

(73) Assignee: DIABLO TECHNOLOGIES INC., Ottawa (CA)

( * ) Notice: Subject to any disclaimer, the term of this patent is extended or adjusted under 35 U.S.C. 154(b) by 650 days.

(21) Appl. No.: 14/265,270

(22) Filed: Apr. 29, 2014

(65) Prior Publication Data

US 2014/0237157 A1    Aug. 21, 2014

Related U.S. Application Data

(63) Continuation-in-part of application No. 14/247,162, filed on Apr. 7, 2014, now Pat. No. 8,972,805, which
(Continued)

(51) Int. Cl.
*G06F 11/10* (2006.01)
*G06F 12/08* (2016.01)
(Continued)

(52) U.S. Cl.
CPC ...... *G06F 12/0804* (2013.01); *G06F 11/1008* (2013.01); *G06F 12/1027* (2013.01); *H03M 13/05* (2013.01)

(58) Field of Classification Search
CPC ............. G06F 11/1008; G06F 12/0804; G06F 12/1027
See application file for complete search history.

(56) References Cited

U.S. PATENT DOCUMENTS 5,459,742 A    10/1995  Cassidy et al.
6,247,104 B1    6/2001  Suzuki et al.
(Continued)

OTHER PUBLICATIONS

Office Action issued on corresponding U.S. Appl. No. 14/265,280 dated Jan. 22, 2016, 14 pages.
(Continued)

*Primary Examiner* — Aracelis Ruiz

(57) ABSTRACT

A system for interfacing with a co-processor or input/output device is disclosed. According to one embodiment, the system provides a one-hot address cache comprising a plurality of one-hot addresses and a host interface to a host memory controller of a host system. Each one-hot address of the plurality of one-hot addresses has a bit width. The plurality of one-hot addresses is configured to store the data associated with a corresponding memory address in an address space of a memory system and provide the data to the host memory controller during a memory map learning process. The plurality of one-hot addresses comprises a zero address of the bit width and a plurality of non-zero addresses of the bit width, and each one-hot address of the plurality of non-zero addresses of the one-hot address cache has only one non-zero address bit of the bit width.

20 Claims, 26 Drawing Sheets

Related U.S. Application Data is a continuation of application No. 13/303,048, filed on Nov. 22, 2011, now Pat. No. 8,713,379.

(60) Provisional application No. 61/457,233, filed on Feb. 8, 2011.

(51) Int. Cl.
  *G06F 12/10* (2016.01)
  *G06F 12/0804* (2016.01)
  *H03M 13/05* (2006.01)
  *G06F 12/1027* (2016.01)

(56) References Cited

U.S. PATENT DOCUMENTS

| | | |
|---|---|---|
| 6,598,098 B1 | 7/2003 | Agami et al. |
| 6,765,506 B1 | 7/2004 | Lu |
| 7,032,158 B2 | 4/2006 | Alvarez et al. |
| 7,328,380 B2 | 2/2008 | Pomaranski et al. |
| 7,984,232 B2 | 7/2011 | Kimura |
| 8,001,434 B1 | 8/2011 | Lee et al. |
| 8,301,833 B1 | 10/2012 | Chen et al. |
| 8,359,501 B1 | 1/2013 | Lee et al. |
| 8,516,185 B2 | 8/2013 | Lee et al. |
| 8,516,187 B2 | 8/2013 | Chen et al. |
| 2005/0204085 A1 | 9/2005 | Fukuyama et al. |
| 2007/0067602 A1 | 3/2007 | Callister et al. |
| 2007/0073921 A1 | 3/2007 | Vemula et al. |
| 2009/0245000 A1* | 10/2009 | Anzou .............. G11C 29/02 365/201 |
| 2010/0070656 A1 | 3/2010 | Snell et al. |
| 2010/0281232 A1 | 11/2010 | Takagi et al. |

OTHER PUBLICATIONS

Handy, Jim, "Using Flash as Memory: A More Straightforward Way to Boost Performance," Objective Analysis Semiconductor Market Research (Jul. 2013).

* cited by examiner

Fig. 1 *(Prior Art)*

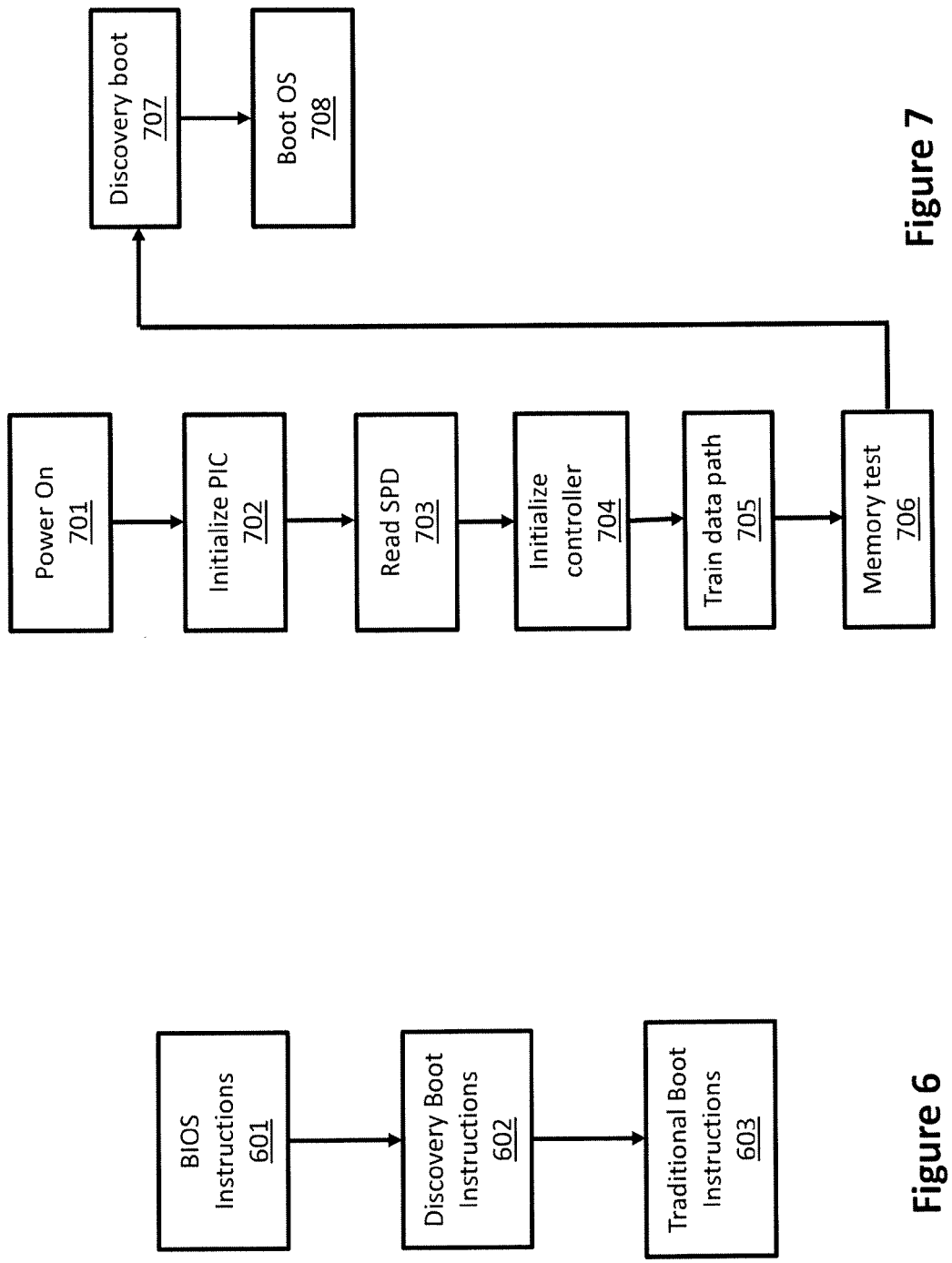

SYSTEM AND METHOD FOR PROVIDING
AN ADDRESS CACHE FOR MEMORY MAP
LEARNING

CROSS-REFERENCE TO RELATED APPLICATIONS

The present application is a continuation-in-part of U.S. patent application Ser. No. 14/247,162, filed Apr. 7, 2014, entitled "System and Method of Interfacing Co-Processors and Input/Output Devices Via a Main Memory System," which is a continuation of U.S. patent application Ser. No. 13/303,048 filed on Nov. 22, 2011, now U.S. Pat. No. 8,713,379, issued Apr. 29, 2014, entitled "System and Method of Interfacing Co-Processors and Input/Output Devices Via a Main Memory System," which claims the benefit of and priority to U.S. Provisional Patent Application No. 61/457,233 filed on Feb. 8, 2011, entitled "Main Memory Co-processors And Input/Output Devices," which are herein incorporated by reference.

COPYRIGHT NOTICE

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

RELATED FIELD

The present disclosure relates in general to the field of computers, and in particular, to a system and method for providing an address cache for memory map learning.

BACKGROUND

A computer system utilizes multiple buses to connect various components of the computer system. The buses are physical connections that allow the various components to communicate information (e.g., commands, addresses, and data) throughout the system. Different buses generally support different data bandwidths. For instance, a main memory bus that connects a central processing unit (CPU) to the system memory (e.g., dynamic random-access memory (DRAM)) can support a significantly higher data bandwidth than that supported by an input/output (I/O) bus (e.g., peripheral component interconnect (PCI), PCI-Express, etc.).

Traditionally, co-processors and I/O devices interface to the computer system via the I/O bus. For some I/O or co-processing applications, interfacing to the computer system via the I/O bus provides reasonable performance. However, the lower bandwidths supported by I/O buses often create communication bottlenecks for I/O or co-processing applications that are able to operate at much faster speeds.

Therefore, there exists a need for a system and method for interfacing co-processors or I/O devices in a computer system that provides enhanced I/O capabilities and performance. Particularly, there exists a need for a system and method for interfacing co-processors or I/O devices via the main memory system.

SUMMARY

A system for interfacing with a co-processor or input/output device is disclosed. According to one embodiment, the system provides a one-hot address cache comprising a plurality of one-hot addresses and a host interface to a host memory controller of a host system. Each one-hot address of the plurality of one-hot addresses has a bit width. The plurality of one-hot addresses is configured to store the data associated with a corresponding memory address in an address space of a memory system and provide the data to the host memory controller during a memory map learning process. The plurality of one-hot addresses comprises a zero address of the bit width and a plurality of non-zero addresses of the bit width, and each one-hot address of the plurality of non-zero addresses of the one-hot address cache has only one non-zero address bit of the bit width.

According to another embodiment, a circuit comprising a one-hot address cache and a host interface to a host memory controller is provided. The one-hot address cache comprises a plurality of one-hot addresses. Each one-hot address of the plurality of one-hot addresses has a bit width.

The above and other preferred features, including various novel details of implementation and combination of events, will now be more particularly described with reference to the accompanying figures and pointed out in the claims. It will be understood that the particular systems and methods described herein are shown by way of illustration only and not as limitations. As will be understood by those skilled in the art, the principles and features described herein may be employed in various and numerous embodiments without departing from the scope of the present disclosure.

BRIEF DESCRIPTION OF THE DRAWINGS

The accompanying drawings, which are included as part of the present specification, illustrate the presently preferred embodiment and together with the general description given above and the detailed description of the preferred embodiment given below serve to explain and teach the principles described herein.

FIG. 6 illustrates an exemplary boot sequence incorporating a discovery boot loader, according to one embodiment;

FIG. 7 illustrates an exemplary flowchart of the DIMM initialization process, according to one embodiment;

Figure 1:
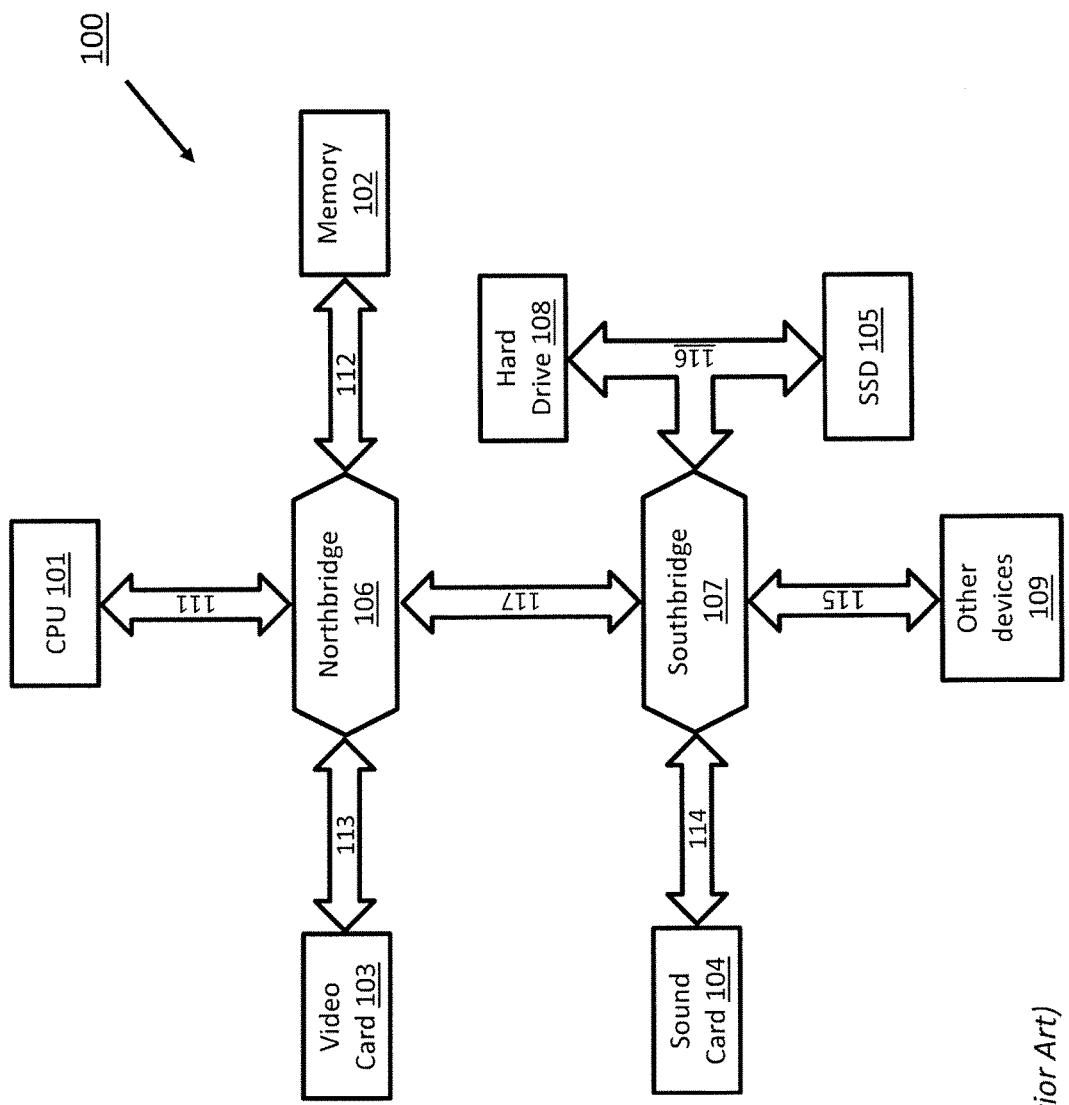
FIG. 1 illustrates a block diagram of a typical prior art computer architecture that connects co-processors or I/O (CPIO) devices via I/O buses.

The figures are not necessarily drawn to scale and elements of similar structures or functions are generally represented by like reference numerals for illustrative purposes throughout the figures. The figures are only intended to facilitate the description of the various embodiments described herein. The figures do not describe every aspect of the teachings disclosed herein and do not limit the scope of the claims.

DETAILED DESCRIPTION

FIG. 1 illustrates a block diagram of a typical prior art computer architecture that connects co-processors or I/O (CPIO) devices via I/O buses. A computer system 100 typically includes a CPU (central processing unit) 101, a main memory unit 102 (e.g., one or more DRAM (dynamic random access memory) modules), and CPIO devices including a video card 103, a sound card 104, a hard drive 108, and a solid state drive (SSD) 105. These components are connected together via buses on a motherboard (not shown). As illustrated, CPU 101, main memory unit 102, and video card 103 are connected via their respective buses, 111, 112 and 113, to a northbridge 106. A northbridge 106 is traditionally a chip in the chipset of the motherboard that connects high speed buses, including the FSB (front-side bus) 111, the main memory bus 112, and the PCI-E (peripheral component interconnect express) bus 113.

Slower buses, including the PCI bus 114, the USB (universal serial bus) 115, and the SATA (serial advanced technology attachment) bus 116 are traditionally connected to a southbridge 107. The southbridge 107 is another chip in the chipset and is connected to the northbridge 106 via a DMI (direct media interface) bus 117. The southbridge 107 manages the information traffic between CPIO devices that are connected via the slower buses. For instance, the sound card 104 typically connects to the system 100 via a PCI bus 114. Storage drives, such as hard drive 108 and SSD 105, typically connect via the SATA bus 116. A variety of other devices 109, ranging from keyboards to mp3 music players, may connect to the system 100 via the USB 115.

Both hard drive 108 and SSD 105 are non-volatile data storage units for the computer system 100. However, they operate using different technologies. SSDs generally refer to drives that utilize solid state memory technology and contain no mechanical moving parts, such as flash memory technology. SSDs generally require less power to operate and support faster read speeds compared to hard drives. As non-volatile (e.g., flash) memory technology continues to evolve and make SSDs more affordable, SSDs are slowly replacing hard drives in many of today's computers.

For certain CPIO devices (e.g., sound card 104), connecting to the computer system via the slower buses provides sufficient data bandwidth. However, for CPIO devices (e.g., SSD 105) that are able to operate at higher bandwidths (e.g., input/output data at speeds faster than that supported by the bus), connecting via the slower buses creates an I/O bottleneck. Additionally, the latency of access to a CPIO device is dependent on the number of intermediary devices that the signals must pass through (i.e., CPU, Northbridge, Southbridge) as well as the actual logic within each device. There exists a need for a system and method of interfacing CPIO devices in a computer system that provides enhanced I/O capabilities and performance (both throughput and latency). Particularly, there exists a need for a system and method for interfacing CPIO devices via the main memory system.

System Providing Enhanced I/O Capabilities and Performance

Figure 2:
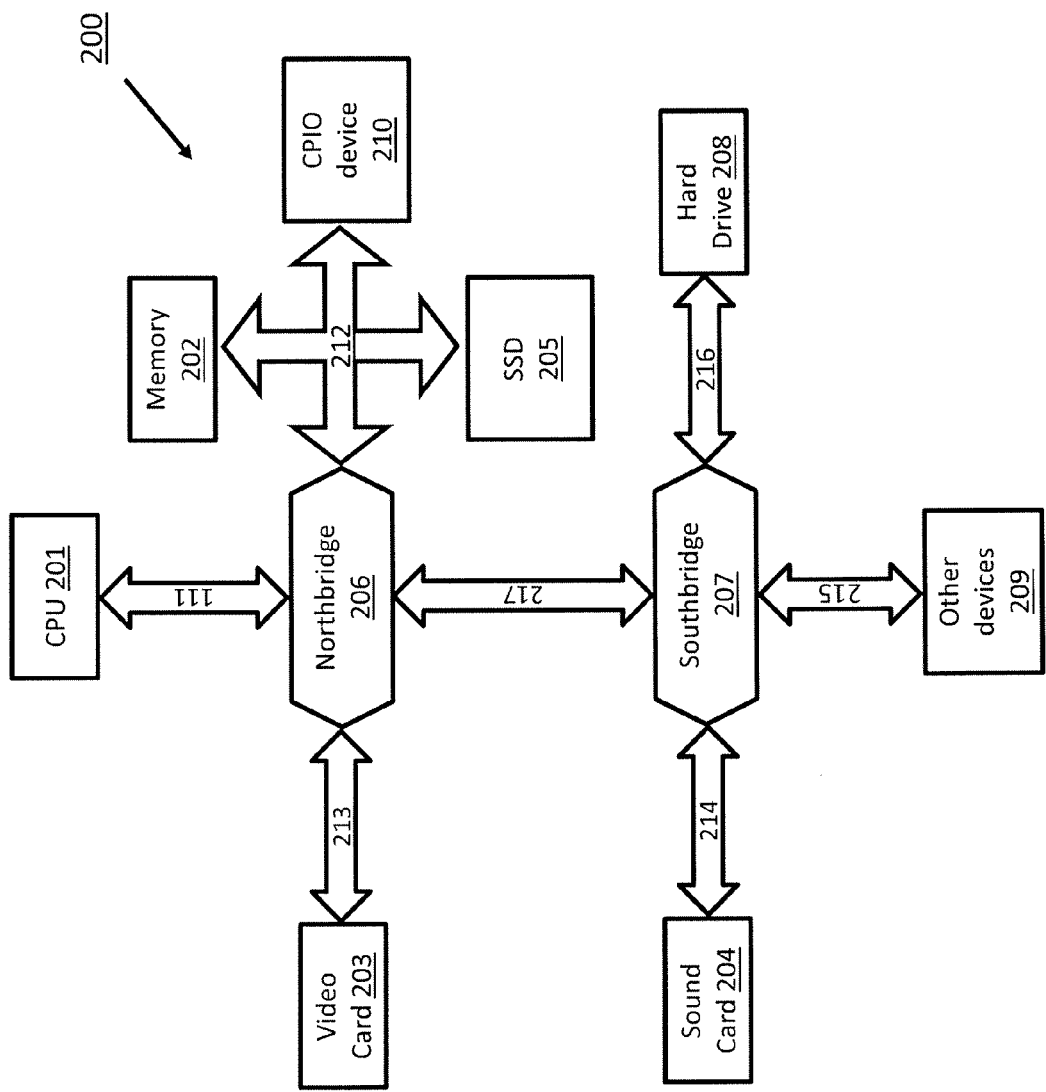
FIG. 2 illustrates a block diagram of a computer architecture for interfacing CPIO devices via the main memory system that provides enhanced I/O capabilities and performance, according to one embodiment.

FIG. 2 illustrates a block diagram of a computer architecture for interfacing CPIO devices via the main memory system that provides enhanced I/O capabilities and performance, according to one embodiment. Computer system 200 includes a CPU (central processing unit) 201, a main memory unit (e.g., DRAM) 202, and CPIO devices including a video card 203, a sound card 204, a hard drive 208, a CPIO SSD 205, and generic CPIO device 210. These components are connected together via buses on a motherboard (not shown). As illustrated, CPU 201, main memory unit 202, and video card 203 are connected via the FSB 211, the main memory bus 212, and the PCI-E bus 213, respectively, to the Northbridge 206. The PCI bus 214, the USB 215, and the SATA bus 216 are connected to the Southbridge 207. While FIG. 2 illustrates each of the block components as discrete components, it is contemplated that some of the components may be combined or integrated with one or more other components. For instance, certain CPUs produced by Intel© and other vendors include both a Northbridge and a Southbridge.

In contrast to the prior art architecture illustrated in FIG. 1, the computer architecture of FIG. 2 connects the CPIO SSD 205 and the generic CPIO device 210 to computer system 200 via the main memory bus 212. Similar to the main memory unit 202 (e.g., DRAM), the CPIO SSD 205 and generic CPIO device 210 connect to a memory controller in the Northbridge 206 via the main memory bus 212. Because the main memory bus 212 generally supports significantly higher bandwidths and lower latencies (e.g., compared to the SATA bus 216), this architecture eliminates or significantly alleviates any I/O bottlenecks that would otherwise limit the I/O performance of the CPIO SSD 205 or the generic CPIO device 210. According to one embodiment, the CPIO SSD 205 and the generic CPIO device 210 are designed to be insertable into a dual in-line memory module (DIMM) memory slot.

As FIG. 2 illustrates, this disclosure contemplates that any CPIO device may connect and interface to the computer system via the main memory bus 212 in a manner that is described below. A CPIO device may include any device that receives data from the host processor, wherein the received data is modified by the CPIO device or is used by the CPIO device to generate new data and the modified or new data is sent back to the host processor. Examples of co-processors include: encryption, compression, digital signal processing, image processing, and pattern matching. Examples of input/output devices include: non-volatile storage, wireless communications, wired communications, RAID control devices.

Although CPIO SSD 205 is used to facilitate the description below, the scope of this disclosure is not limited to the application of SSDs or to the application of any particular CPIO device. The methods and systems disclosed herein are applicable for use with any CPIO device. CPIO SSD 205 belongs to a new type of CPIO device. To distinguish from prior art memory devices and to simplify explanation, this new type of a memory module (or a CPIO device) is also referred to as a "TeraDIMM." Names and labels (e.g., "TeraDIMM", "Rush", "Bolt", "data buffer (DB)", etc.) are used herein only for the purposes of description and should not be interpreted as limiting in any way.

In the context of a storage CPIO device, a TeraDIMM (also herein referred to as "CPIO DIMM") is a new class of DIMM memory that enables the creation of physical memory systems that can match the virtual memory capabilities of CPU's by integrating non-volatile memory (e.g., NAND flash, phase-change, etc.) into, for instance, a DDR-3 or DDR-4 memory channel. CPIO DIMMs that are compatible with future memory technologies (e.g., DDR-5, etc.) are contemplated and are within the scope and spirit of this disclosure.

A CPIO DIMM acts in a manner similar to an SSD, but with the parallelism, bandwidth, scalability advantages that comes from the form factor and location in the main memory system as compared to the limited number of PCI-E devices or disk drives. A CPIO DIMM can be used as: a virtual memory swap device, a generalized file system device, a cache layer for remote storage. As far as the system is concerned, when connected to the system, a CPIO DIMM appears to be a standard DIMM memory device, such as an RDIMM (registered DIMM). A number of implementations of the CPIO DIMM are contemplated. For instance, a CPIO DIMM may also appear to the system as a UDIMM (unregistered memory), a LRDIMM (load-reduced DIMM), etc.

A CPIO DIMM is distinguishable from a SATADIMM that is produced by Viking Modular Solutions. A SATADIMM resides in the DIMM memory slot of a motherboard to take advantage of spare DIMM memory slots for drawing power. However, I/O operations such as data transfers to and from a SATADIMM are by way of a SATA cable connected to the SATADIMM. Thus, unlike a CPIO DIMM, a SATADIMM does not take advantage of the significantly higher bandwidth of the main memory bus for I/O operations. A CPIO DIMM is also distinguishable from a non-volatile DIMM (NVDIMM). An NVDIMM resides in the DIMM memory slot and acts as a normal DDR-3 DIMM during normal operations. When a power failure occurs, the CPU loses power and stops accessing the NVDIMM. At this point, the NVDIMM uses stored energy to copy the data from the DRAM to the non-volatile memory (e.g., a Flash memory) contained on the NVDIMM. When power is restored, the data is copied from the non-volatile memory to the DRAM, therefore the host has exactly the same data as was present just before the power failure. It is important to note that NVDIMMs could not support concurrent access of the DRAM by the host and by the Flash sub-system, therefore an NVDIMM is not equivalent to an SSD.

CPIO DIMM Architecture

A CPIO DIMM may be a single-rank DIMM, a dual-rank DIMM, or a quad-rank DIMM. The number of ranks presented is a function of the number of chip select (CS) signals that are decoded as distinct address spaces in the system memory map. A single rank CPIO DIMM may contain no ranks of DRAM that are directly accessible by the host. Regardless of the number of ranks of memory presented to the host, a CPIO DIMM may include one or more ranks of non-volatile memory (NVM). According to one embodiment, the number of ranks of a CPIO DIMM refers to the number of memory-mapped control/data/status buffers of the controller ASIC that are accessible by the host. It is noted that the phrase "NVM rank" is herein used to indicate the control/data/status buffers associated with making accesses to the NVM through the controller ASIC. It should be clear that the NVM is not directly accessible by the host in the manner of a DRAM rank.

According to one embodiment, a dual-rank CPIO DIMM includes one rank of NVM and one set of the control/data/status buffer space of the controller ASIC. According to another embodiment, a quad-rank CPIO DIMM includes two distinct sets of control/data/status buffers in controller and two ranks of DRAM. This disclosure is not limited to these embodiments and CPIO DIMMs having increasingly more ranks are contemplated (e.g., 6-rank, 8-rank, etc.). A rank of memory generally refers to the set of memory devices on a module that is selected by the same chip select signal. The number of ranks that is accessible on a memory module depends on the memory controller. For instance, a memory controller that provides two chip select signals per memory slot can access up to two ranks on a memory module. A memory controller that provides four chip select signals per memory slot can access up to four ranks on a memory module. Furthermore, address decoding as described in text books such as "Computer System Architecture 2nd Edition" by M. Morris Mano (1984) demonstrates how multiple ranks of memory can be decoded using a select signal and one or more address bits. As such, schemes such as Rank Multiplication could be supported.

For a single-rank CPIO DIMM, BIOS (basic input/output system) changes may be implemented to pass the BIOS's memory test. The BIOS is a set of firmware instructions that is run by a computer system to set up hardware and to boot into an operating system when it is first powered on. One of the first operations performed by the BIOS after powering on is to access the memory module's serial presence detect (SPD). Accessing the SPD provides the BIOS with information about the memory module, such as its size (e.g., number of ranks), data width, manufacturer, speed, and voltage. After determining the memory module's rank, the BIOS typically performs a memory test on each rank in the module. A single-rank CPIO DIMM may fail this memory test because it does not have as much physical DRAM-speed memory as declared in the SPD. Although a single-rank CPIO DIMM may respond to all memory addresses at speed, it generally aliases memory words. A memory test may detect the aliasing as a bad memory word.

For a dual/quad-rank CPIO DIMM that includes DRAM, no BIOS changes may be required to bypass the BIOS's memory test. When a dual/quad-rank CPIO DIMM is first powered on along with the computer system, the CPIO DIMM aliases the chip signals that select the NVM ranks to the chip signals that select the DRAM ranks. For instance, for a dual-rank CPIO DIMM, chip select signal 1 (CS1) that selects the NVM rank may be aliased to the CS0 that selects the DRAM rank. This way, when the computer system selects the NVM rank to write and read from, the data is actually written and read from the DRAM rank. Similarly, for a quad-rank CPIO DIMM, CS2 and CS3 for selecting the two NVM ranks may be aliased to CS0 and CS1 which are used to select the two DRAM ranks. According to one embodiment, a dual-rank CPIO DIMM may be advertised as a single-rank DIMM so that only the rank of DRAM is used during the BIOS memory test.

Figure 3:
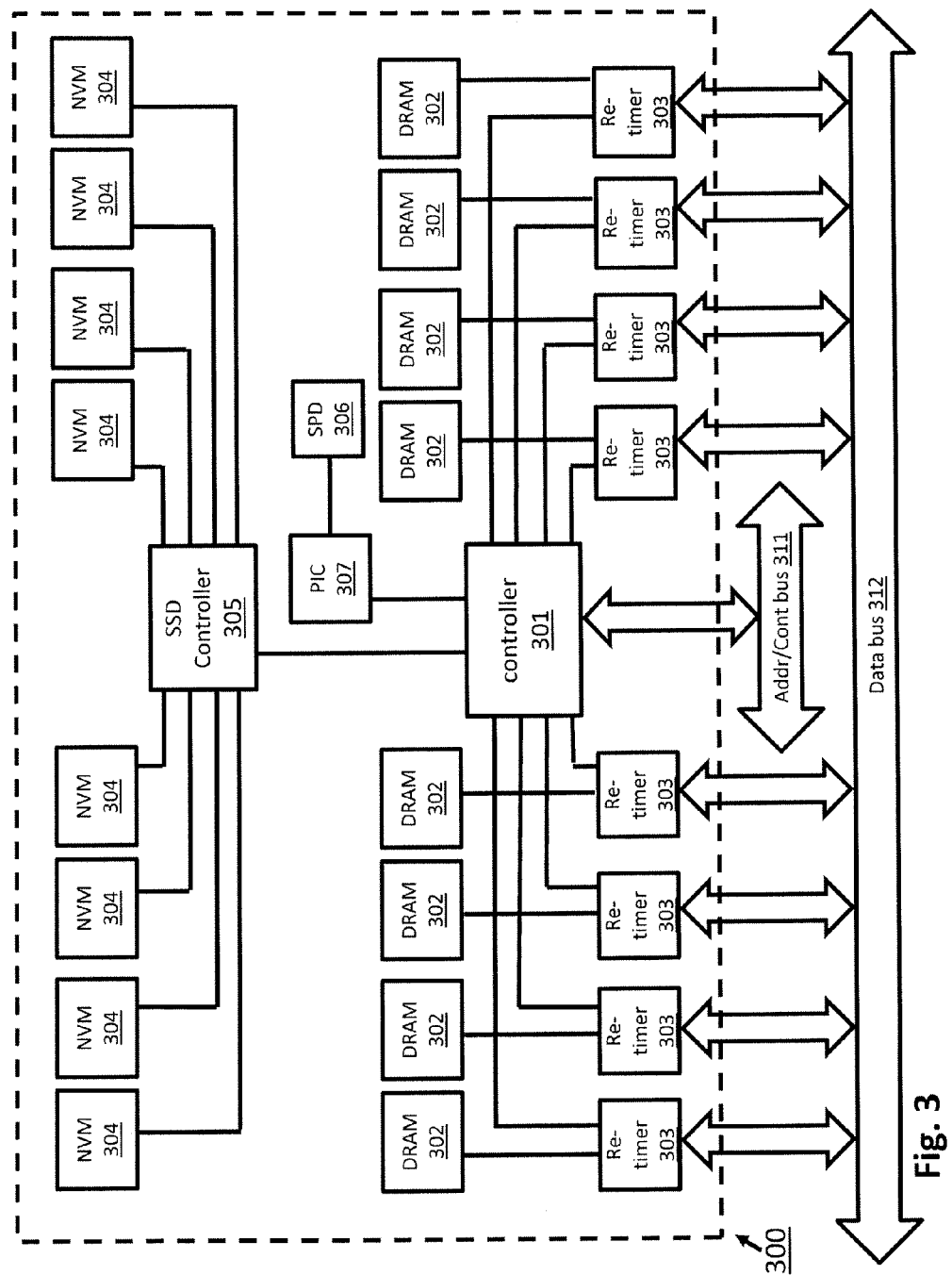
FIG. 3 illustrates a block diagram of an exemplary dual-rank dual in-line memory module (DIMM), according to one embodiment.

FIG. 3 illustrates a block diagram of a dual-rank CPIO DIMM, according to one embodiment. The CPIO DIMM 300 includes an ASIC 301 (herein also referred to as "Rush," "controller," or "controller ASIC"), a rank of DRAM devices 302, a number of data buffer devices 303, herein "data buffer (DB) devices," a rank of NVM devices 304, an SSD controller 305, an SPD 306, and a PIC microcontroller 307. Similar to an RDIMM, the controller 301 provides registers and a phase-locked loop circuit, herein "RPLL circuitry," to reduce the electrical load on the control lines for the memory controller. The controller 301 also includes control circuitry for the re-timer 303 (herein also referred to as "data buffer (DB)," "Bolt" or "Bolt Devices") and an interface (e.g., SATA, PCI-E, etc.) to the SSD controller 305. The SSD controller 305 manages the flow of data going to and from the NVM devices 304. It is contemplated that the functions of the SSD controller 305 may be integrated into the controller 301. The address/control bus 311 is connected to the controller 301 while the main memory bus 312 is separated from the on-DIMM memory bus by the re-timers 303.

According to embodiment, each of the re-timers 303 includes three DDR-3 ports with bi-directional octal flip flops and muxes that allow the host port (connected to the memory bus) to connect to any of the three DDR-3 ports. Furthermore, each port of the DDR-3 ports can be tri-stated and can signal using DDR-3 DQ/DQS signaling. Re-timers 303 provide retiming of data bursts from the computer system to/from the DRAM devices 302 or controller 301. Re-timers 303 also provide a separation that allows on-DIMM DMA (direct memory access) to occur between the DRAM devices 302 and the controller 301.

One aspect to the controller 301 data interface is the inclusion of per-lane delay compensation circuits that, for instance, provide programmable launch times and lane de-skew on receive. Because of the difference in the distances between the re-timers 303 and the controller 301 and the re-timers 303 and the DRAM devices 302, the CPIO DIMM may arrange its launch time such that its data arrives at an appropriate time. It is contemplated that these values may be calibrated during manufacturing and stored in onboard memory, such as NVRAM (non-volatile RAM). It is also contemplated that with appropriate changes to the BIOS firmware, these calibrations may be performed in-system as part of other BIOS calibrations.

Figure 4:
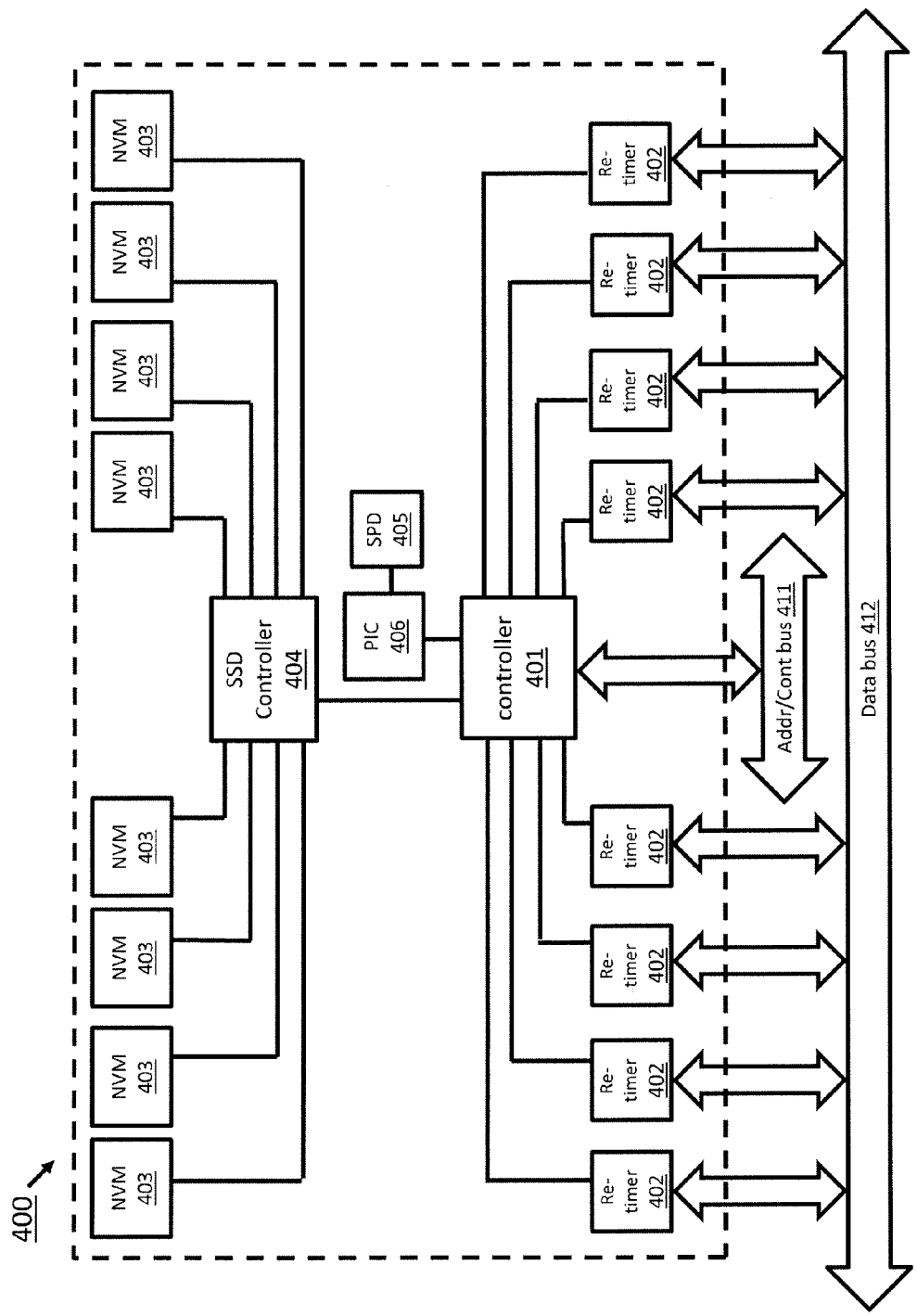
FIG. 4 illustrates a block diagram of an exemplary single-rank DIMM, according to one embodiment.
Figure 5:
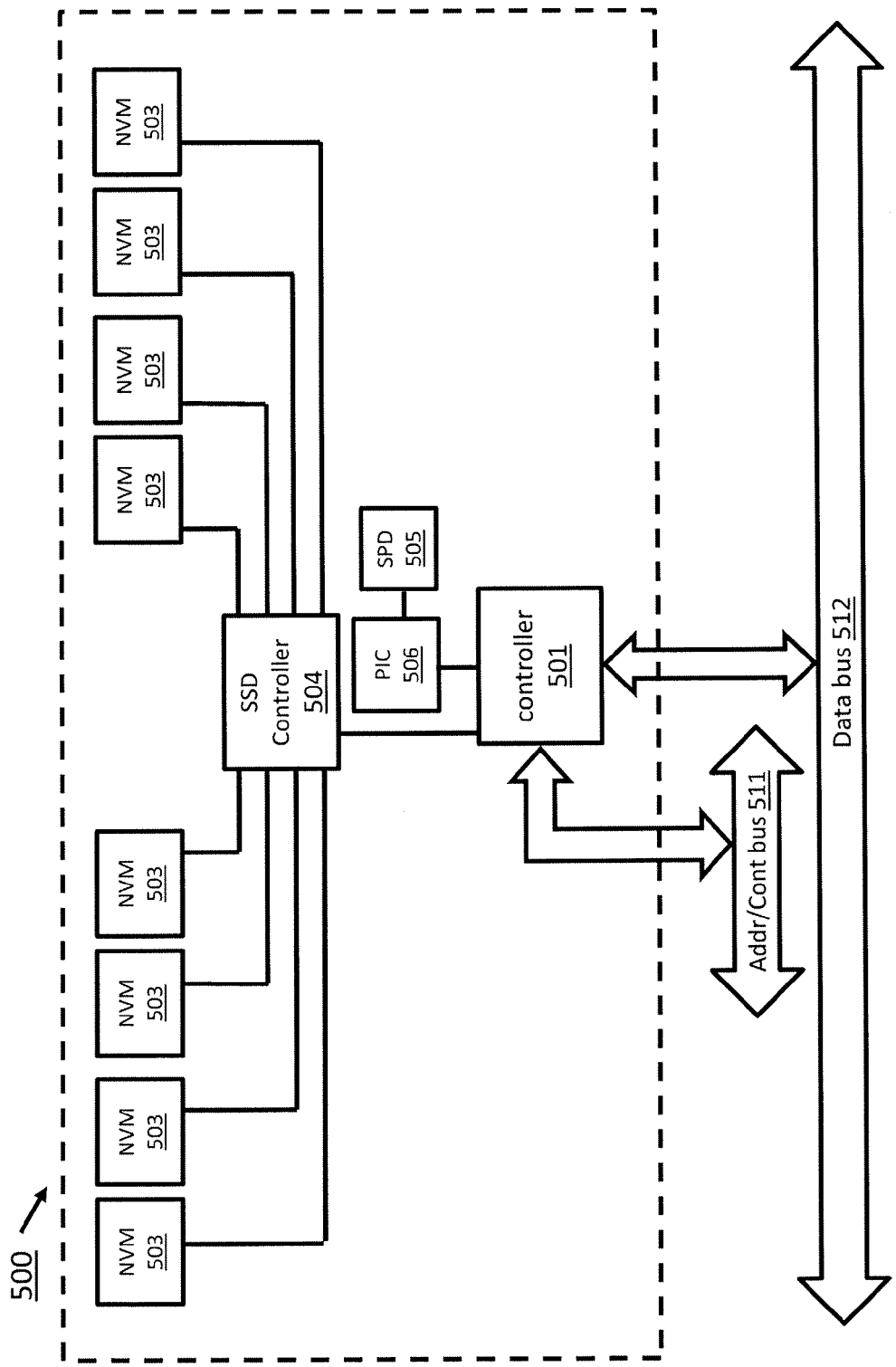
FIG. 5 illustrates a block diagram of an exemplary single-rank DIMM in which the memory bus is connected directly to the controller, according to one embodiment.

FIG. 4 illustrates a block diagram of an exemplary single-rank CPIO DIMM, according to one embodiment. Because this embodiment does not include any DRAM devices, it provides for significantly more room for NVM devices. In one embodiment, a DB device may be replaced with the re-timer 402 that contains two DDR memory ports. It is understood that data buffer (DB) and re-timer are interchangeable from a control aspect; therefore the term re-timer and DB can be interchangeably used without limiting the scope of the present subject matter. As discussed above, BIOS changes may be implemented to pass the memory test at BIOS boot (e.g., disable the memory test). According to one embodiment illustrated in FIG. 5, the memory bus 512 may be connected directly to the controller 501. This embodiment does not include any DRAM or re-timers.

CPIO DIMM Installation

In addition to performing a memory test, the BIOS generally controls the programming of the CPU memory controller and creates a mapping used by the operating system (OS) to understand which memory addresses are valid. The mapping of host logical addresses to DIMM physical addresses depends on the design of the CPU and the BIOS programming. A number of features that are discussed later are designed to avoid having to make changes to the BIOS. However, BIOS changes to disable the memory test may be necessary for a single-rank CPIO DIMM. Thus, a CPIO DIMM may be installed on a computer system with or without BIOS changes.

For systems in which BIOS changes to accommodate a CPIO DIMM are not desired or not possible, a discovery boot loader may be installed to properly configure the operating system/driver for operation with a CPIO DIMM. FIG. 6 illustrates that the discovery boot loader instructions 602 may be performed after the BIOS instructions 601 and prior to the traditional boot loader instructions 603. From a DIMM operational perspective, there is no difference whether a CPIO DIMM is initialized using a discovery boot loader. A CPIO DIMM driver may also be installed for communicating with the controller ASIC.

According to one embodiment, the discovery boot loader includes instructions for system discovery. System discovery is a subsection of the CPIO DIMM initialization process and may be necessary when BIOS changes are not made to properly recognize a CPIO DIMM. The role of discovery is to determine where a CPIO DIMM fits into the memory map, and determine if that mapping can be used by the CPIO DIMM driver to operate the CPIO DIMM. If the memory map is conducive to CPIO DIMM operation, then the discovery process may proceed to learn about any data scrambling, address mapping, ECC generation, data interleave/de-interleaving, and bit swizzling for the computer system. Finally, the boot loader modifies the memory map tables (used by the OS for understanding the memory map) to instruct the OS that the CPIO DIMM memory space is reserved. Once the discovery boot loader completes its operations and has made proper modifications to the BIOS memory map tables, the traditional boot loader is launched. Alternatively, the BIOS can use a mechanism such as Advanced Configuration and Power Interface (ACPI) to communicate the memory map information to the operating system and driver.

CPIO DIMM Initialization without BIOS Changes

FIG. 7 illustrates an exemplary flowchart of the CPIO DIMM initialization process, according to one embodiment. The CPIO DIMM initialization process covers the period from the press of the power-on button to the OS having initialized the CPIO DIMM driver. In this embodiment, the CPIO DIMM is advertised as an RDIMM by the SPD and the initialization sequence for RDIMMs (RPLL sequencing) is followed.

The CPIO DIMM is powered on at step 701. After powering on, the PIC in the CPIO DIMM is initialized at step 702. The PIC is connected to a power rail that also powers the SPD. The PIC should boot and be ready to receive I2C operations from the host computer system (herein "host") before the host attempts to read the SPD. Alternatively, the PIC may provide SPD data to the host instead of the host reading the SPD directly. Once power to the DIMM is available, the controller can read configuration/calibration information out of a non-volatile memory or the PIC can program the controller registers. Information that is programmed into the controller ASIC may include:

Manufacturing calibration data to enable controller and re-timer operation on a per voltage and operating speed basis;

RPLL/DRAM/re-timer configuration override data on a per voltage and operating speed basis; and DIMM configuration data including the number of ranks of DRAM present and the organization of the DRAM (x4/x8)

The host then reads the SPD at step 703. Generally, the BIOS reads the SPD values from all of the DIMMs to determine the intersection of operational parameters. Depending on the SPD values read, the BIOS determines the voltages to apply to the DIMMs. An SPD, typically, includes non-volatile memory (e.g., EEPROM) for storing memory module information and a thermal sensor. According to one embodiment, the PIC may instead store the memory module information (herein "SPD load") in its internal NVM and use the SPD only as a thermal sensor. This allows multiple SPDs to be stored in the PIC NVM. Storing multiple SPD loads allows the CPIO DIMM to appear as a single-rank (safe mode) or dual-rank (normal mode) CPIO DIMM. A safe mode may exist to provide a method by which the DIMM can boot in a system in most cases.

Next, the RPLL circuitry in the controller ASIC and the DRAM memory is initialized at step 704. During RPLL initialization, a number of RPLL RC registers and DRAM MRS registers are written to by the BIOS to control the CPIO DIMM. Some of these values need to be "massaged" by the controller before they're written because the values provided by the host may not be compatible with the CPIO DIMM design (especially in a no-BIOS change scenario).

Next, the BIOS performs training and calibration of the DDR data-path between the host and CPIO DIMM at step 705. During this step, the controller's behavior largely depends on the type of CPIO DIMM (e.g., single/dual/quad-rank). For a CPIO DIMM that includes one or more DRAM ranks, the controller aliases the DRAM ranks so that they are accessed even when the host tries to access NVM ranks. For a CPIO DIMM with no DRAM ranks, the controller aliases its internal buffer to respond to memory accesses. As long as the BIOS does not activate and write more than the number of (e.g., two) distinct RAS addresses before doing readbacks, there should be no issues. The number of distinct RAS addresses supported is an implementation detail and may grow or shrink as required.

Next, the BIOS performs a memory test and memory initialization at step 706. Generally, during a memory test, the BIOS verifies that all DRAM ranks are fully functional. A single-rank CPIO DIMM (e.g., without DRAM) may fail this test (i.e., a function of the actual memory test procedure). In the event that the memory test would fail, it should be disabled for a single-rank CPIO DIMM. For dual-rank CPIO DIMMs, the controller aliases the DRAM rank for access to either rank. A dual-rank CPIO DIMM may be advertised as a single rank DIMM allowing the controller to alias the DRAM for the NVM rank. This allows write and read accesses to an NVM rank to be directed to a DRAM rank. As long as the memory test verifies a single rank at a time, there should be no issues, and the memory test should pass. After the memory test, the memory is initialized so that all locations have valid error correction code (ECC).

Next, having finished with the BIOS instructions, further initialization is handed over to the discovery boot loader at step 707. Generally, the discovery boot loader is responsible for determining the number of CPIO DIMMs connected to the system and their memory sizes and identifying the address map of the controller ASIC. It is also responsible for configuring the controller ASIC to support data scrambling, ECC generation, data interleaving/de-interleaving, bit swizzling and address linearization. It should be appreciated that the hardware for supporting data scrambling, ECC generation, data interleaving/de-interleaving, bit swizzling and address linearization is flexible and programmable. The ability to program these functions, for instance, allows a single CPIO DIMM design to work in a variety of different CPU systems/configurations. Methods for adapting to different configurations include but are not limited to:

Non-volatile storage of necessary parameters on-DIMM;

BIOS, boot loader or device driver initialization using a side-band communications method (e.g., host to DIMM SMBUS); and Learning method whereby the BIOS, boot loader or device driver sends a sequence of memory operations to train the logic and configure the programmable logic.

After all the configuring is done, the discovery boot loader updates the BIOS memory map tables. The ability to learn or program these operational modes allows a given CPIO DIMM to be redeployed from one system to another and avoids building CPIO DIMM's specific to a given server design.

Finally, after the discovery step, the OS is booted by the traditional boot loader at step 708. As the OS is booting up, the CPIO DIMM driver is also initialized. At this stage, the CPIO DIMMs connected to the system are in a normal memory operation mode and are ready to be accessed by the CPIO DIMM driver.

CPIO DIMM Discovery

As mentioned earlier, the discovery boot loader is responsible for determining the number of CPIO DIMMs connected to the system and their memory sizes and identifying the address map of the controller ASIC. It is also responsible for address learning and ECC and data interleave/swizzle learning. To perform these functions, the controller operates in a number of special modes. These special modes may be selected via maze unlock sequences.

Maze unlock sequences allow the operating mode of the controller to be changed under driver control but are likely not to occur by random access patterns that would occur due to application execution or BIOS operation. According to one embodiment, the maze pattern is based on a series of accesses to a particular set of addresses, a series of accesses with a particular varying data pattern, or both. In a system where the main memory bus is subject to an address reordering or the memory address is permuted from the software address, a maze pattern that is based on a simple address pattern does not work. In a system where the data bus is swizzled, or the data is scrambled, a maze pattern that is based on a simple data pattern does not work. When the memory controller re-orders operations, a maze pattern that is based on either address pattern or data pattern does not work.

According to one embodiment, the present system and method repeatedly writes multiple data patterns to the same address. By writing each individual pattern multiple times (e.g., 32), the issue of re-order by the memory controller is alleviated. The CPIO validates that the same data has been written the total of N times (e.g. N=8). The validated data is stored in an array as array element D[0]. The next data pattern is written to the same address the same number of times, and the validated data is stored as array element D[1]. This process repeats until N validated data array elements D[0] . . . D[N−1] are obtained. Using the validated data array, a difference vector array X[i] is computed by XOR'ing the two consecutive validated data D[j] and D[j+1] by:

$X[i]=D[i] \text{XOR } D[i+1]$, where $i=0 \ldots N-2$.

X[i] contains as many 1 bits as there are differences between D[i] and D[i+1] regardless of any bit swizzle or scramble value. It is assumed that the scrambler is time-invariant for a given address. An array of count values C[i] for i=0 . . . N−2 is obtained to store the number of 1's in X[i]. The validation of the maze transition is based on the list of values in C[i]. For N=6, the maze is unlocked if the list of count values C[i] is 0 1 2 3 4. If there are multiple maze states, the hardware contains multiple maze patterns to match against. Alternatively, to save space, the first N−1 values are common to all maze transitions, and the final value differentiates the final maze transition.

These sequences are identified by comparing bursts of data writes to the same address. Particularly, a comparison is made between the number of data bits that change from one write burst to the next write burst. Basically, the hardware XORs the data bits from successive writes and counts the number of "1"s in the resulting value. The following illustrates how the change in the number of bits between successive writes is not affected by scrambling.

H(i) !=H(i+1); but are both written to the same address
D(i)=H(i)^Scrambler
D(i+1)=H(i+1)^Scrambler
DV(i)=CountOf1s (D(i)^D(i+1))
DV(i)=CountOf1s(H(i)^Scrambler^H(i+1)^Scrambler)
DV(i)=CountOf1s (H(i)^H(i+1)) because the two scrambler values are the same.

H(i) represents the data written at sequence position i. D(i) represents the scrambled value of H(i). DV(i) represents number of bits that have changed between the write at i+1 and the write at i by XOR'ing D(i) and D(i+1). As an example, a maze unlock sequence may be DV(0) . . . DV(6)=={128,256,2,4,8,16,32} and DV(7) then indicates which maze is being unlocked.

Once a maze is unlocked, the controller operates in a mode associated with the entered unlock sequence. Various mazes according to one embodiment are described in the following Table 1.

TABLE 1

| Maze Name | Actions |
| --- | --- |
| Single Rank Alias for Discovery | In this mode the flash rank inverts the data read from its buffer. Prior to performing a read, the host should send a series of alternating data patterns (bit inverses) so that the ECC inversion behaviour can be learned. The host can find the rank based on writing a pattern to one location and then reading back the inverse pattern when the same location is read. |
| Single Rank Alias for BIOS | On a single rank DIMM this allows the CPIO DIMM to pass BIOS/MRC training by writing to the write entry points (new Activate commands switch buffers and cache the BA/RAS address) and reading back from either the buffer that has a cache hit or any buffer in the case of a cache miss. |
| Base Hunt | Hunting for Address 0/0/0 mode is enabled. |
| Address Hunt | Hunting for next address mode is enabled. |
| Address Learning | Address Learning Mode is enabled. |
| ECC/ Interleave/ Swizzle Learning | ECC/Interleave/Swizzle Learning Mode is enabled. |
| Full Unlock | controller is fully unlocked, all access types are allowed and the maze is disabled. |

Figure 8:
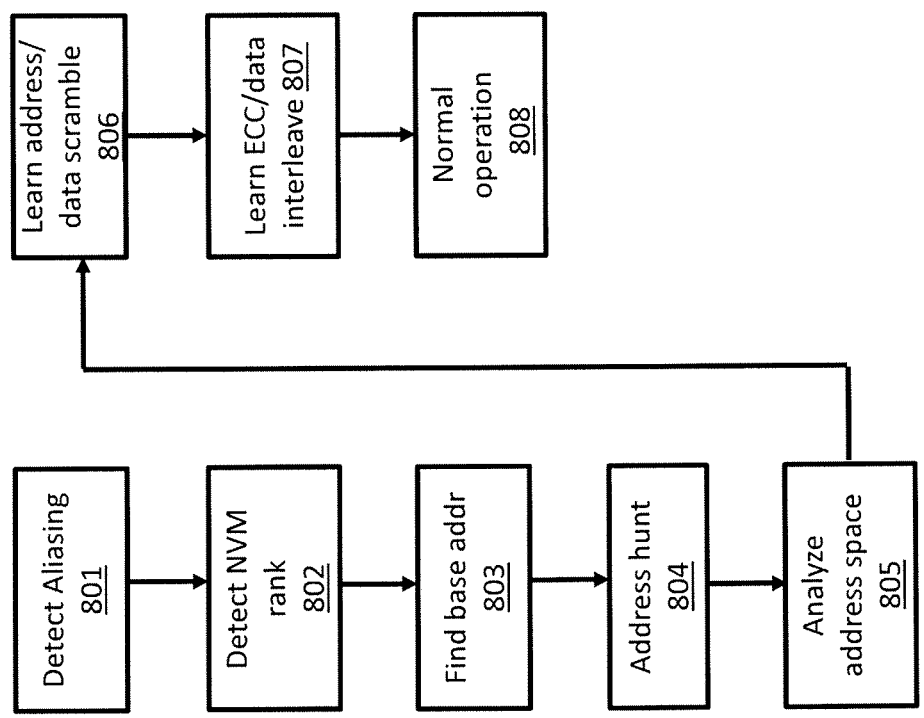
FIG. 8 illustrates an exemplary flow chart of the discovery boot process, according to one embodiment.

FIG. 8 illustrates an exemplary flow chart of the discovery boot process, according to one embodiment. At step 801, the discovery boot loader (herein "DBL") determines whether a memory module is a standard DRAM module or a CPIO DIMM module by looking for aliasing behavior. For instance, a dual-rank CPIO DIMM may be detected by writing one set of data to rank 0 and then another set of data to the same offset in rank 1 (possibly multiple times for each rank). The memory module exhibits aliasing behavior and is a CPIO DIMM if the data read back from rank 0 corresponds to data that was written to rank 1.

At step 802, the DBL determines which of the ranks in the CPIO DIMM is an NVM rank. For a dual-rank CPIO DIMM, even though a dual-rank CPIO DIMM is detected at step 801, it is still unknown as to which rank is the NVM rank. To make this determination, the DBL first places the CPIO DIMM into the "single rank alias for discovery" (herein "SAD") mode (see Table 1). Operating in the SAD mode, the CPIO DIMM inverts the data pattern when writing to the NVM rank. Thus, the DBL can find the NVM rank by writing a pattern to each rank and then reading the data back to see which set of data is inverted. The set of data that is inverted corresponds to the NVM rank. Also, operating in the SAD mode, the DBL may detect a single-rank CPIO DIMM.

Before the SAD mode can function properly, however, the controller may need to learn the ECC inversion rules of the host system. This is because, generally, when the host system writes data to a memory module, it also writes a set of ECC bits. Each bit in the ECC is an XOR of a subset of bits from the data. At this point, the ECC rules for generating these bits are unknown to the controller. If the controller returns an inverted data pattern without a correct set of ECC bits when read by the host, a read error may occur.

As mentioned earlier, each bit in the ECC is an XOR of a subset of bits from the data. The number of members in the subset is either even or odd. If it is even, then the ECC bit doesn't change if all the data bits are inverted. If the number is odd, then the ECC bit is inverted. Thus, a method by which the controller can modify the data and generate correct ECC bits is to have the DBL send a data pattern X and its inverse ~X to the same address. This should be repeated several times (e.g., four times). The controller monitors the last two values written to its memory and if the values are bitwise inverses, the controller determines which ECC bits are inverted. Once the controller has identified these occurrences several times (e.g., four times), the controller will have learned the ECC inversion rules and is ready to start operating in the SAD mode described above. For instance, when the host writes data pattern X, the controller actually writes the inverse pattern ~X to its memory and inverts the appropriate bits in the ECC byte lane.

After the DBL has identified the NVM rank, the DBL proceeds to step 803 to find the CPIO DIMM's base address. The DBL places the CPIO DIMM in the "base hunt" (herein "BH") mode (see Table 1). The BH mode operates to help the DBL find the CPIO DIMM's base address (e.g., BA/RAS/CAS=0/0/0). In the BH mode, the discovery aliasing behavior for the NVM rank is such that inverted data is written if the write address BA/RAS/CAS matches 0/0/0. Otherwise, the data is not inverted. This allows the DBL to scan through the entire address space that is mapped to a CPIO DIMM and find the host address that generates the base address of the CPIO DIMM.

After identifying the CPIO DIMM's base address, the DBL proceeds to step 804 to find the address space of the CPIO DIMM. The DBL places the CPIO DIMM in the "address hunt" (herein "AH") mode (see Table 1). The AH mode operates as an extension of the BH mode to help the DBL find the address space of the CPIO DIMM and behaves in a manner similar to base address learning. For instance, after the DBL has found the host address that corresponds to the CPIO DIMM's base address (e.g., BA/RAS/CAS=0/0/0), the controller writes inverted data if the CPIO DIMM's address does not match 0/0/0x8. Otherwise, the data is not inverted. If the AH mode is entered again (e.g., retriggering the maze unlock sequence for the AH mode), the controller will hunt for CPIO DIMM address 0/0/0x10. Each retriggering of the AH mode shifts the address up linearly (e.g., 0101 0x100, 0/0/0x200, and so on) through the CAS (column address strobe), the RAS (row address strobe), and then the BA (bank address).

Next, the DBL proceeds to step 805 to analyze and determine if the DBL is able to operate with the address space of the CPIO DIMM. For instance, the DBL should determine whether there is address interleaving and whether there are holes in the address space. According to one embodiment, even if address interleaving is detected, interleaving more than a cache line boundary may be made to work at lower performance. If there are holes, the DBL should determine whether the holes are reasonable. According to one embodiment, whether the holes are reasonable depends on the total number of holes and not the size of any given hole. Reasonableness may be more about the maximum size of the BIOS to OS memory map table.

Next, the DBL proceeds to step 806 for address and data scramble learning and places the CPIO DIMM into the "address learning" (herein "AL") mode (see Table 1). It should be appreciated that if address and data scrambling information are known, learning may not be needed (e.g., bypassing step 806) and such information may be programmed directly into the controller ASIC configuration registers. For instance, such information may be read from a non-volatile storage unit (e.g., on-DIMM serial ROM) or loaded into programmable registers by the BIOS, DBL, or device driver via side-band communications methods (e.g., host to DIMM SMBus).

Operating in the AL mode, the controller hardware determines information it needs to know in order to:
Scramble/descramble data to/from the host;
Determine the host physical to the DIMM physical address mapping and set up the optimal internal mapping; and
Provide the host with a mechanism to learn the mapping.

Data scrambling/descrambling may be necessary because certain CPU manufacturers (e.g., Intel©) scramble the data that is written to a DRAM based on the address for writing the data. Scrambling data does not present a problem to traditional DRAMs that do not need to understand the data that is being written for storage. A CPIO DIMM, on the other hand, may need to understand the commands that are being sent by the CPIO DIMM driver running on the host. Thus, data that is written to a CPIO DIMM should to be descrambled, and data that is sent back to the host should be scrambled (host expects scrambled data back).

To determine the host physical to DIMM physical address mapping and to set up the optimal internal mapping, the controller includes address mapping hardware. Obtaining the proper mapping allows the CPIO DIMM driver to address the set of buffers that are implemented in the controller. Optimizing the mapping provides for efficient operations. According to one embodiment, a mapping is considered to be optimized if the data buffers are mapped as contiguous 4 KB chunks and if certain buffers appear in the address map multiple times. Having certain buffers appear multiple times helps to reduce or avoid cache hits (or using cache invalidate instructions) when reading the content of a buffer that is being re-used for a new command. The address learning algorithm and address mapping hardware disclosed herein provides an optimal mapping solution.

After completing address and scramble learning, the DBL proceeds to step 807 for ECC and data interleave/swizzle learning. It should be appreciated that if ECC and data interleave/swizzle information are known, learning may not be needed (e.g., bypassing step 807) and such information may be programmed directly into the controller ASIC configuration registers. For instance, such information may be read from a non-volatile storage unit (e.g., on-DIMM serial ROM) or loaded into programmable registers by the BIOS, DBL, or device driver via side-band communications methods (e.g., host to DIMM SMBus).

ECC and data interleave/swizzle learning may be necessary because a CPIO DIMM receives from the host semantic information, such as commands, that is expected in particular byte/bit fields. In contrast, a traditional DIMM generally does not require any knowledge of the data swizzle mechanism because both the data and ECC bits are stored into the memory together and are written and read in the same order.

ECC algorithms/codes that are used by the host may include 64/72 SEC/DED codes, 128/144 SSC/DSD codes, or 256/288 SSC/DSD codes. It is understood that the ECC algorithm can be extended to larger code words without limiting the scope of the present subject matter. Because the flash devices in a CPIO DIMM typically use BCH codes rather than SEC/DED or SSC/DSD ECC codes, the controller should be able to generate and check ECC bits for data sent to and received from the host. According to one embodiment, the ECC bits are generated and checked in the controller core rather than at the interface to the host. According to one embodiment, a controller may support a CPIO DIMM that does not implement ECC. In this embodiment, the input pins to the check byte lane may be grounded and the drivers may be turned off. In another embodiment, the ECC data is written to the flash devices if the overhead is acceptable. Additionally, the ECC bits may not be checked when data is transferred to the controller.

To facilitate ECC and data interleave/swizzle learning, the DBL places the CPIO DIMM into the "ECC/Interleave/Swizzle Learning" (herein "EIS") mode (see Table 1). Operating in the EIS mode, the DBL initializes and trains the ECC generation circuitry and the de-interleave/de-swizzle circuitry using a learning pattern. After ECC and data interleave/swizzle learning is complete, the CPIO DIMM is ready for access by the host for normal operation at step 808. At this point, the discovery boot process finishes, and the traditional boot loader takes control for booting the OS on the host.

Data Scrambling

As mentioned earlier regarding step 806 of FIG. 8, data scrambling/descrambling may be necessary because certain CPU manufacturers (e.g., Intel© scramble the data that is written to a DRAM based on the address for writing the data. Intel© processors, for instance, scramble their data by XOR'ing the data with a scrambler sequence. The scrambler sequence is based on a linear superposition (e.g., bitwise XOR) of a set of independent vectors where each address bit corresponds to a vector. Some of the vectors are significant (non-zero) and some are not. Using 4-bit data values and 2-bit address values, the exemplary expressions below illustrate how Intel processors scramble the binary data value 1100b when writing to address 10b, wherein the "^" operator represents a bitwise XOR operation and v0 and v1 are 4-bit vectors that correspond to address bits 0 and 1, respectively. If the value of address bit i is zero, the vector vi is a zero vector. Otherwise, vector vi is non-zero. Vector vc is a constant vector that may be zero or non-zero and corresponds to a scramble vector when all address bits are zero.

scrambled_sequence=(vc^v0^v1)

scrambled_value=1100b^(vc^v0^v1)

Because the value of address bit 0 for address 10b is zero, v0 is a zero vector and the expression reduces to scrambled_value=1100b^(v1^vc)

Thus, to descramble the "scrambled_value," the values of vectors vi and vc must be known. In the interest of brevity, these vectors vi that are used in the scrambling sequence are referred to as "generator vectors."

Figure 9:
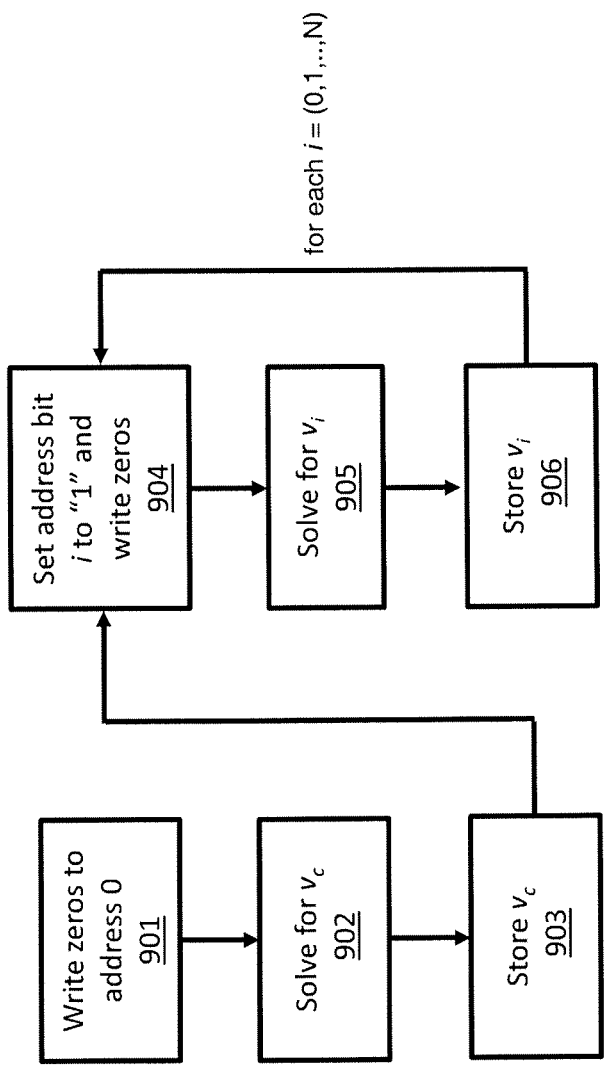
FIG. 9 illustrates an example flowchart of a method for solving for each of the generator vectors, according to one embodiment.

FIG. 9 illustrates an example flowchart of a method for solving for each of the generator vectors, according to one embodiment. First, the host writes a zero data pattern to the address 0b at step 901. This allows the controller to determine the generator value vc at step 902. To illustrate, recall from above that the scrambled value that is seen by the controller when the host writes a data value D is:

scrambled_value=D^scramble_sequence, where scramble_sequence=(vc^v0^v1^ . . . ^vn), and n=number of address bits.

Thus, when the host writes D=0 to address 0b, the scrambled value reduces to:

scrambled_value=0b^(0^0^0^ . . . ^vc)

scrambled_value=vc

The controller stores vc in a vector register at step 903.

To help the controller solve for the remaining generator vectors (e.g., v0, v1, . . . , vN, where N corresponds to the address bit position), the host sets one address bit to "1" while all the other address bits are set to "0" and writes a zero data pattern to that address. For instance, to solve for generator vi, the host sets only the address bit at position i to "1" and writes to that address at step 904. The controller solves for the vi at step 905 as follows. The scrambled value seen by the controller is:

scrambled_value=0b^(0^v1^0^ . . . ^vc)

scrambled_value=vi^vc

Using the stored vc value found at 901, vi can be solved for by XOR'ing the scrambled value with vc:

scrambled_value^vc=vi^vc^vc scrambled_value^vc=vi

The controller stores vi in a corresponding vector register at step 906. Steps 904 through 906 are repeated in that order until all the generator vectors values have been solved. Having solved for all the generator vector values, the controller can descramble data received from or scramble data sent to the host.

Figure 10:
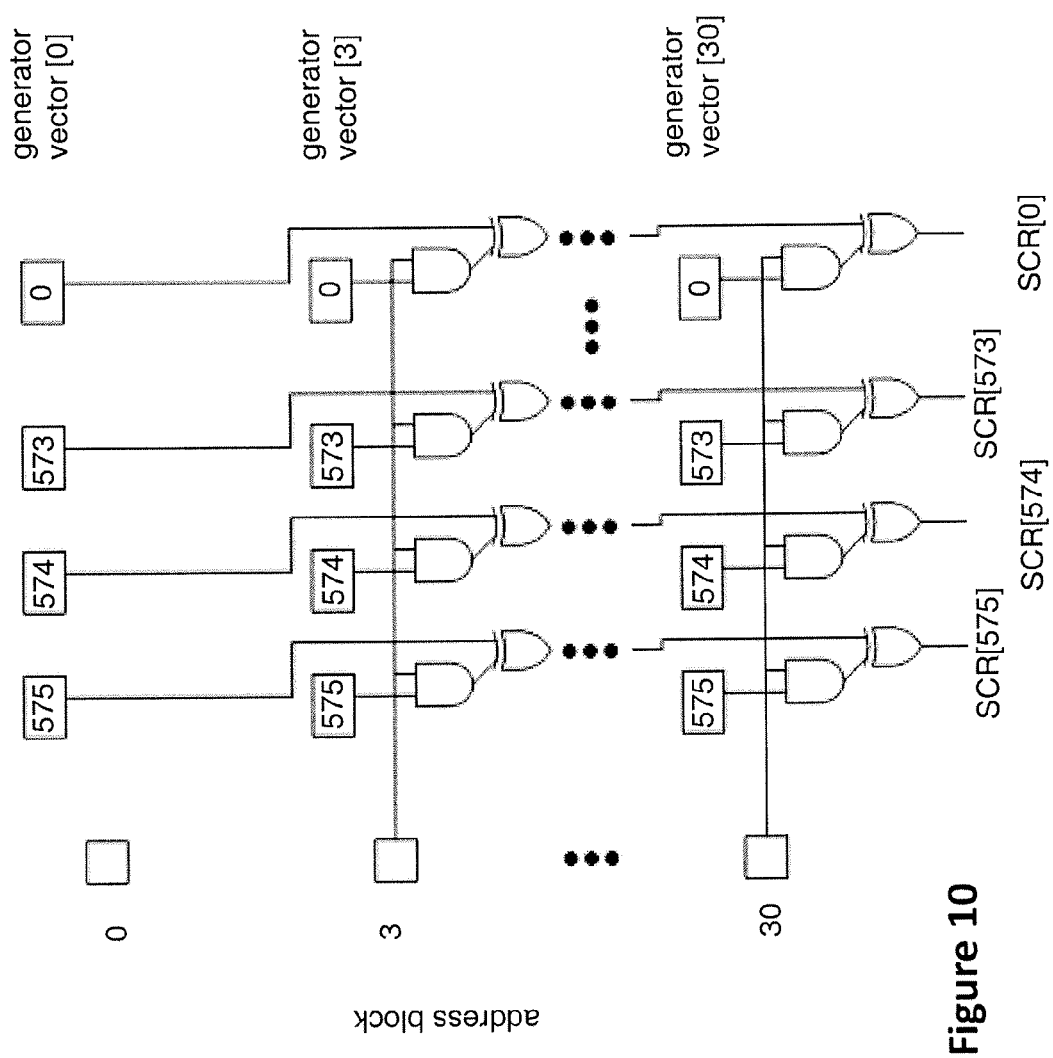
FIG. 10 illustrates a logical implementation of circuitry for generating a scrambler sequence for scrambling data sent to or descrambling data received from the host, according to one embodiment.

FIG. 10 illustrates a logical implementation of circuitry for generating a scrambler sequence for scrambling sent to or descrambling data received from the host, according to one embodiment. As shown, each of the generator vectors are characterized by 576 bits (72-bit wide×8 beat bursts long). The scramble vectors used by the host may vary in width (e.g., it may repeat within the 72-bits) and depth (e.g., it may repeat in the 8 beat burst). The use of smaller vector registers is possible, but it may limit the applicability of the circuit to certain CPUs. Given the ability of the motherboard to be swizzled (where bits within a nibble are re-ordered, or nibbles are reordered), it may be preferable to use a bit width of 72-bits or more. However, if a motherboard is known not to perform bit swizzling, the generator vector hardware may only need to be as wide as the host's scramble vector (e.g., 16 or 32 bits). In one embodiment, that is sixteen bits, reflecting a savings of almost 5× in memory cost.

As the address input signals shown in FIG. 10 are DIMM relative, the address input signal starts at address bit position "3." Depending on whether the address input signals used are DIMM relative or host relative, the address input signal to the circuitry may start at other address bit positions.

Address Learning/Mapping

A host generally maps the monotonically increasing address in a non-linear and/or non-orthogonal manner. An orthogonal mapping generally refers to a mapping wherein a single bit change in the host address causes a single bit change in the physical DIMM address. A linear mapping generally refers to a mapping wherein the physical DIMM address increases monotonically within any of the address fields (e.g., BA, RAS, CAS) as the host address increases monotonically. A perfectly linear mapping generally refers to a mapping wherein the physical DIMM address increases through an entire field (e.g., BA, RAS, CAS) before switching to another field.

For instance, some microprocessors employ a non-orthogonal (although some documentations show that an inverse mapping back to an orthogonal mapping may be possible) but linear address mapping. Other microprocessors may employ an orthogonal but non-linear mapping. In either case, these address mappings are generally not optimized for use with a CPIO DIMM.

Obtaining a proper mapping allows the CPIO DIMM driver to address the set of buffers that are implemented in the controller. Optimizing the mapping provides for efficient operations. A mapping is considered to be optimized if the data buffers are mapped as contiguous 4 KB chunks and if certain buffers appear in the address map multiple times. In one embodiment, CPIO DIMM is presented as a x4 DIMM. In this case, the CAS address space on the DIMM is 16 KB, therefore it is preferable to place each controller buffer in its own unique 16 KB page in the host memory map. However, it is understood that any size of controller buffer (e.g., 4 KB or greater) may be used to minimize activation cycles for the memory without deviating from the scope of the present subject matter. An individual buffer may start at offset 0 of the page and may be 64B, 128B, 512B or 4 KB in size. The remainder of the page may be read back as zero buffers and ignored when written to by the host. Or, consistent with one embodiment, the remainder of the page may be aliased back to the buffer, allowing the data to be read multiple times within the 16 KB page.

The following Table 2 illustrates an example of how the host addresses of an available microprocessor-based system can be mapped into the controller physical address. As the addressing below shows, the bottom six bits of the host address are not significant, assuming the bottom three bits are used to indicate the byte offset within a 64-bit word, and the next three bits are used to indicate the starting offset for a 64B (8 beat) burst.

TABLE 2

| Host Address Offset | Controller Internal Address Map | DIMM Physical Address | Comment |
|---|---|---|---|
| 0x0 | | | |
| 0x40 | COL[0] | CAS[3] | |
| 0x80 | COL[1] | CAS[4] | |
| 0x100 | COL[2] | CAS[5] | |
| 0x200 | COL[3] | CAS[6] | |
| 0x400 | COL[4] | CAS[7] | |
| 0x800 | COL[5] | CAS[8] | |
| 0x1000 | COL[6] | BA[0] | |
| 0x2000 | COL[7] | CAS[9] | |
| 0x4000 | ROW[0] | RAS[0] | |
| 0x8000 | ROW[1] | RAS[1] | |
| 0x10000 | ROW[2] | RAS[2] | |
| 0x20000 | ROW[3] | RAS[3] | |
| 0x40000 | ROW[4] | BA[1] | |
| 0x80000 | ROW[5] | BA[2] | |
| 0x100000 | ROW[6] | RAS[5] | |
| 0x200000 | ROW[7] | RAS[6] | |
| 0x400000 | ROW[8] | RAS[7] | |
| 0x800000 | ROW[9] | RAS[8] | |
| 0x1000000 | ROW[10] | RAS[9] | |
| 0x2000000 | ROW[11] | RAS[10] | |
| 0x4000000 | ROW[12] | RAS[11] | |
| 0x8000000 | ROW[13] | RAS[4] | |
| 0x10000000 | ROW[14] | RAS[12] | |
| 0x20000000 | ROW[15] | RAS[13] | |
| 0x40000000 | ROW[16] | RAS[14] | |
| 0x80000000 | ROW[17] | RAS[15] | |
| 0x100000000 | ROW[18] | CAS[11] | May be used or ignored |

Figure 11:
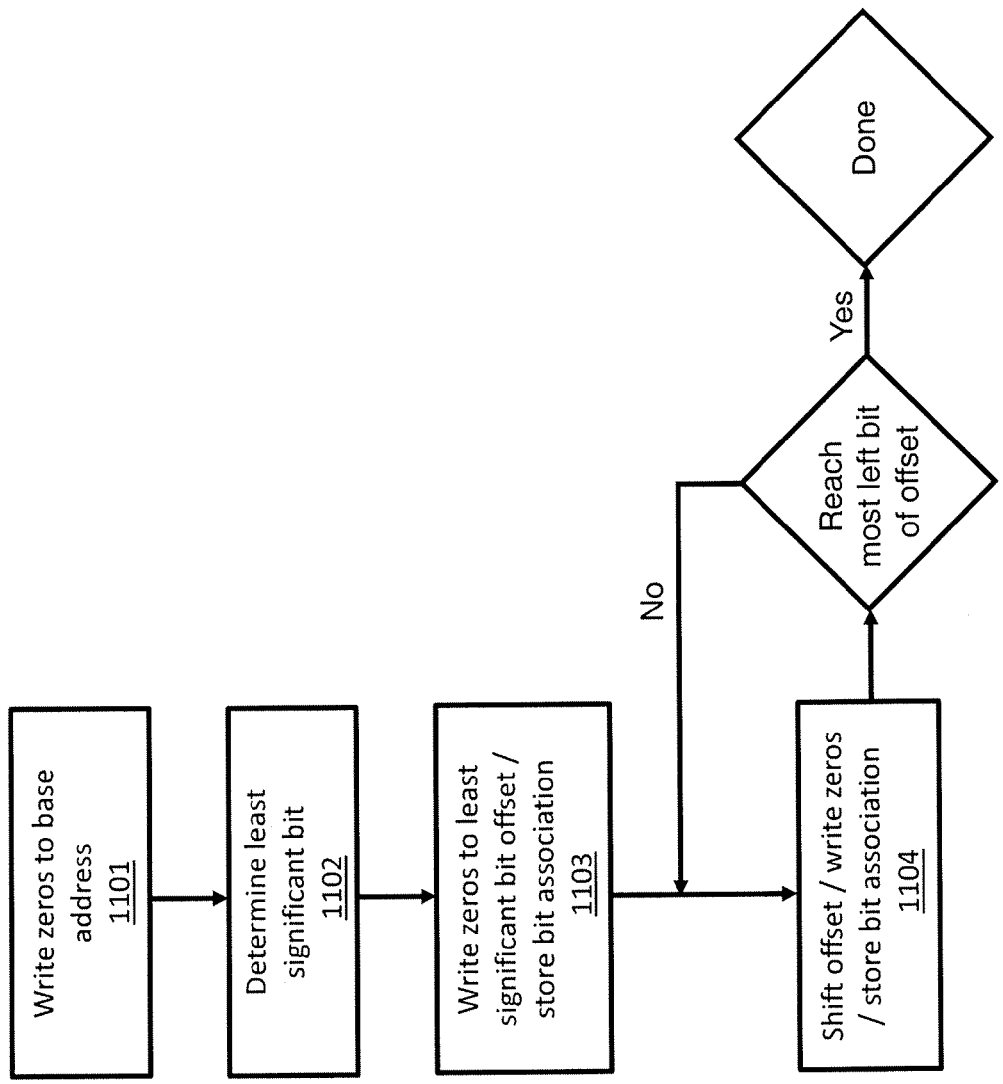
FIG. 11 illustrates an example flowchart of a method for generating an optimized address mapping, according to one embodiment.

An address mapping, such as the one shown in Table 2, may be created by having the host assert an address learning pattern that provides a series of addresses that are both monotonically increasing and orthogonal. Asserting such learning pattern allows the controller ASIC to remap the externally visible address signals (e.g., BA, RAS, CAS) from a non-linear and non-orthogonal address space into a linear and orthogonal address space. FIG. 11 illustrates an example flowchart of a method for generating an optimized address mapping, according to one embodiment. The host generates a series of writes to the CPIO DIMM's host base address (e.g., address offset=0) using the write instruction that bypasses the cache at step 1101. The data written is a pattern of all zeros. Next, the host determines the least significant bit of the host address based on a set of assumptions at step 1102. According to one embodiment illustrated in Table 2, the assumptions may include the following:

Given that DIMMs are 64-bits wide, each CAS address corresponds to eight bytes. Thus, it is likely that the bottom three host relative address bits are unused in the memory system.

As the DRAM supports bursts of 8 words, the next 3 address bits are relevant for determining the starting position of the burst and are the least significant 3 bits of the CAS address.

Next, the host sets the least significant bit of the host address to "1" and generates a series of writes to that host address (e.g., CPIO DIMM base address+0x40 offset address) at step 1103. During the series of writes, the controller ASIC's address mapping hardware detects the physical DIMM address bit that is set to "1" and associates that DIMM address bit with a corresponding address bit internal to the controller (e.g., CAS[3] is associated with COL[0] in Table 2). An address association may be created through the use of one or more muxes and stored in a corresponding mux register, as illustrated later in FIG. 12.

Next, the host shifts the host address offset to the left by one bit position (e.g., 0x40 to 0x80) and generates a series of writes to that host address (e.g., CPIO DIMM base address+0x80 offset address) at step 1104. Again, the controller's address mapping hardware detects the physical DIMM address bit that is set to "1" and associates that DIMM address bit with a corresponding address bit internal to the controller (e.g., CAS[4] is associated with COL[1] in Table 2). The association is stored in another corresponding mux register. Step 1104 is repeated until the entire host offset address space has been shifted through.

According to one embodiment, to ensure that some initial decoding can begin after the RAS cycle and not have to wait for the CAS cycle, the controller associates all the ROW[ ] address bits during RAS cycles. For instance, once a ROW[ ] address signal has been associated, if for any subsequent host address location the corresponding physical DIMM address bit is a CAS bit, that CAS bit is ignored and the Row[ ] address pointer does not advance (e.g., the CAS bit is skipped and the remaining address bits are right shifted). As Table 2 illustrates, COL[ ] address bits may be a mix of BA/RAS/CAS bits. This way, the CAS cycle bits are used to select part of a buffer, but the buffer was selected following the RAS cycle. According to one embodiment, CAS address bits may appear in the ROW space.

Figure 12A:
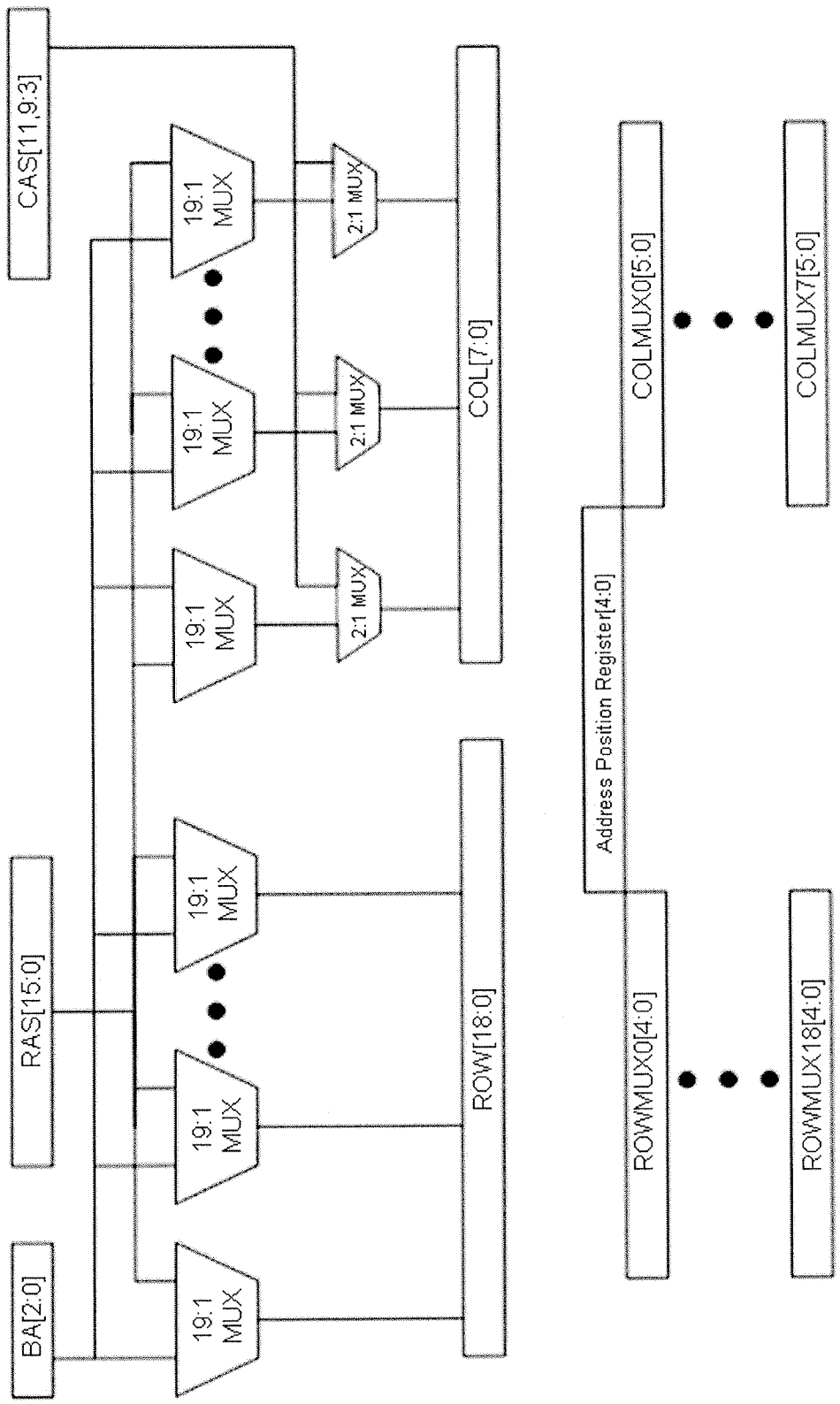
FIG. 12a illustrates a first logical implementation of circuitry for associating physical DIMM address bits with controller internal address bits, according to one embodiment.
Figure 12B:
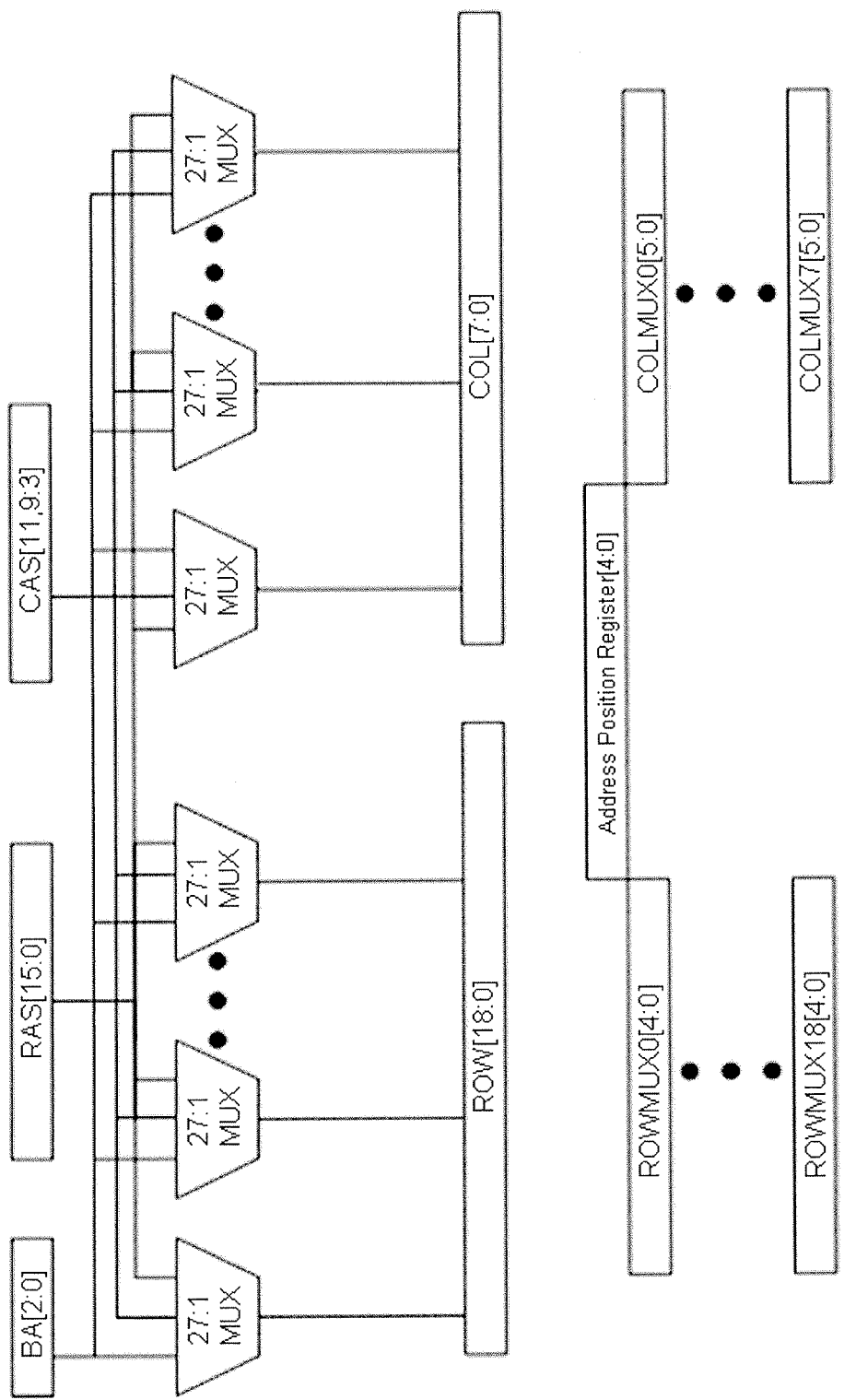
FIG. 12b illustrates a second logical implementation of circuitry for associating physical DIMM address bits with controller internal address bits, according to one embodiment.

FIG. 12a illustrates a logical implementation of circuitry for associating physical DIMM address bits with controller internal address bits, according to one embodiment. The circuitry includes a plurality of muxes for associating BA/RA/CAS address bits with controller's internal ROW[ ]/COL[ ] address bits. The circuitry also includes an address position register that is reset to "0" at the beginning of address learning. The exemplary operations of the illustrated circuitry are described as follows in accordance with the associations shown in Table 2. As the address position register increments through values 0 to 7, the mux registers COLMUX0 to COLMUX7 are initialized to select a corresponding BA, RAS, or CAS bit. As the address position register increments through values 8 to 26, the mux registers ROWMUX0 to ROWMUX8 are initialized to select a corresponding BA or RAS. At this point, if a host address corresponds to a physical CAS bit, the address position register is not incremented and the CAS bit is skipped. Having swept through the host address offset and the corresponding associations stored, the host can then read these registers to determine the final address mapping. FIG. 12b illustrates another embodiment of logical circuitry for associating physical DIMM address bits with controller internal address bits. The logical circuitry of FIG. 12b allows any BA/RAS/CAS DIMM address bit to be mapped to any controller internal address bit.

The goal of the controller address map and the address mapping hardware, such as those shown in FIGS. 12a and 12b, is to provide buffers that always begin at offset 0 of a 16 KB page (e.g., COL=0). Table 3 illustrates exemplary address decodings for accessing the different types of controller buffers, according to one embodiment. The selection of page size (e.g., 16 KB) could change in different CPIO applications and is based on the size of data transfer that is optimal for the device.

TABLE 3

| HA[N:17] ROW[J + 3:3] Significant Bits | HA[16:14] ROW[2:0] Encoding | HA[13:0] COL[7:0] Significant Bits | Controller Address Space |
| --- | --- | --- | --- |
| J = 4, 32 Buffers | 000 | COL[5:0] | Read Data Buffers, 4096B each |
| J = 2, 8 Buffers | 001 | COL[5:0] | Write Data Buffers Entry Point, |4096B each |
| J = 4, 32 Buffers | 010 | COL[0] | Read Meta-Data Buffers, 128B each |
| J = 2, 8 Buffers | 011 | COL[0] | Write Meta-Data Buffers Entry Point, 128B each |
| J = 0, 1 Buffer | 100 | COL[2:0] | Status Return Buffer, 512B each |
| J = 8, 512 Buffers | 101 | COL[0] | Command Buffers, 64B each |
| J = 0, 1 Buffer | 110 | COL[5:0] | Extended Status Buffer, 4096B each |
|  | 111 |  | Unused |

Regarding Table 3:
ROW[2:0] (nominally HA[16:14]) are used to define the type of buffer being accessed.
ROW[J+3:3] (nominally, HA[J+17:17]) are used to index the particular buffer. The value of J is dependent on the type of buffer being accessed.
ROW[18:J+4] (nominally HA[N:J+18]) will alias back to the particular buffer.
HA[N:0] represents the internal physical address space (as computed by the driver), where N is a function of the place in the memory map where the CPIO DIMM memory space ends, which may be a larger address (e.g., more bits) than just the length of the CPIO DIMM. HA[N:M] defines the base address of the controller rank and HA[M−1:0] defines an offset into the controller Memory Map.

An advantage of this scheme is that it allows the declared size of the DIMM/controller address space to be changed without any additional hardware in the device. Given the potentially bizarre mapping of the HA bits to BA/RAS/CAS bits, this provides the CPIO DIMM driver with a straightforward method of computing the base address for any given buffer.

The ability of the CPIO device to learn the address order not only simplifies the driver design, but also provides an optimal ordering for the driver to access the CPIO DIMM and take advantage of cache pre-fetch operations for other architectures where buffers are contiguous and linear. However, for an alternative architecture where this ordering is not optimal, a modification to the address learning may be done such that the order of learned bits is changed to the alternative optimal ordering.

ECC and Data Interleave/Swizzle Learning

As mentioned earlier, ECC and data interleave/swizzle learning may be necessary because a CPIO DIMM receives from the host semantic information, such as commands, that is expected in particular byte/bit fields. De-interleaving/de-swizzling brings the data into the controller in CPU canonical ordering so that commands and data may be interpreted correctly. According to one embodiment, the ECC and de-interleave/de-swizzle circuitry may be built around a 256-bit core that operates twice on each 8-beat burst (512 bits). The core may also provide correct operation for 128:16 and 64:8 bit codes. According to one embodiment, the de-interleave/de-swizzle circuitry may include 256 256-bit muxes that can move data around arbitrarily within any bit position in a 4-beat burst. The ECC generation circuitry may include 32 256-bit wide AND/XOR gates (recall, generally, any ECC check bit is an XOR function of a subset of the data bits in a word). The same algorithm may be extended to ECC codes of larger size, with the selection of 256 being based on currently available CPUs.

Figure 13:
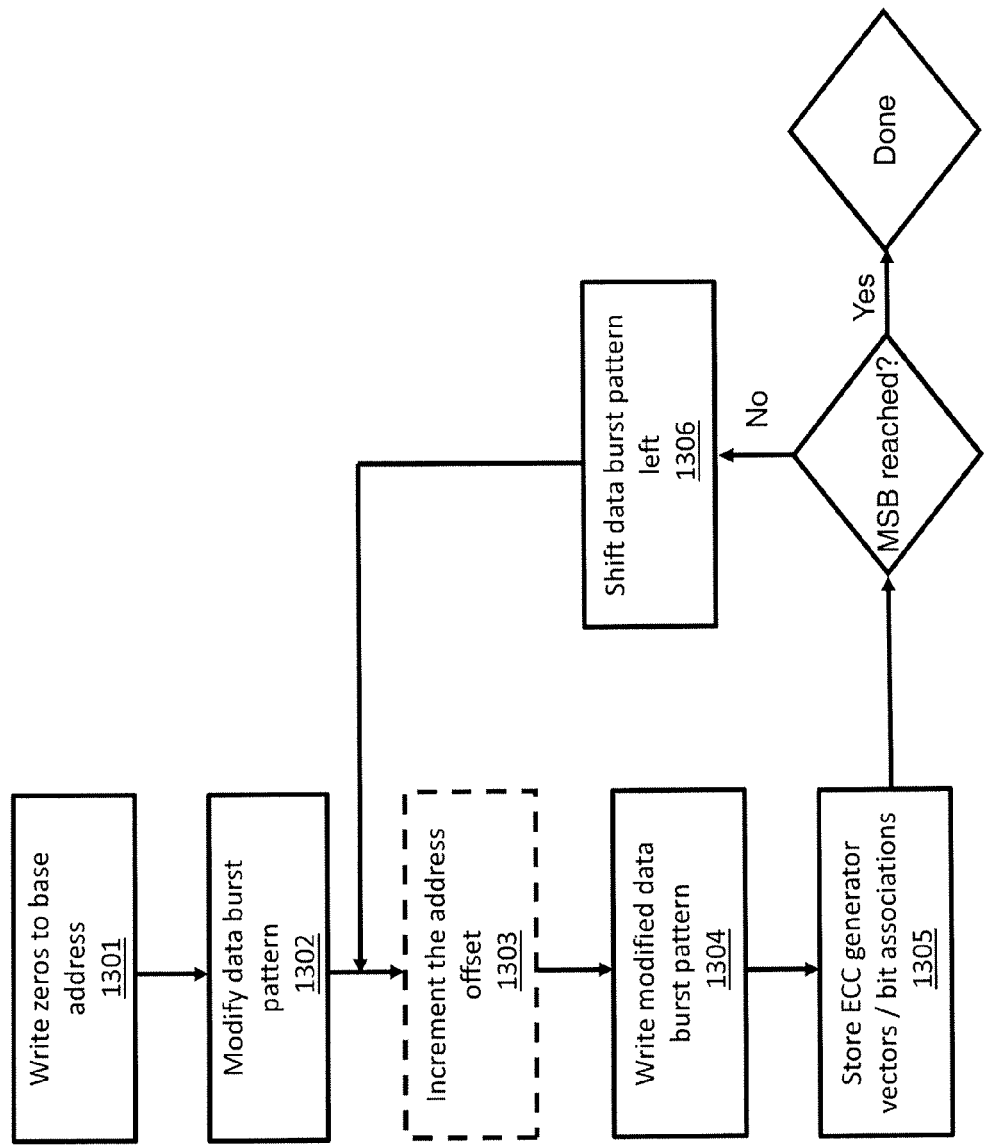
FIG. 13 illustrates an example flowchart of the steps for ECC and interleave/swizzle learning, according to one embodiment.

Both the ECC circuitry and the de-interleave/de-swizzle circuitry may be initialized using the same learning pattern. ECC and data interleave/swizzle learning involves running a data pattern that "walks" a "1" through the data field. FIG. 13 illustrates an example flowchart of the steps for ECC and interleave/swizzle learning, according to one embodiment. At step 1301, the host writes an all zeros data burst pattern to the CPIO DIMM's base address with 0x0 address offset. This allows the controller to determine if there is ECC inversion. Next, the host modifies the data burst pattern by setting the LSB (least significant bit) of the least significant 64-bit word to value "1" at step 1302. The host optionally increments the address offset by 0x40 at step 1303. A 0x40 offset corresponds to a 64B boundary. Although incrementing the offset is not necessary, incrementing the offset may be done to provide additional information for debugging. If incrementing the address offset is not desired, the host may skip to step 1304.

At step 1304, the host writes the modified burst pattern to the base address plus the incremented offset (if 1303 is not skipped). When the controller sees the data burst pattern and the ECC that is being written, the controller stores the ECC data as an ECC generator vector that corresponds to the set (e.g., "1") data bit at step 1305. The ECC generator is stored in a 32-bit register of the ECC circuitry. Also, the controller associates the expected data bit position (e.g., position seen by host) to the actual bit position seen by the controller, for instance, using a 256-bit mux. The bit position association may be stored in a corresponding mux control register. Next, the host determines whether the set bit is the MSB (most significant bit) of the most significant 64-bit word. If the set bit is not the MSB of the most significant 64-bit word, the host modifies the data burst pattern by shifting the pattern left by one bit (e.g., 001b to 010b) at step 1306. Steps 1303 to 1306 are repeated until the data burst pattern has shifted to its MSB of the most significant 64-bit word, at which point the ECC and interleave/swizzle learning is completed.

It should be appreciated that although FIG. 13 illustrates the steps in a particular order, variations in the ordering of the steps are contemplated and within the scope of this disclosure. Additionally, it should be appreciated that for a given processor/motherboard/DIMM the ECC generation, data interleaving and bit swizzling information may be known, and therefore, such information may be programmed into the controller ASIC after system reset. For instance, such information may be read from a non-volatile storage unit (e.g., on-DIMM serial ROM) or loaded into programmable registers by the BIOS, DBL, or device driver via side-band communications methods (e.g., host to DIMM SMBus). In such cases, ECC and data interleave/swizzle learning may not need to be performed. Additionally, it should be appreciated that any bit swizzling that might occur on the DIMM itself (in order to optimize the DIMM layout) will also be correctly handled.

Figure 14:
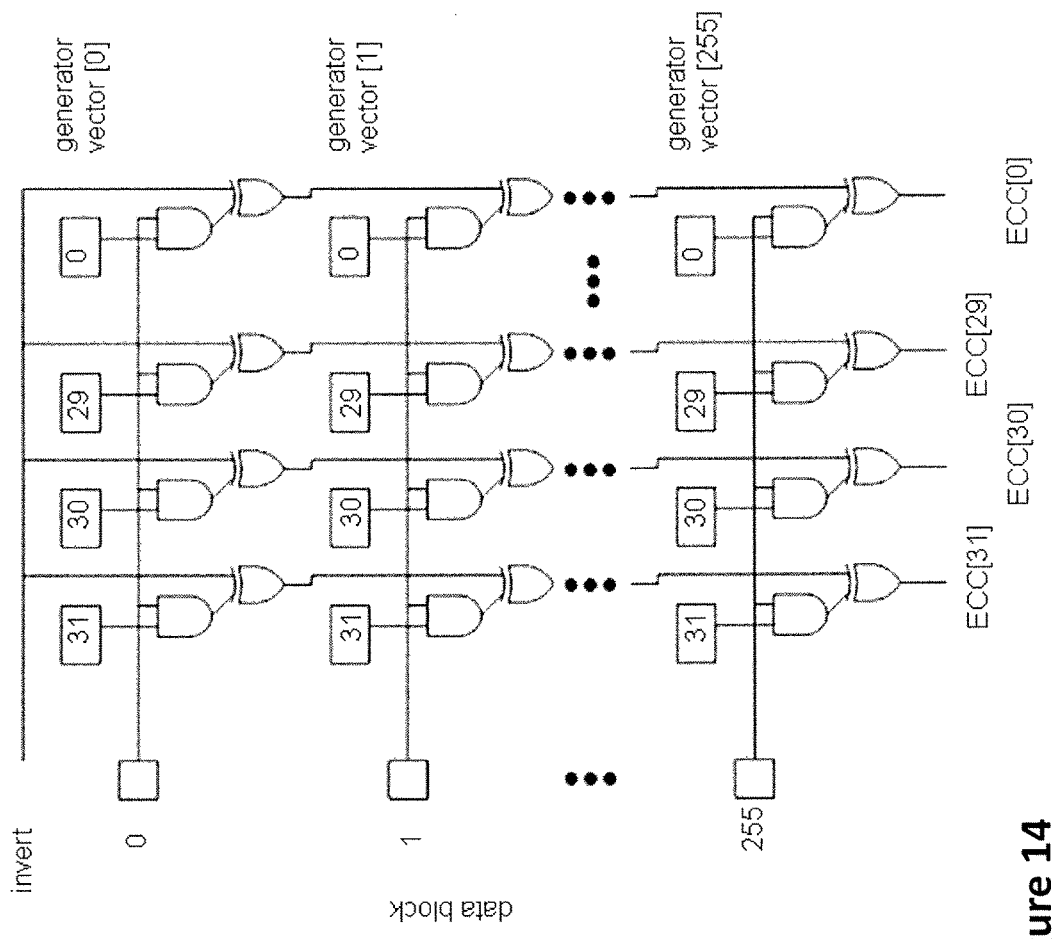
FIG. 14 illustrates a logical implementation of ECC circuitry for computing ECC bits, according to one embodiment.

FIG. 14 illustrates a logical implementation of ECC circuitry for computing ECC bits, according to one embodiment. The illustrated circuitry is designed for a 256-bit data block with 32-bits of ECC. The computed ECC is the linear superposition (e.g., XOR) of all generator vectors that correspond to data bits that are set to "1." As long as the layout of the data and ECC is the same, the ECC circuitry calculates the ECC regardless of the interleaving.

Controller Buffers

Host Read Buffers

It is recognized that there may be a challenge in meeting the required latency for DDR-3 memory systems. To support the highest speed possible, the controller provides a set of read buffers that are located "close" to the DDR-3 physical layer, according to one embodiment. The buffers may include 32 4 KB and 32 128B buffers that provide the host with a fast read path. The extra 128B allows the host to read the meta-data stored with the flash page for SSDs that support the host meta-data function. One way to keep the internal addressing of the controller buffers straightforward is to store the meta-data in separate memory instances from the main data. Once the host has read a given buffer, the CPIO DIMM driver releases the buffer. This signals to the controller that the buffer is available for use with new data. The controller then transfers data from a general read/write buffer to a host read buffer. The controller allocates the host read buffers and informs the driver of the final location in the status byte for each command. Host read buffers are located in fixed positions in the DIMM memory map. The number of general read/write buffers is generally on the order of the number of outstanding commands.

Write Buffer Entry Points

Write buffer entry points provide the host with a writeable/readable buffer that allows support of both scrubber and read/modify/write behaviour of the host memory controller. Scrubber operations are discussed later. According to one embodiment, there are eight entry points of 4 KB and eight entry points of 128B. The host writes to these buffers. Once the data and command related to the buffer have been written, the buffer is transferred to a general read/write buffer.

The CPIO DIMM driver generally interleaves data buffer writes with command buffer writes. Furthermore, the command buffer format includes fields that specify which buffer entry point a command is associated with as well as a checksum field associated with the data in a buffer. These two fields enable the hardware to determine which buffer entry point is associated with the command and the checksum allows the controller to determine whether the entire buffer has been written. In addition to the 4 KB of data, each buffer has associated with it a 64-bit vector indicating that each cache line has been written at least once. This vector is maintained via hardware within the controller. This allows the hardware to determine a reasonable starting point to predict whether the buffer is complete. Because readmodify-write behaviour on the part of the memory controller allows for an unknown sized portion of a given cache line to be written, the prediction may not be accurate under certain circumstances. Therefore, it may be necessary (but not sufficient) for all cache lines to have been written once. If the command processor verification of the checksum does not pass, then it is likely a portion of the buffer will be read and modified shortly. Therefore, the command processor can attempt to re-verify the checksum after a short wait.

General Write Buffers

The allocation of general buffers is handled by the CPIO DIMM driver. This allows the host to dynamically adjust to the ratio of read/write commands. Depending on the capabilities of the SSD, it may not be possible to release a write buffer until the command is complete. However, to support increased performance for SSDs that are able to signal when a buffer can be released, the controller can inform the driver if a write buffer has been transferred to the SSD.

Again, one way to keep the internal addressing of the controller buffers straightforward is to store the meta-data in separate memory instances from the main data. From the host's perspective, the meta-data buffer space is separate from the data buffer. Within the internal space the buffers appear contiguous, but the internal logic will generate a correct address because writing to the memory buffers does not have the same critical path. According to one embodiment, there are a total of 256 general read/write buffers of 4 KB and another 256 128B buffers for meta-data.

Command Buffers

Generally, there are multiple entry points for command buffers in the controller, one for each actual command buffer in the design. The host command buffers are placed in fixed locations in the memory map. According to one embodiment, there are 512 64B control buffers for the host. The 1st (or last) command buffer may be used for debugging and may not have an associated return status in the status buffers. Writing a command buffer causes it to be executed when the command status is complete. The host generally does not re-use a command buffer until it has been completed. The host allocates command buffers from within the pool. The host generally cannot read back command buffers. If read back, an all zeros buffer may be returned. This ensures that any (read-modify-write or scrubber) interaction with the memory does not cause false commands to be received.

Controller Scrubber Block

Traditionally, many microprocessors implement a lowlevel memory scrubbing module that ensures that all bytes in memory are read periodically. This allows single bit upsets to be detected and corrected before they become uncorrectable errors. A scrubbing module generally walks through the memory in a linear fashion (up or down) and reads each cache-line. The module takes an exception and re-writes the data if there is a bit error. Some scrubbers may re-read the updated data to verify correctness, while others may not. Some scrubbers upon detecting an error may do two or more reads to ensure that the bit error was not due to bus noise and to confirm that the error is legitimate.

Because the scrubber cannot be programmed to avoid particular portions of the memory, the controller includes a scrubber block that is responsible for responding to all addresses that are not readable. The operation of the scrubber block may utilize information regarding the mapping order and the sizes of the various fields. The data pattern sent back by the scrubber block is all zeros and corresponds to a NULL command.

According to one embodiment, the scrubber reading locations within the DIMM memory map that do not map to readable locations in the controller memory map may return the contents of a special buffer (e.g., zero buffer) that is initialized to all 0s with correct ECC. The scrubber block may pre-calculate and store the ECC for a small range of addresses in host linear order. This does not necessarily mean that the CPIO DIMM addresses (e.g. RAS, CAS, BA) are in order because of the flexibility in mapping host addresses within a particular rank. When the scrubber reads locations within the controller memory map that correspond to writeable command buffers, it returns the content of the zero buffer. When the scrubber reads locations within the controller memory map that correspond to writeable data buffers, it returns the updated content of the data buffer. When the scrubber reads locations within the controller memory map that correspond to readable data buffers, it returns the contents of the data buffer. If the scrubber has detected an ECC error and has written a "correction" back to the location, the scrubber reading the location again may return the "corrected" data.

For read operations, the scrubber buffer (zero-buffer) is used for any address that doesn't map to an actual memory location and for any reference to a command buffer. By returning a null command as a data pattern, any DDR-3 bus noise that errors a command results in a NULL command being written to a command register, which will be ignored. There are two other special buffer types with regard to the scrubber: write data buffers and write meta-data buffers. These buffers should be both readable and writable in order to ensure that real data is not overwritten by the scrubber.

Ideally, the scrubber will never detect an ECC error. However, there are two possible causes for ECC errors: actual bit errors in the internal SRAM of the controller and noise on the DDR-3 bus. For write buffer entry points, there is generally no issue with the scrubber writing back corrected data to the buffer as they are zeros. For host read buffers, on the other hand, it may not be known how quickly the scrubber re-reads the data after it writes back the corrected value (assuming it is a scrubber that does a read check after the update). Thus, it may not be clear whether the controller would in fact update the real memory with the corrected value. One way to ensure that the correct value is written, the controller may implement a small cache (e.g., 4 entry) that holds writes to non-writable memory locations. When such a write occurs, the command processor may receive an interrupt that includes the address of the correction so that it can scrub that location. When the buffer in question is de-allocated, the firmware may determine whether it needs to "manually" scrub the buffer or do nothing as the data for a read command is about to be transferred into the buffer anyway.

Read/Write Data Flow

Read Data Flow

Figure 15:
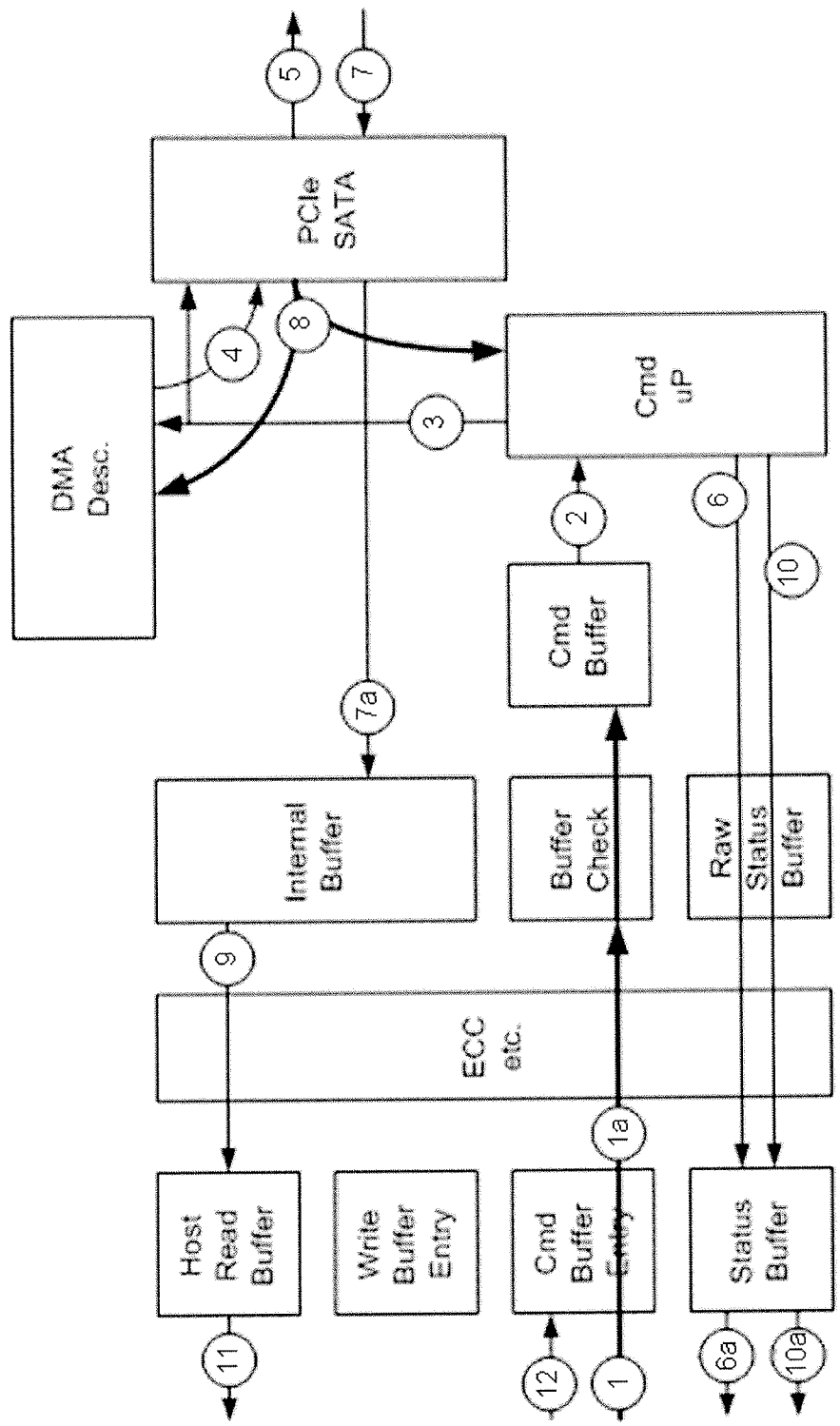
FIG. 15 illustrates a logical block diagram that shows the flow of commands and data for a read command, according to one embodiment.

FIG. 15 illustrates a logical block diagram that shows the flow of commands and data for a read command, according to one embodiment. The read process begins when the CPIO DIMM driver at the host writes a "read" command to a particular command buffer entry point at flow 1. The command then flows through the ECC/de-interleave/de-swizzle circuitry at flow 1a. Buffer check logic determines if and when the command is complete. If the command is complete, the command is transmitted to the command processor at flow 2.

Upon receiving the command, the command processor generates DMA descriptors and communicates the descriptors to the PCI-E/SATA block at flow 3. The PCI-E/SATA block reads the DMA descriptor at flow 4. The PCI-E/SATA block then sends a read request to the SSD at flow 5. During this time, the command processor updates the status buffer to indicate to the CPIO DIMM driver that the command is in progress at flow 6. The driver may or may not read the status at flow 6a.

At flow 7, the PCI-E/SATA block receives the requested read data from the SSD. The read data is written to the internal buffer at flow 7a. Status returned from the SSD is stored in the DMA descriptors at flow 8. Also, during this time, the command processor receives an interrupt from the PCI-E/SATA block. When a host read buffer becomes available, the read data in the internal buffer is copied to the host read buffer at flow 9. After the data has been copied, the command processor updates the status buffer with a final status at flow 10. This indicates to the driver that read data is ready to be read from the host read buffer. The CPIO DIMM driver reads the status buffer and observes the final status at flow 10a. The CPIO DIMM driver may then read the requested read data from the host read buffer at flow 11. Once the CPIO DIMM driver has finished reading the host read buffer, the CPIO DIMM driver may de-allocate the host read buffer by writing a de-allocation command to the command buffer entry point at flow 12 and complete the data read sequence.

Write Data Flow

Figure 16:
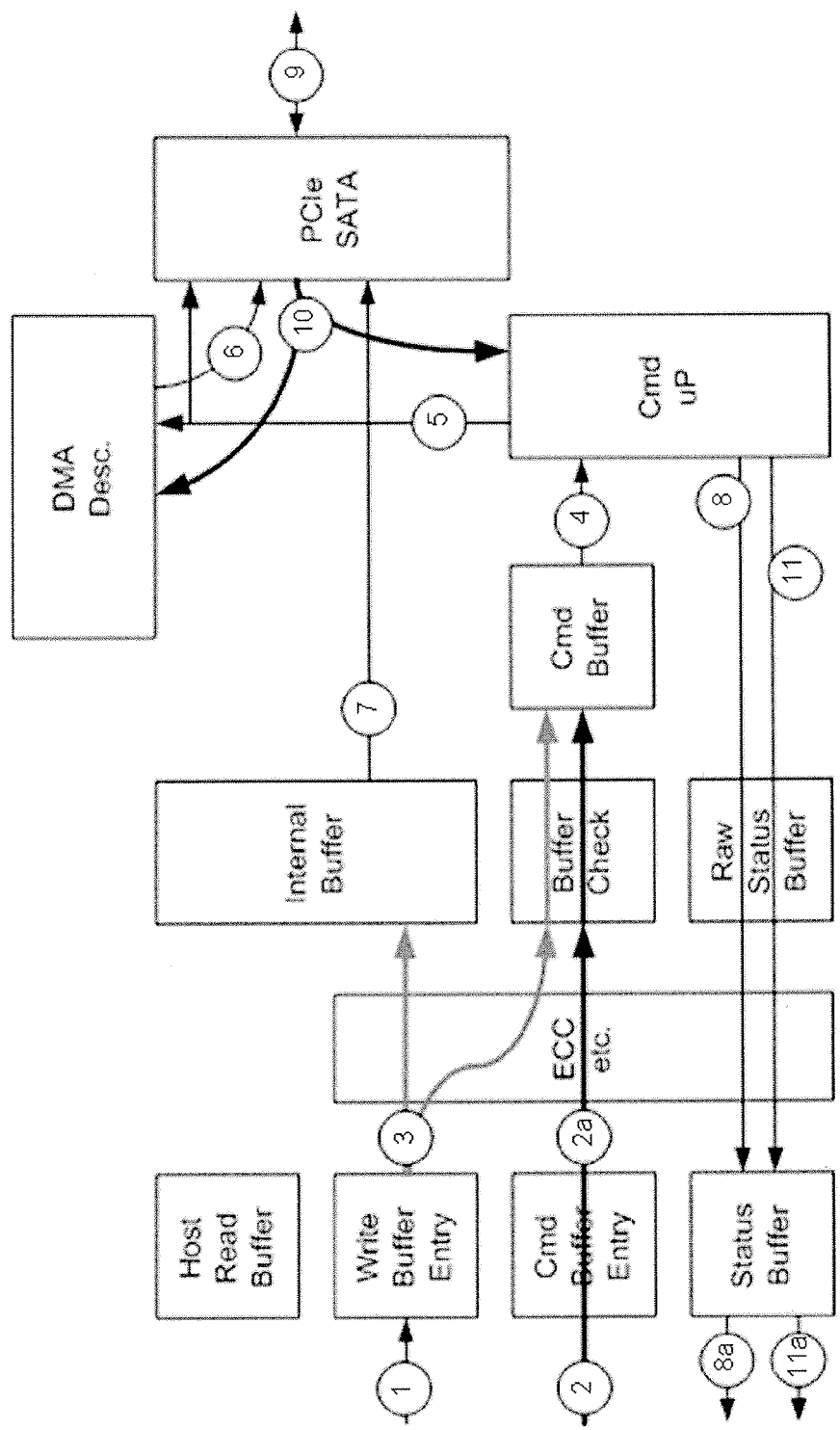
FIG. 16 illustrates a logical block diagram that shows the flow of commands and data for a write command, according to one embodiment.

FIG. 16 illustrates a logical block diagram that shows the flow of commands and data for a write command, according to one embodiment. The write process begins when the CPIO DIMM driver at the host writes a data buffer into a particular write entry point (WEP) at flow 1. The CPIO DIMM driver then writes a "write" command to a particular command buffer entry point at flow 2. The command flows through the ECC/de-interleave/de-swizzle circuitry at flow 2a. Buffer check logic determines if and when the command is complete. If the command is complete, buffer check logic begins pulling write data from the write entry point to verify the checksum and to place the data into an internal buffer at flow 3. If the calculated checksum does not match the expected checksum, flow 3 may be restarted after a timeout period.

Once the data buffer and the command buffer are ready, the command processor is informed that there is new work at flow 4. The command processor generates DMA descriptors and communicates the descriptors to the PCI-E/SATA block at flow 5. The PCI-E/SATA block reads the DMA descriptor at flow 6. The PCI-E/SATA block reads the data buffer at flow 7. During this time, the command processor updates the status buffer to indicate to the CPIO DIMM driver that the command is in progress at flow 8. The driver may or may not read the status at flow 8a.

At flow 9, the PCI-E/SATA block sends the data buffer to the SSD, and SSD write operations occur. Status returned from the SSD is stored in the DMA descriptors at flow 10.

Also, during this time, the command processor receives an interrupt from the PCI-E/SATA block. The command processor updates the status buffer with a final status at flow 11. This indicates to the driver that the data buffer has been written to the SSD. The CPIO DIMM driver reads the status buffer and observes the final status at flow 11a and completes the transaction.

Host Interface Macro (HIM)

Figure 17:
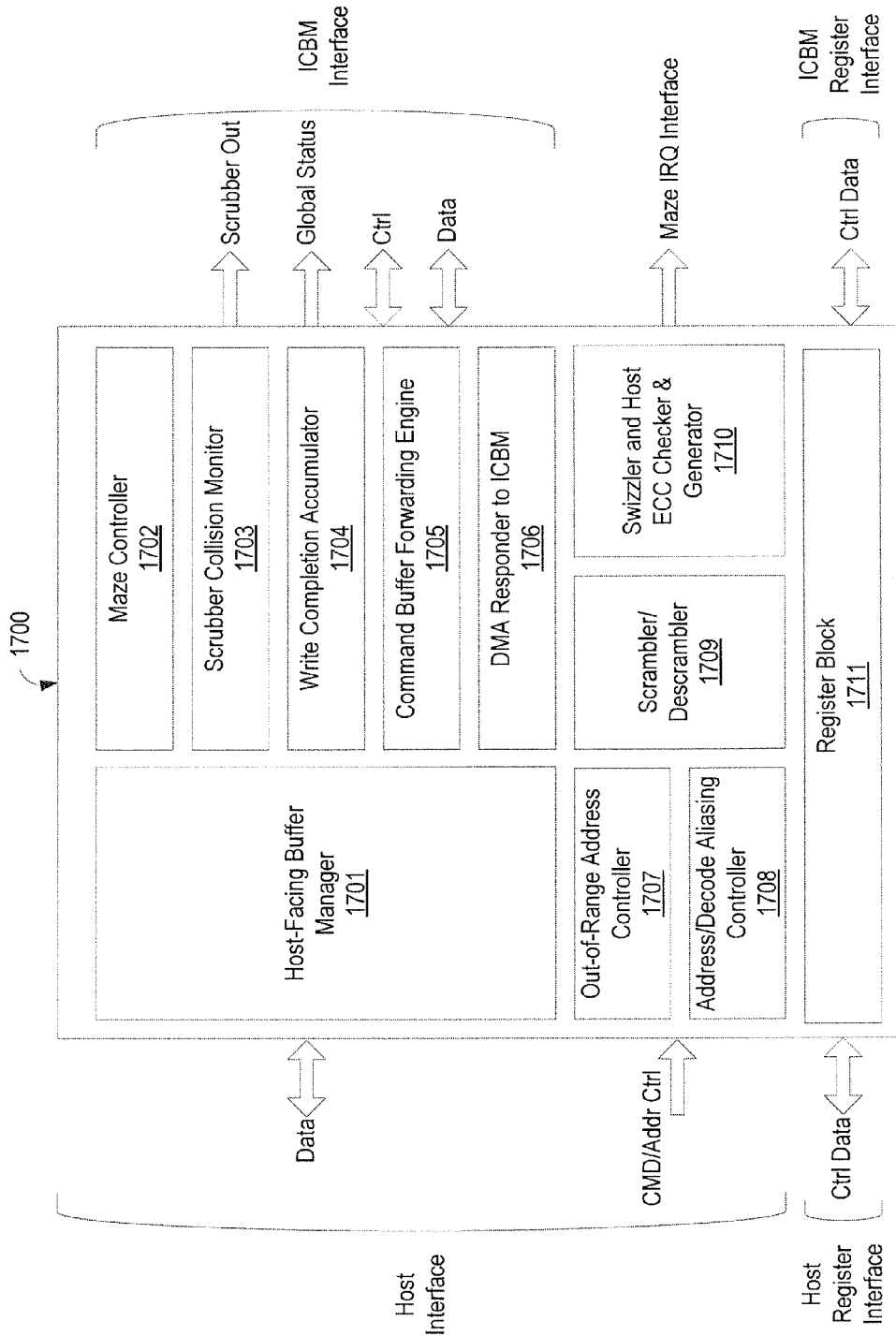
FIG. 17 illustrates a logical block diagram of an exemplary host interface of the controller ASIC, according to one embodiment.

FIG. 17 illustrates a logical block diagram of an exemplary host interface of the controller ASIC, according to one embodiment. The host interface macro (HIM) 1700 provides interfaces for data input, data output, and command, address, and control (CAC) signals to and from the host. The data and signals to and from the host are routed in the HIM to achieve timing closure and provide an efficient design of the controller ASIC. CAC signals from the host are distributed within the HIM. For example, maze controller 1702 monitors CAC transactions to detect an unlock pattern. The address decode/aliasing controller (ADAC) 1708 also monitors the CAC signals and learns data scrambling patterns. ADAC 1708 is also responsible for host-to-controller mapping functions, access logging, open bank tracking, and other types of address decoding and aliasing functions. The processed and decoded address is forwarded to the appropriate responder/consumer blocks within the HIM such as host-facing buffer manager (HFBM) 1701, scrubber collision monitor 1703, write completion accumulator (WCA) 1704, command buffer forwarding engine (CBI) 1705, DMA responder to ICBM 1706, out-of-range address controller (OORAC) 1707, scrambler/descrambler (SCRAMDES) 1709, and swizzle and host ECC checker and generator (SHECC) 1710.

Figure 18:
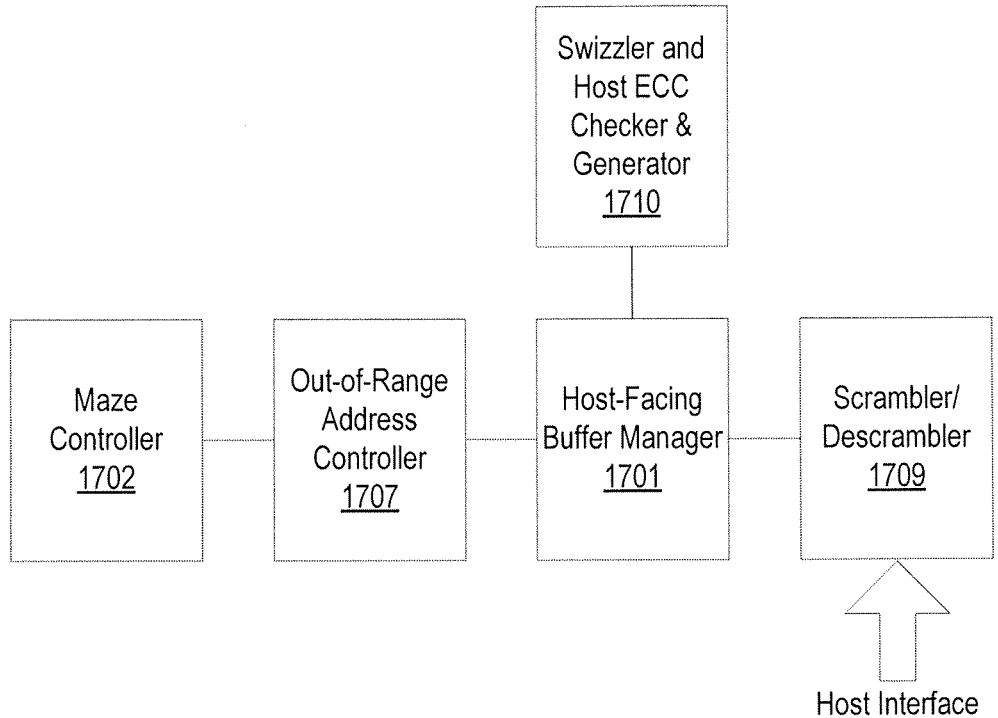
FIG. 18 illustrates an exemplary ingress data path distribution in the host interface macro (HIM), according to one embodiment.
Figure 19:
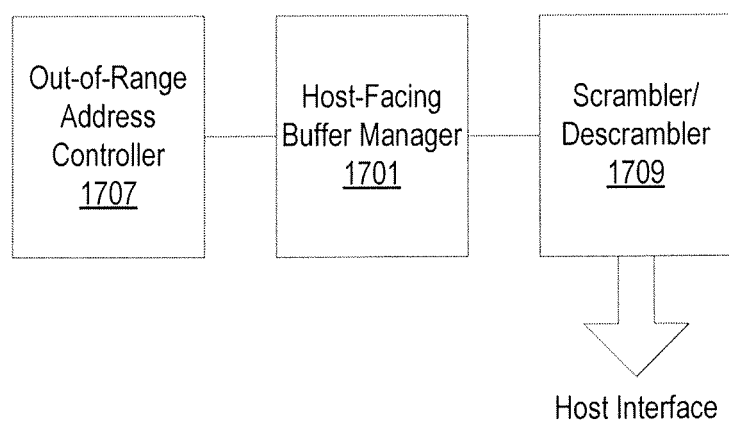
FIG. 19 illustrates an exemplary egress data flow within HIM, according to one embodiment.

FIG. 18 illustrates an exemplary ingress data path distribution in the HIM, according to one embodiment. The scrambler/descrambler 1709 monitors the data during the learning phase of ADAC 1708 in order to capture the right scrambling pattern. Command buffer writes are descrambled in the HFBM 1701 before being passed to other components for further processing. The HFBM 1701 performs phase realignment and collation of incoming data from the host using a set of target-facing buffers. The HFBM 1701 stores incoming data into the target host-facing buffers and distributes the data to other components in the HIM. The OORAC 1707 contains a cache of data written to normally read-only space for return on any subsequent reads that may occur. The maze controller 1702 uses special data/address access patterns to unlock mazes. FIG. 19 illustrates an exemplary egress data flow within HIM, according to one embodiment. The HFBM 1701 passes the outgoing data to the host using muxes to switch in data from the out-of-range address controller 1707 and XORs to descramble the data based on the input from the SCRAMDES 1709.

The data skew on the data lanes, either internal or external to the HIM, is removed by the physical layer (PHY) of the controller ASIC. The data lanes are presented to the HIM with the same alignment such that the n-th phase signals contain the data from the same clock edge for all data lanes. For example, if data is delivered to the HIM on one data lane starting at phase 0, other data lanes receive data starting at phase 0 as well.

Maze Controller

Mazes refer to various access patterns that are used to unlock various learning modes and functionalities of the controller ASIC. The maze controller 1702 maintains a master initialization state that affects the behavior of other logic elements of the HIM that face the host. In the case of a DRAM populated CPIO DIMM, the maze controller 1702 instructs the host to redirect access requests to the DRAM rank. After the initialization of the controller ASIC, the BIOS/Unified Extensible Firmware Interface (UEFI) or host driver uses the mazes as a state machine. The maze controller 1702 is responsible for detecting the maze patterns and indicating global states to the affected functional components in the HIM.

The maze controller 1702 monitors bus transactions to determine if the driver attempts to traverse the maze. If the host memory access pattern matches a maze pattern, the maze controller modifies the current maze state of the ASIC.

Once the host driver completes the maze operations, the maze is disabled, i.e., the maze is fully unlocked and all access types are allowed. A control register may be used to place the controller ASIC back in a given maze state. According to one embodiment, the default state for the controller ASIC is single-rank aliasing for a BIOS mode. Table 4 provides exemplary maze unlock sequences.

TABLE 4

| Maze Name | Actions |
| --- | --- |
| Single Rank Alias for Discovery | controller responds with inverted data whenever data is written and then read back. |
| Single Rank Alias for BIOS | controller Host Facing Read Buffers are used to implement 8 rows of DRAM. |
| Base Hunt | Hunting for Address 0/0/0 mode is enabled. |
| Address Hunt | Hunting for next address mode is enabled. |
| Address Learning | Address Learning Mode is enabled. |
| ECC/Interleave/Swizzle Learning | ECC/Interleave/Swizzle Learning Mode is enabled. |
| Full Unlock | controller is fully unlocked, all access types are allowed and the maze is disabled. |

The host driver waits approximately 1 μs (microsecond) after performing the maze unlock burst before attempting the next operation to the controller ASIC.

Table 5 provides an exemplary maze sequence of CPIO DIMM initialization assuming BIOS support (i.e., power on reset (POR)). Table 6 provides an exemplary maze sequence of CPIO DIMM initialization without BIOS support.

TABLE 5

| Current State | Next State | Comments |
| --- | --- | --- |
| Reset | 2: Alias for BIOS | MRC learning and possibly memory initialization |
| 2 | 5 | BIOS adjusts interleave and other memory addressing/control |
| 5 | 6 | Learn the Scrambler Codes and internal address ordering next |
| 6 | 4 | Learn the ECC Codes next |
| 4 | 7 | Device ready for driver operation |

TABLE 6

| Current State | Next State | Comments |
| --- | --- | --- |
| Reset | 2: Alias for BIOS | MRC learning and possibly memory initialization |
| 2 | 3 | BIOS does nothing useful |
| 3 | 4 | Driver discovers each CPIO DIMM |
| 4 | 3 | Driver learns address order for each CPIO DIMM |

TABLE 6-continued

| Current State | Next State | Comments |
|---|---|---|
| 5 | 6 | Learn the Scrambler Codes and internal address ordering next |
| 6 | 4 | Learn the ECC Codes next |
| 4 | 7 | Device ready for driver operation |

Table 7 provides maze states and chip operation of the OORAC 1701, a one hot cache, host facing buffers, and SCRAMDES 1709.

TABLE 7

| Maze State | Out-of-Range Address Controller | One Hot Cache | Host Facing Buffers | Scrambler/ Descrambler |
|---|---|---|---|---|
| 1 | Inactive | Active Write Only | Read Buffer Cache Only | controller responds with inverted data whenever data is written and then read back. |
| 2 | Inactive | Active Write Only | Read Buffer Cache Only | Inactive |
| 3 | Inactive | Active Read/Write | Read Buffer Cache Only (backup) | controller responds with inverted data when address is matched. |
| 4 | Inactive | Active Read/Write | Read Buffer Cache Only (backup) | controller responds with inverted data when address is matched. |
| 5 | Inactive | Active Read/Write | Read Buffer Cache Only (backup) | Inactive |
| 6 | Exclusively Active (responds to all addresses) | Inactive | Inactive | Active |
| 7 | Active | Inactive | Active | Active |

CAS Latency

The HIM 1700 receives a delay setting from the PHY based on CAS latency. The delay setting, based upon various operational modes such as DDR800, DDR1066, DDR1333 and DDR1600, determines a CAC delay within the CAC control data path to align with the arrival and delivery of write and read data. The HIM 1700 provides minimal latency paths for different DDR operational speeds. In one embodiment, the raw ingress CAC data passes through a programmable delay element. The HFBM address and scrambling/descrambling patterns are generated over multiple cycles, based upon the delayed CAC data. Common logic is shared for all byte lanes. The delayed CAC read/write pulse transverses a data path that is unique for each byte lane. This enables a backend placement for optimal timing. Based upon the speed grade, the CAC read/write pulse passes through N optimally placed flops that allow the pulse to reach the respective byte lanes in a desired time. The arrival of the pulse validates the multicycle HFBM address and scramble (and descramble) pattern based on the CAC latency.

Address Decode/Aliasing Controller (ADAC)

Referring to FIG. 17, the ADAC 1708 performs several functions including: 1) open bank tracking and RAS/CAS pairing, 2) host address to controller address mapping, 3) aliasing control, and 4) latency compensation. For latency compensation, the ADAC 1708 adds cycles/partial cycles for different operational speeds and programmed latencies.

The ADAC 1708 provides host-access memory controls (i.e., address enable, write enable) to the HFBM 1701. The ADAC 1708 also manages the OORAC 1707 and the SCRAMDES 1709 for egress data scramble calculation. Full cycle delays required in the data path are provided in the ADAC 1708. The ADAC 1708 compensates for all timing variations between operational modes and for the other blocks to provide a set, deterministic time for all operations once initiated by the ADAC 1708. For example, when the ADAC 1708 asserts enable to the memory in the HFBM 1701, the data coming out of the memory on a subsequent cycle is scrambled, phase aligned, and driven into the PHY. The path is known and always the same. The ADAC 1708 returns the data to the physical layer in line with the expected operational latency from the host. The maze state provided by the maze controller 1702 affects the behavior of the ADAC 1708. There are two primary functional paths within the ADAC 1708, i.e., a RAS path and a CAS path. These paths generally refer to the logic components that are used during the different stages of memory access.

The ADAC 1708 performs the following on the RAS path depending on the maze state as shown in Table 9.

TABLE 9

RAS path

| maze state | RAS path |
|---|---|
| 0 | inactive |
| 1-4 | cache activated row and map it to one of 8 16 KB read/write spaces in the HFBM. |
| 5 | cache activated row and map it to one of 8 16 KB read/write spaces in the HFBM. wait for address learning logic to provide ROW and COL mapping for RAS and Bank addresses. |
| 6 | track open banks and correlate RAS accesses to internal buffers. accesses without an internal buffer mapping default to valid internal buffer (which one is TBD/Don't-Care). |
| 7 | track open banks and correlate RAS accesses to internal buffers or out-of-range space. activate read-only protections and out-of-range handling. |

Figure 20:
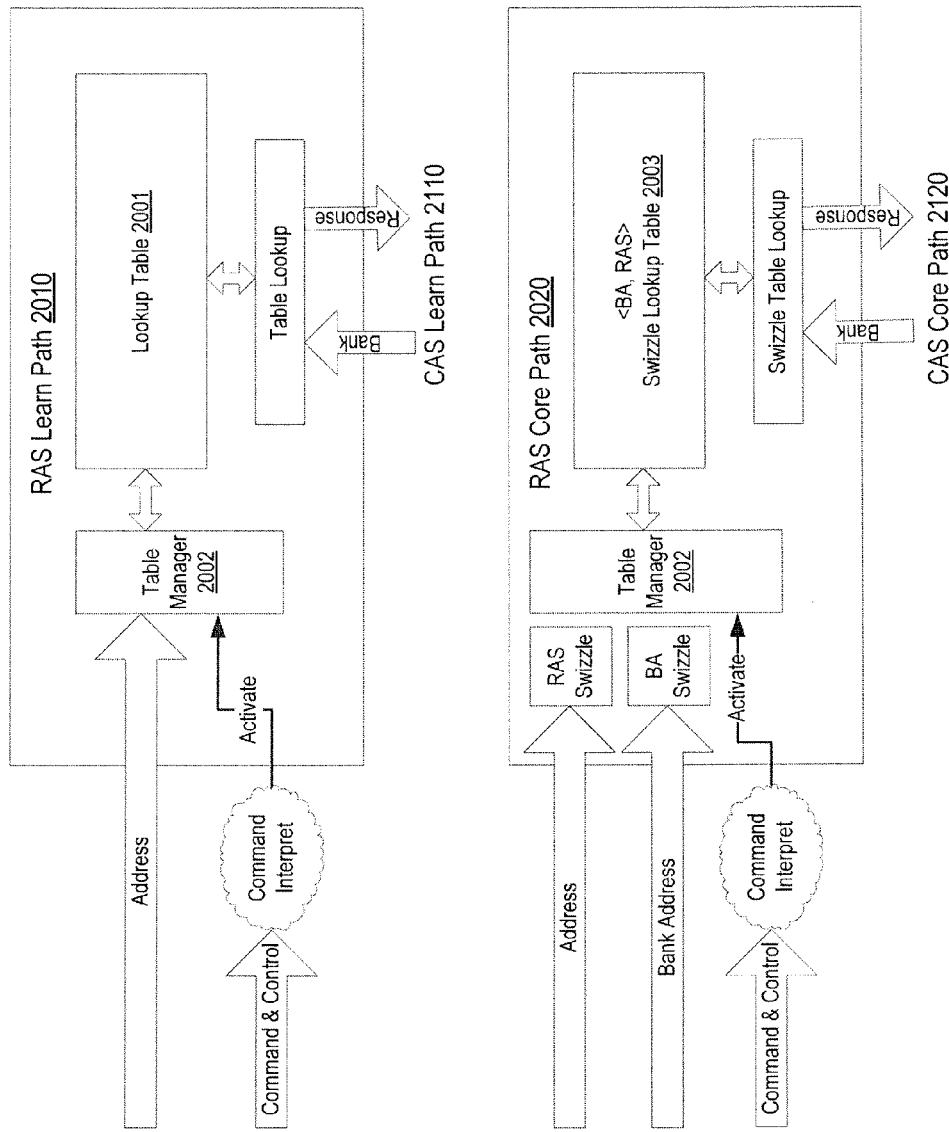
FIG. 20 illustrates an exemplary row address strobe (RAS) path, according to one embodiment.

FIG. 20 illustrates an exemplary RAS path, according to one embodiment. During an activate cycle, the RAS learn path 2010 receives both the bank address and the rank address and creates an entry in a lookup table 2001 to store the bank mapping information. Later, when a read or write cycle occurs, for a given bank address, the lookup table 2001 returns the RAS portion of the address and combines it with the CAS portion that arrives with the read or write command. During a learning mode, no de-swizzling is applied to the rank address, so an address comes in during the activate cycle and comes out during the subsequent read or write command. In an operating mode, during the read or write cycle, the address is de-swizzled before being written to the lookup table 2003.

The RAS learn path 2010 and core path 2020 maintain respective lookup tables 2001 and 2003 that are accessible by table manager 2002. These lookup tables provide a correlation of an activated bank row to an internal response (e.g., buffer selection, out-of-range, and scramble/descramble) and pair the activated bank row with incoming commands. The RAS learn path module 2010 is responsible for maze and scramble/address learning. Therefore, the RAS learn path 2010 may not be necessarily optimized for timing. On the other hand, the RAS core path 2020 decodes addresses for the memory elements; thus, the HFBM memory is optimized for address generation. As such, swizzling of the bank and RAS address is pre-computed and stored prior to a read/write command. During maze states 3, 4 and 5, swizzling is disabled to allow pre-swizzled RAS to be used as an HFBM address.

The ADAC 1708 performs the followings on the CAS path depending on the maze state as shown in Table 10.

TABLE 10

CAS path

| maze state | CAS path |
|---|---|
| 0 | inactive |
| 1-4 | perform programmed delay compensation; lookup BA for RAS/CAS pairing; CAS addresses are pass-through (no-remapping).<br>HFBM activated for all accesses.<br>SCRAMDES activated for all accesses in states 1, 3, and 4; not activated in state 2.<br>OORAC and Write Completion Accumulator (WCA) are never activated. |
| 5 | perform programmed delay compensation; lookup BA for RAS/CAS pairing; CAS addresses are pass-through (no-remapping).<br>HFBM and SCRAMDES activated for all accesses.<br>OORAC and WCA are never activated.<br>Wait for address learning logic to provide COL mapping for CAS addresses. |
| 6 | CAS address mapping is active.<br>HFBM and SCRAMDES is activated for all accesses.<br>OORAC and WCA are never activated. |
| 7 | CAS address mapping is active.<br>HFBM is activated for accesses to valid internal buffers.<br>'valid' is dependent on read/write command; e.g., a read buffer is not a valid target of a write.<br>Which client blocks (HFBM, OORAC, WCA) to activate is a function of the output from the RAS path.<br>OORAC is activated for accesses not going to valid internal buffers.<br>WCA is activated for writes to command buffers. |

The CAS path is doubled such that there is one path for writes and another path for reads because there are different control latencies for the reads and writes paths. The CAS path responses are aggregated between the two paths, and each path performs a subset, for example, the read path never activates the SCRAMDES 1709.

Figure 21:
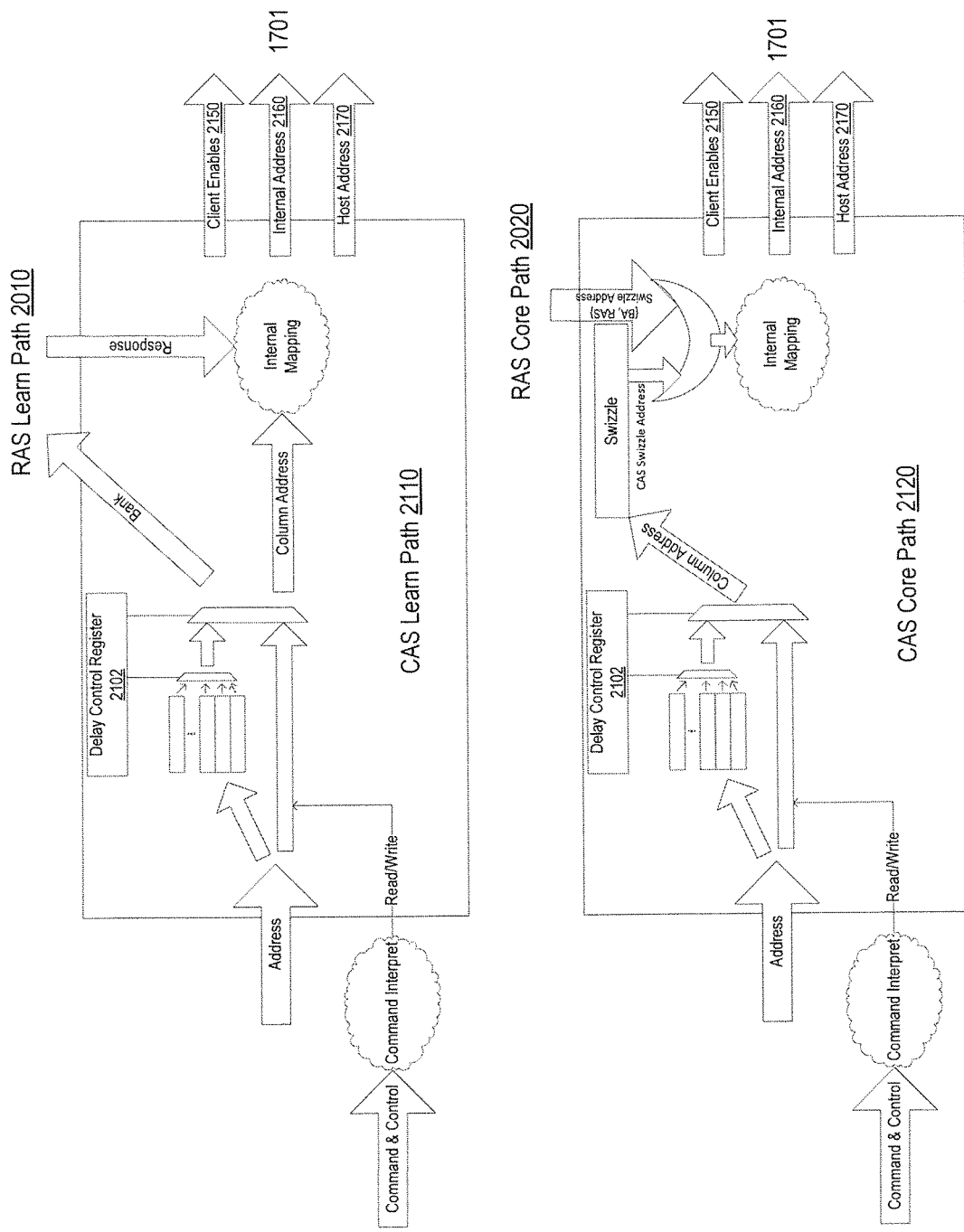
FIG. 21 illustrates an exemplary column address strobe (CAS) path, according to one embodiment.

FIG. 21 illustrates an exemplary CAS path, according to one embodiment. The CAS learn path 2110 applies a programmable delay from the arrival of a read or write command to line up the read or write data with the address using a delay control register 2102. Because the read and write paths have different delay values and the timing in these paths is tight, the hardware may be replicated for each path. The CAS learn path 2110 presents the bank address to the RAS address table of the RAS learn path 2010 at an appropriate time, concatenates the response from the RAS learn path 2010 with the CAS address, and creates the client enable 2150, the internal address 2160, and the host address 2170. During a learning mode, the CAS address is not de-swizzled before the calculation, but is de-swizzled before being used in an operational mode.

The delay control register 2102 is used to determine the number of full-cycle delays applied to any inbound read or write command. The delay control register 2102 defines the relative phase shift between a command and data that are provided to the memory blocks, such as host facing memories and command buffers. The CAS core path logic 2120 drives out the correct bank address to the CAS path lookup and pairs the response with its own address mapping to form a correct representation to give the respective client blocks. In a normal operational mode after initialization and learning are done, the generated internal address is used to enable the memories in the HFBM 1701 while the host address is used for the cache logic in the OORAC 1707 and scrambling in the SCRAMDES 1709. Client enables 2150 are used to activate a logic in the client blocks and provide relative phase information for delivering or capturing data.

According to one embodiment, as an alternative to host-based HFBM initialization, RUSH firmware initializes the HFBM memory via the DMA requester for access to HIM memories (DRAHM) interface. The core processing macro (CPM) can initialize ICBM's core buffer memory and DMA the data to different HFBM buffers in a repeated fashion.

According to one embodiment, the ADAC 1708 supports three aliasing features. The first aliasing feature of the ADAC 1708 allows the driver to minimize cache flush operations. This first aliasing feature ignores any address bit that is not relevant in accessing a buffer as show in Table 3. This feature allows any buffer to be accessed from a huge set of distinct addresses. The second aliasing feature allows the driver to minimize cache pollution and improve cache performance for other applications. This second aliasing feature makes every address bit relevant so that every buffer can only be accessed from a single address. The third aliasing feature allows each buffer type to have a limited number of aliases (i.e., 0, 1, 2, 3) that is accomplished by allowing all but 0, 1 or 2 bits to be relevant. The selection of an aliasing feature is dependent on various factors, for example, but not limited to, the CPU, the operating system and the application load.

One-Hot Address Cache

The one-hot address cache refers to a specialized data memory cache that is used to store data from memory addresses within the CPIO address space that are classified as one-hot. A one-hot address is any address where exactly one address bit is a 1 and all other address bits are a 0, or the all zero(s) address. In this regard, the one-hot address cache can be viewed as a standard data memory cache where tag values are fixed. A tag value includes the concatenation of the Bank Address (BA), Row Address (RA) and Column Address (CA) bits. For example, if the BA is 3 bits, the RAS Address is 16 bits and the CAS Address is 11 bits, the tag is 30 bits wide and there are 31 entries:

$30'b000000000000000000000000000000$
$30'b000000000000000000000000000001$
$30'b000000000000000000000000000010$
$30'b000000000000000000000000000100$
...
$30'b100000000000000000000000000000$

The implementation of the tag does not require content addressable memory (CAM), but can be implemented in logic to determine if more than a single tag bit is 1.

When a one-hot address is written, the corresponding data is written into the cache. When a one-hot address is read, the cache provides the corresponding data. As the actual memory space within the CPIO is smaller than the advertised memory space of the CPIO, the one-hot cache ensures that when the BIOS (or driver) does address learning, the CPIO contains valid data for every one-hot address. This prevents generating an ECC error when the host memory controller does a read or a read/modify/write.

During the learning process, the host driver may perform read/modify/writes to the HFBM memory spaces and attempt to write to a one hot address cache. If the host driver is optimized, a host write is broken into multiple read/modify/write transactions. In this case, reading an uninitialized HFBM memory space causes an ECC error and results in the failure of the learning process.

According to one embodiment, the one hot address cache is implemented with registers that are initialized to zero. The one hot address cache enables the host memory controller to never receive an ECC error during a read/modify/write transaction. In one embodiment, the one hot address cache is configured to have a set of muxes in parallel to the HFBM memory. In maze states 3, 4 and 5, host writes to the HFBM 1701 update the one hot address cache. In one embodiment, the index into the one-hot address cache is based upon the 29 bit address generated by {BA, RAS, CAS} being one-hot. If the generated address is non-one-hot, the data is stored into index 29 or 30 respectively. If the generated address is one-hot, the one-hot index (0.28) is the cache address. In maze states 3, 4, and 5, a host read address is determined to be either one-hot, zero, or not one-hot. For one-hot and zero read addresses, the read back data is delivered from the one-hot cache. All other addresses fetch their data from the HFBM memory. The address learning logic within the ADAC 1708 is responsible for capturing the correct address mapping for internal rows and columns. The address learning logic provides a trigger pulse upon completion for loading the results into the appropriate registers.

Scrambler/Descrambler (SCRAMDES)

The storage of scrambled data has a number of advantages, such as elimination of severe and repetitive interference effects, and balancing of data-dependent cell wearing across the memory. Some signal processing schemes, such as adaptive estimation of read thresholds, perform better when operating on scrambled data. Referring to FIG. 17, the SCRAMDES 1709 is responsible for taking input activation signaling and providing a final-stage invert/don't-invert signal to the HFBM 1701 for outputting data in response to host reads. The SCRAMDES 1709 further descrambles ingress command buffer data and internal DMA data that are withdrawn from the HFBM array for transfer to the ICBM. A large array of control registers is used to store the scramble pattern for a given host, and it is usually populated through an initialization learning sequence activated by the maze controller 1702.

The SCRAMDES 1709 utilizes a simplified initialization mode for the discovery of a CPIO DIMM. In maze states 1, 3 and 4, the SCRAMDES 1709 provides an all-invert pattern to the HFBM 1701 for all data lanes with the exception of the ECC lane. The SCRAMDES 1709 provides the ECC lane with a pattern based on a determination of whether ECC terms are of an odd (i.e., requiring invert) or even (i.e., no inverting) number of contributing bits. The determination of the pattern in the ECC lane is accomplished by a learning process activated on the entry to maze state 1 that searches for a pair of data patterns (excluding ECC) that are the inverse of one another. After those patterns are searched, the odd/even terms are stored, effectively inverting the output data when activated (the ADAC signals whether the invert logic should be activated, or not, on any access). Once the invert ECC pattern is learned, the SCRAMDES 1709 does not need to process ingress data and enters into an output-only mode.

The scramble learning algorithm relies on repeated writes (e.g., 32) to each address of zero data (from the software point of view; i.e., pre-scramble). Because read/modify/write behavior of the host may present partial data for the first few writes (worst-case is 8 writes) to a given address, a register is used to provide a threshold number of writes that must be achieved before it is presumed that the data is static and the scramble pattern can be captured.

Operational Path

Figure 22:
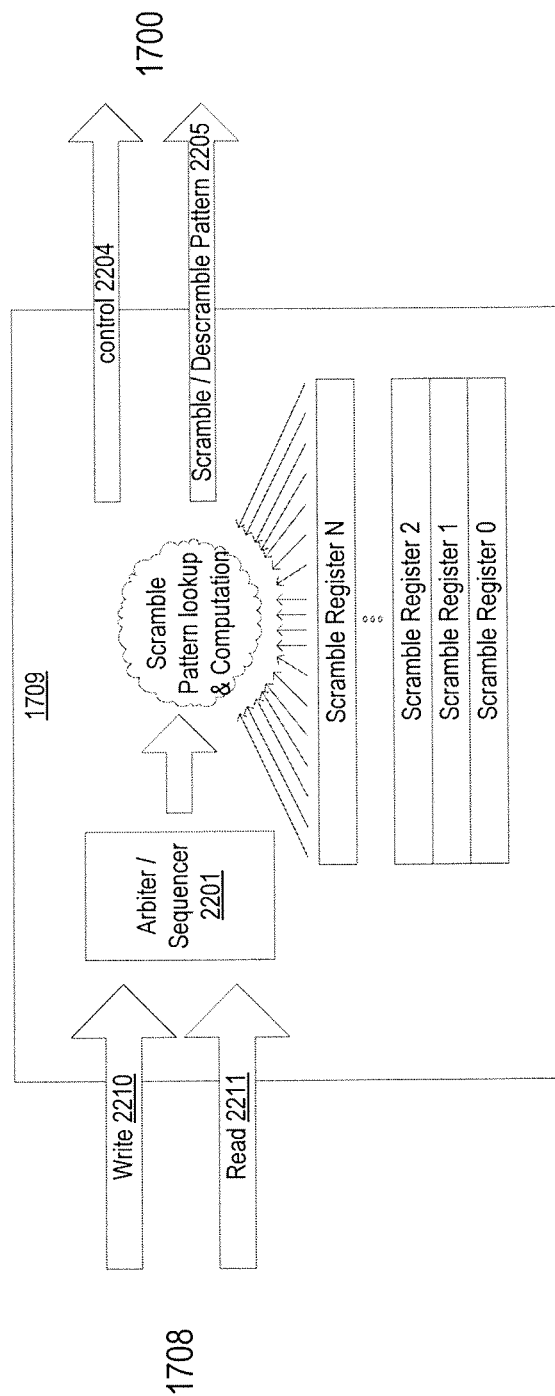
FIG. 22 illustrates an exemplary operational data path for the scrambler/descrambler (SCRAMDES), according to one embodiment.

FIG. 22 illustrates an exemplary operational data path for the SCRAMDES, according to one embodiment. The ADAC 1708 provides separate inputs for the write command path 2210 and read command path 2211. It is possible that the delay pipeline in the ADAC 1708 provides coincident commands from both the write and read command paths. For example, a write-to-read transition on a single cycle is guaranteed to be followed by an idle cycle. In such a case, read commands always take priority as the read data must be returned deterministically. When a conflict occurs, write commands tolerate a cycle of delay, therefore the sequencer/arbiter 2201 delays write commands. The SCRAMDES 1709 has an array of scramble registers that defines the per-address contribution to scrambling. Each address provided by the arbiter/sequencer 2201 is fed into the scrambler 1709 that XORs the contributing scramble registers. The scrambler/descrambler pattern 2204 is provided to the HFBM along with control signals 2205 that identify whether to XOR the outgoing read data or incoming write data.

Swizzler and Host ECC Checker and Generator (SHECC)

The SHECC 1710 transmutes data received from the host into a canonical order so that the internal representation of the data matches the representation within the controller ASIC. The SHECC 1710 performs the inverse operation for data going to the host and interleaves/swizzles data back to the positions needed by the host memory subsystem. The SHECC 1710 further performs ECC calculations to verify data coming from the host and protect/validate data going to the host.

A host swizzle refers to both bit reordering within DRAM beats and across beats. The bit reordering is also referred to as interleaving. A DRAM responds with a burst of data. Typically, the burst is 4 cycles long (but it can also be 2 cycles long), thus having 8 or 4 words (or "beats") of data. A read can start in any position. A write has to start at position 0. Because the size of the largest ECC word is 256 bits, the present swizzler supports swizzle on 256 bits (4 beats on a 64/72 bit wide DIMM) and 4 beats. The next 4 beats are identical in order/orientation. It is understood that the swizzling scheme scales so any number of swizzling bits can be supported without deviating from the present subject matter.

The first order of operation for the SHECC 1710 is learning the host swizzle and the ECC contribution of each bit. Swizzle and ECC learning is accomplished in maze state 6 where the host driver uses a walking-1 pattern across its data from what it perceives to be bit 0 to bit 255. The walking-1 pattern starts with all 0s as the first pattern and then sets a 1 in the least significant bit position and then shifts it to the most significant place 1 bit at a time. By repeatedly writing each shifted walking-1 pattern to the CPIO DIMM base address, the RUSH adapter receives the new bit information in the host-driver's expected order. To avoid read/modify/write memory controller behaviour, the RUSH returns a zero during a maze 6 DDR read transaction.

Figure 23:
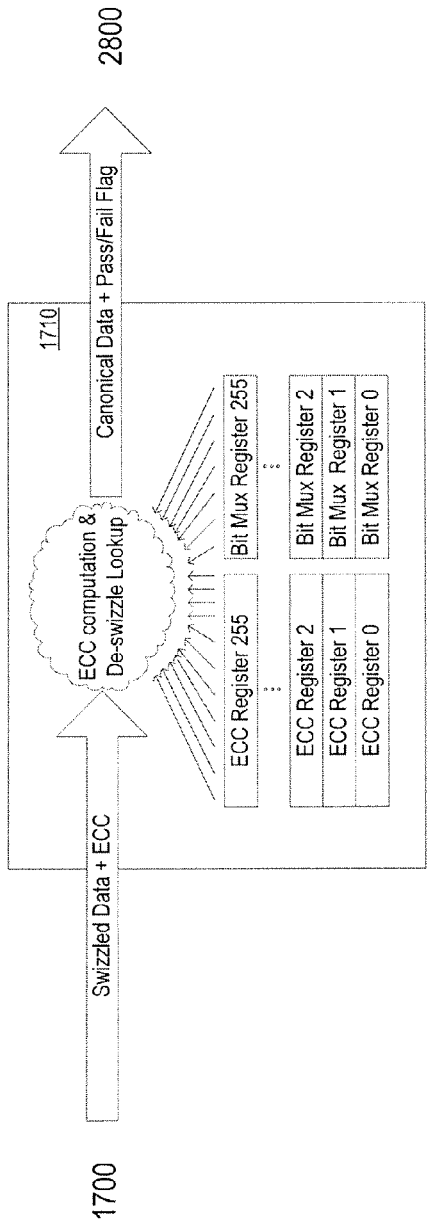
FIG. 23 illustrates an exemplary ingress data path for the swizzle and host ECC checker and generator (SHECC), according to one embodiment.

FIG. 23 illustrates an exemplary ingress data path for the SHECC, according to one embodiment. Data from the host either arrives as command buffers are written, or arrives in response to DMA accesses to the host-facing memory from the ICBM. These paths are separate, and each path is 256-bits wide. The host may provide 256 bits per cycle in sustained command buffer bursts. In one embodiment, internal DMA reads from the host-facing memory array provide sustained bursts of 256-bits per clock. The SHECC 1710 computes the ECC and compared by de-swizzle lookup. The canonical data and the ECC pass or fail flag are forwarded on to the ICBM on the HIM to the ICBM interface.

Figure 24:
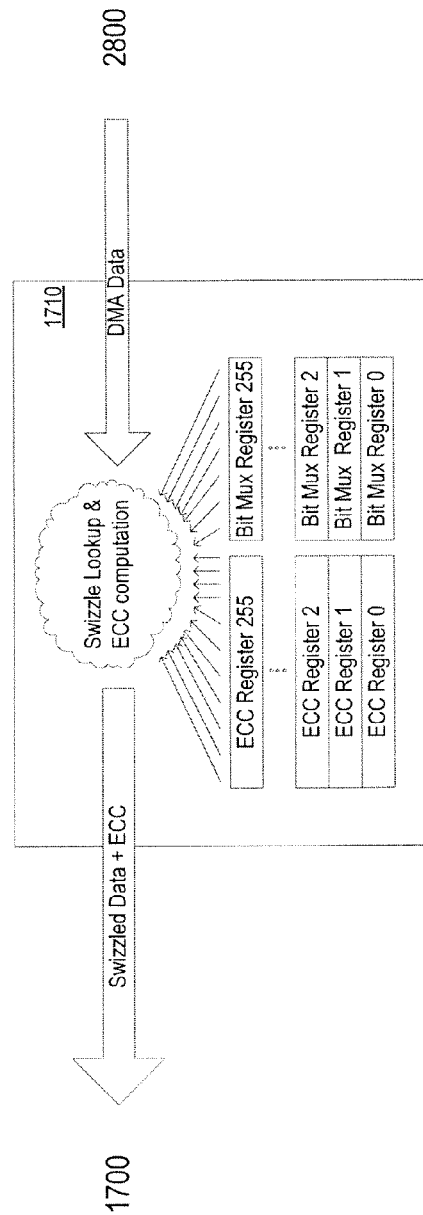
FIG. 24 illustrates an exemplary egress data path for the SHECC, according to one embodiment.

FIG. 24 illustrates an exemplary egress data path for the SHECC, according to one embodiment. The SHECC 1710 receives DMA data from the ICBM (e.g., either SSD read data or status buffers) on the egress data path, computes the ECC, and swizzles/interleaves the data bits into the correct order for the host before passing it on to the HFBM for placement into the host-facing memories. Similar to the ingress data path of FIG. 23, a 256 bit data path is exercised every cycle for sustained bursts, however it is understood that any number of bits per clock may be used for sustained burst. As illustrated in FIGS. 23 and 24, the data paths through the SHECC 1710 use the same registers for ECC computation and bit muxes. These register values are static when the data paths are operational, and the delay from the data paths to the data flops is not typically a problem. The ECC register path and bit mux register path, however, have independent combinational and sequential components to ensure no contention between them.

Out-of-Range Address Controller (OORAC)

The OORAC 1707 stores host writes to normally unreadable addresses and returns more recent data than the data in the buffer. The OORAC 1707 also provides invalid/null data in response to host reads that fall outside the recognizable address range or that target unreadable command buffers. These two functions are mostly independent. The OORAC 1710 performs null data return and caching function.

In the null data return, scrambling is done on the fly and compensates for non-zero ECC intrinsically. The null pattern is all zeroes and can be implemented inside the HFBM 1701. When null data is required, the OORAC 1707 simply flags the HFBM 1701 to insert zeroes at the appropriate point in the read data path. All reads in maze state 6 return zero to ensure any read/modify/write always writes the correct host pattern for ECC learning.

The caching function is more complicated than the null data return as it is necessary to capture incoming writes to a read-only space and override reads to the same space until an internal write to that buffer address occurs. The OORAC 1707 compensates for the host scrubber operation that may detect a valid internal bit error in the host-facing memory array. When an internal bit error is detected, the host tries to correct it and performs a read-back to test whether or not the memory is repaired. The OORAC 1707 is implemented in the HFBM arbiter and has access to the memory map decoding.

Write Completion Accumulator (WCA)

The WCA 1704 identifies when a write-buffer entry point is updated for automatic write-buffer transfers within the controller from the host-facing buffer array to the core buffer array. Write buffer entry points are tracked through a master state machine of the WCA 1704 and also through a per cache-line bit array for both the regular data buffers and the meta-data buffers. The per-cache line "written" bits (e.g., 64 bit for a regular write-buffer entry point, or 1 or 2 bit for metadata) are reset to zero on any transition to the unwritten state from any other state.

For typical memory systems, the driver writes data to the write buffer entry point and then writes a command to a command buffer. Due to reordering the write, the command may arrive before the write buffer entry point is fully written. Due to reordering and read-modify-write behavior, the write buffer may not be complete even when all the "written" bits are set. The controller ensures the checksum correctness in order to delay the execution of the command until the data is complete.

For certain memory systems, ECC checking by the memory controller may include a read/modify/write transaction followed by a read-verify transaction. ECC checking may be performed on any random memory space, including write-only memory spaces (e.g., WEP/WEP metadata space). Because data corruption may occur, the controller ensures checksum correctness. When a read transaction is detected on any write-only HFBM space, a global status field is updated at the ICBM. Status fields exist for each eight 64B cache line of the WEP, for example, 4 KB data and 128B metadata.

For the memory systems that check ECC updates, the host driver checks the global status of the respective WEP after updating the WEP but before writing the host write command. If a read transaction is detected (e.g., caused by the memory controller's ECC check) the host driver holds off issuing the host write command and determines when to issue the host write command utilizing a polling/timeout mechanism. It is noted that a read-modify-write operation by the memory controller also causes the read bit to be set. Prior to issuing the host write command, the host driver validates the 64B cache line and a remedy for the host to rewrite a portion or the whole buffer is required. After updating the WEP, the host driver issues a host write command. ICBM's command buffer manager 2801 checks the WEP availability. Once the WEP data is available, the ICBM 2800 waits for a period of time (e.g., a programmable delay) and continues with a DRAHM operation to transfer the data from HFBM to ICBM's core buffer.

Scrubber Collision Monitor (SCM)

The scrubber collision monitor 1703 monitors a host and ICBM write access to a read-only memory space such as 32 4 KB read buffers and read metadata buffers, and eight 64B status cache lines including the extended status bit. A collision to a particular read-only memory space is flagged when a host write is detected after/during a write from the ICBM. In one embodiment, ICBM DRAHM writes to the affected in-flight memory space are blocked, so as to not alter the host write data. In another embodiment, ICBM DRAHM writes transactions to the affected memory space are allowed to continue, but the memory update is blocked. The collision information is passed to the ICBM for global status and global extended status DMA updates. A 4 KB buffer collision status is reset upon the respective de-allocation commands. A programmable timeout (e.g., 100 ns-10 ms) resets respective status buffer collision bits. A software configuration bit monitors a host write to a read-only memory space. If this software bit is disabled, the scrubber collision monitor is inactive.

Host Facing Buffer Manager (HFBM)

The HFBM 1701 is responsible for data ingress and egress to and from the controller ASIC. Other blocks in the HIM 1700 contribute to host read or write data operations. For example, SCRAMDES 1709 provides a scramble/descramble pattern. However, the HFBM 1701 incorporates the data path such as phase alignment, data storage/sourcing, data forwarding, and SRAM control and arbitration.

Figure 25:
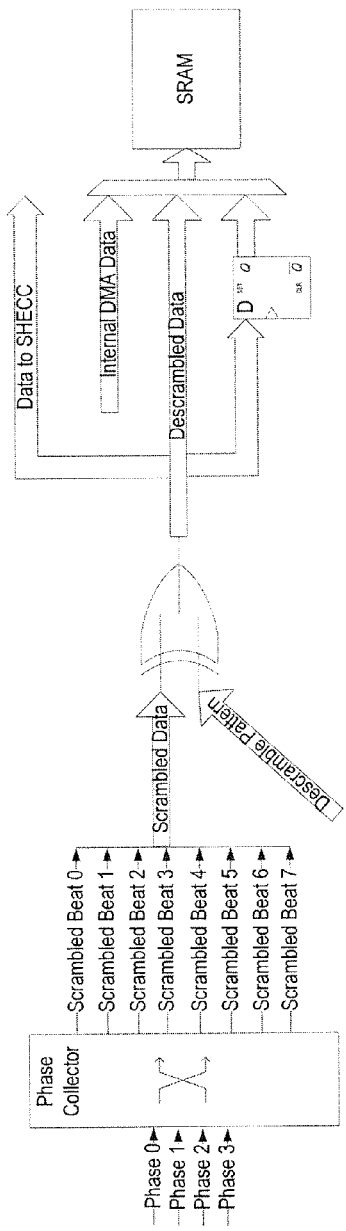
FIG. 25 illustrates an exemplary ingress data path for the host-facing buffer manager (HFBM), according to one embodiment.

FIG. 25 illustrates an exemplary ingress data path for the HFBM, according to one embodiment. The DDR phases arrive from the host driver and are collected into writeable chunks, of which possibly only 2 beats (e.g., 01 or 23) are valid on any given access. The SCRAMDES 1709 provides the descramble pattern and the data is processed before internal delivery. For writes going to the SRAM, the write command may be deferred by a cycle due a conflicting host read access that takes priority due to the read latency requirement. Descrambled data is also delivered to the SHECC 1710 that processes command buffer accesses before relaying them to the ICBM. The SRAM write port also muxes in data from the internal DMA logic that can be consumed between host accesses. FIG. 25 shows the data path from the host to the controller. The arriving data is scrambled and parallelized to a wider bus width at the clock rate (no longer DDR) that goes through an XOR operation for descrambling and a mux/arbiter towards the memory (e.g., SRAM).

Figure 26:
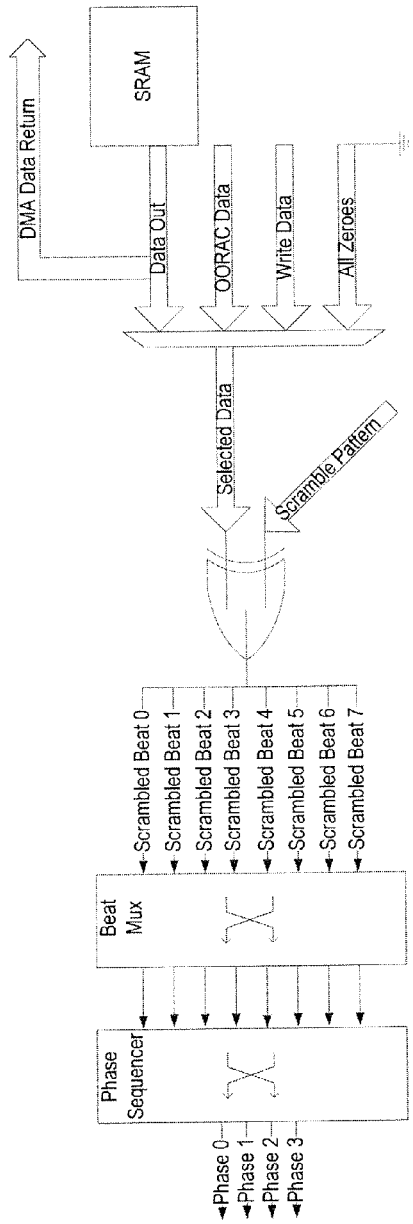
FIG. 26 illustrates an exemplary egress data path for the HFBM, according to one embodiment.

FIG. 26 illustrates an exemplary egress data path for the HFBM, according to one embodiment. There are 4 potential sources of egress data: the internal SRAM array, the cache in the OORAC, conflicting write data, or an all-zeroes/null pattern for invalid accesses (e.g., read of command buffer space). The nature of the read and write pipelines in the controller ASIC may require a read at the SRAM before a write precedes it on the external bus. So long as the two addresses are different, there is no conflict. However, when an address conflict occurs, the data to be written must be returned in place of the data from the SRAM. In the case of a burst chop 4 (BC4) write followed by a burst length 8 (BL8) read of the same address, a mix of to-be-written data and SRAM data is returned.

The egress data are muxed together, and the selected data is XOR'ed with the scramble pattern from the SCRAMDES to provide either 2 or 4 beats worth of host-valid data. CAS A[2:0] further determines the ordering of the egress beats as the beat lanes are switched to the temporal ordering expected by the memory controller. Finally, a phase sequencer is used to provide the correct phase alignment and to clock the data out over the cycles required to fulfill the burst.

The phase sequencer of HFBM 1701 handles both cycle-to-cycle delivery of outgoing data and a phase compensation. The data path is 4 beats whereas the host interface has only 2 phases. All DDR3 BL8 transfers require at least two cycles while BC4 may need only one cycle. The BC4 is required by any combination of command arrival (even or odd SDR phase) and read latency resulting in an odd outgoing phase (i.e., first beat is on Phase 1 output instead of Phase 0).

The logical SRAM and data paths in FIGS. 25 and 26 show 9 instances of each path, one per byte lane including ECC. There are 9 byte lanes in a 72-bit wide DIMM, so each byte lane has its own memory and scrambler/descrambler path. The SRAMs are either a single instance with 2 word enables per byte lane (i.e., 64-bit interface with separate write enables for each 32-bit half) or 2 instances, each 32-bits wide, to accommodate BC4 writes. For arbitration for an SRAM access, host reads have the highest priority and are always immediately executed when indicated by the ADAC 1708. Host writes have the next highest priority, and therefore, are executed immediately or on the subsequent cycle to the first one requested. This is guaranteed because the SRAM bandwidth is double that of the host, and any host access is followed by a host-idle cycle internally. Internal DMA accesses have the lowest priority and can be delayed for up to 3 cycles before they are granted because only one cycle of a host read/write conflict can occur during the transitions from writes to reads. Even if the host is reading steady after that point, the bandwidth over-provisioning guarantees host-idle cycles on every other clock cycle. The resulting worst-case sequence is a simultaneous hitting of host write, host read, and internal DMA onto the SRAM arbiter on cycle 0; then the host read wins. On cycle n+1, the host write wins, and it is the last write because the host has switched from a write mode to a read mode. On cycle n+2, the next host read is activated and wins. Finally, on cycle n+3, host accesses are idle and the internal DMA wins every other cycle until the next write/read transition occurs by the host.

DMA Responder to ICBM

Figure 27:
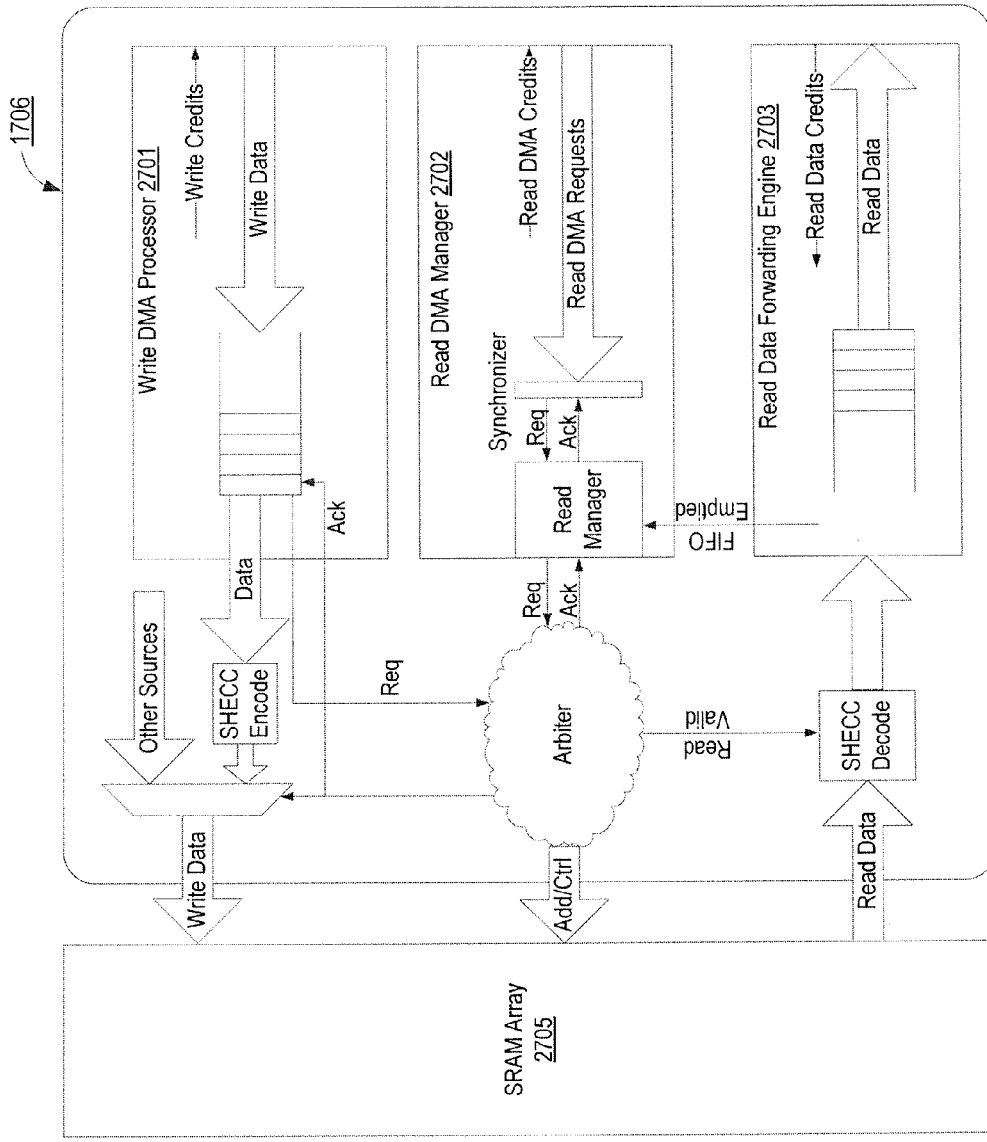
FIG. 27 illustrates a high-level architecture of an exemplary direct memory access (DMA) responder to an internal core bridge macro (ICBM), according to one embodiment.

FIG. 27 illustrates a high-level architecture of an exemplary DMA responder to ICBM, according to one embodiment. The DMA responder to ICBM 1706 has a write DMA processor 2701, a read DMA manager 2702, and a read data forwarding engine 2703. The write DMA processor 2701 is responsible for providing write credits and sinking write DMA requests and data from the ICBM. The received DMA transactions are forwarded across the clock domain boundary via an asynchronous FIFO (e.g., 8 entries deep) and are presented to the SHECC 1710 for processing such as interleaving and scrambling before being written to the host-facing SRAM array 2705. Both HFBM 1701 and SHECC 1710 accept/decline writes on a cycle by cycle basis. The maximum number of credits on the interface between HIM and ICBM is 7.

The read DMA manager 2702 provides read request credits to the ICBM and transfers the corresponding read requests across the clock domain boundary. On the host-facing side, read requests are managed for the entirety of an aggregate read. The read DMA manager 2702 presents a read request and address to the HFBM 1701 and increments the address as the transfer progresses. A flag is set alongside the data for the last line of the total read, and the tag from the read request is passed along the pipeline. The read DMA manager 1702 manages one active read at a time; once accepted, the read request pipeline queues up for another read. The clock domain crossing only transfers one read request at a time. The maximum number of credits on interface between HIM and ICBM is 1.

The read data forwarding engine 2703 is at the end of the ICBM read data pipeline in the HIM. The read data forwarding engine 2703 contains a FIFO sink for data read from the host-facing memories in response to DMA reads from the ICBM. The FIFO spans the clock domains and is the source for data leaving the HIM and going to the ICBM. The pipeline from the read DMA manager 2702 to the sink FIFO collectively advances only when the FIFO is not full. Arbitration in the HFBM 1701 also creates idle cycles at any point in a DMA stream. The maximum number of credits on the interface between HIM and ICBM is 7. The SHECC 1710 stores one cycle at a time. The HFBM 1701 accepts or declines reads on a cycle-by-cycle basis. The HFBM 1701 has a single flop stage on memory output for storage before forwarding data to the SHECC 1710.

Command Buffer Forwarding Engine (CBI)

The command buffer forwarding engine 1705 relays incoming command buffer writes over the clock domain boundary via an 8 entry asynchronous FIFO. Data from the SHECC 1710 is pushed into the FIFO as it is received, and data is read out of the FIFO on the egress side every cycle that the FIFO is not empty. It is presumed that this FIFO never overflows given that the rate of FIFO fill is every other d_clock cycle and the rate of FIFO consumption is every c_clock cycle. As long as the ratio between d_clock and c_clock is no more that 2:1, the requirement is upheld. Regardless, overflow is still monitored and captured in a register indicating a critical error.

Register Block

The register block 1711 in the HIM contains functional registers for HIM operations. Examples of such functional registers for the HIM include ECC generator registers, de-interleaving registers, interleaving registers, scrambler generator registers, address learning registers, scramble write threshold before capture, a CAS read delay register, CAS write delay register, a CAC write maze control including enable and timer that indicates the number of cycles to count, data path maze control (e.g., enables, timer), and maze state (e.g., current state, maze id).

Internal Core Bridge Macro (ICBM)

Figure 28:
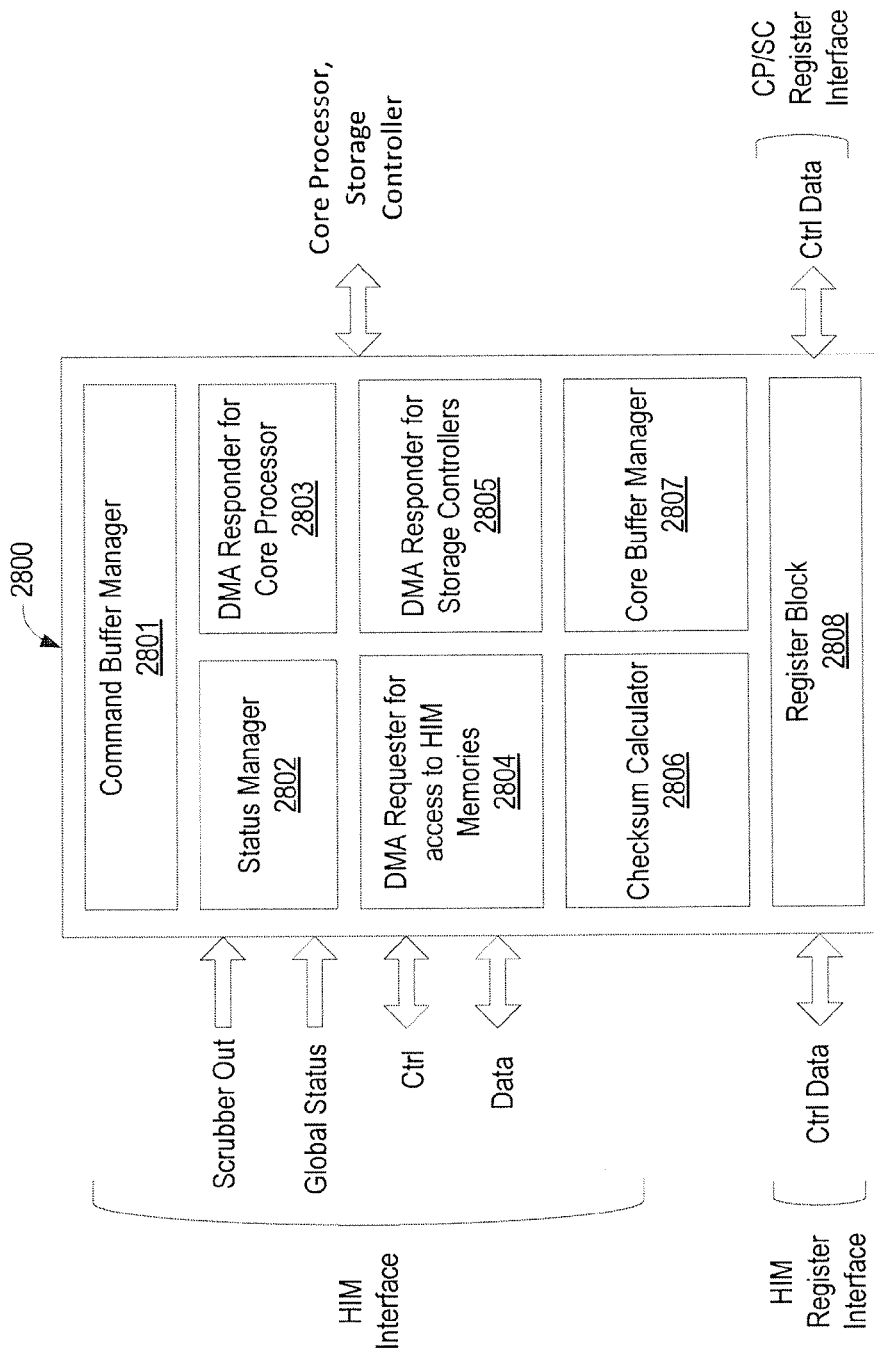
FIG. 28 illustrates a logical block diagram of an exemplary internal core bridge macro (ICBM) of the controller ASIC, according to one embodiment.

FIG. 28 illustrates a logical block diagram of an exemplary internal core bridge macro (ICBM) of the controller ASIC, according to one embodiment. The ICBM 2800 includes command buffer manager (CMDBM) 2801, status manager 2802, DMA responder for core processor (DRCP) 2803, DMA requester for access to HIM memories (DRAHM) 2804, DMA responder for storage controllers 2805, checksum calculator 2806, core buffer manager 2807, and register block 2808.

Command Buffer Manager (CMDBM)

The CMDBM 2801 collects command lines until a complete 64-byte command is collected. In one embodiment, the 64-byte command is completed when all 64-bit lines are non-zero. In another embodiment, each 64-bit word in the 64-byte command must have the same 2-bit value written into each word. Up to 512 commands can be in progress at any time. In other words, up to 512 commands can be started with the receipt of between 1 and 7 non-zero lines.

For each in-progress command, the CMDBM 2801 determines an 8-bit vector indicating which lines have non-zero values and which do not. An 8-bit non-zero vector is also determined for data from the SRAM. On a given cycle, any-to-all 64-bit portions of an incoming command is OR'ed with any SRAM data that is initialized to zero after passed by CPM and written to the SRAM. Only non-zero incoming 64-bit lines are written. When a write completes a command by providing non-zero data on the outstanding 64-bit lines, the 10-bit index of the command is posted into a command FIFO to preserve the host ordering. Also posted is a flag that indicates a host ECC error on any portion of the command write.

Each 64-bit field of a 512-bit controller command has a 2-bit IsODD and isEVEN parameter. The controller command is deemed complete if:

all 8 isODD parameters are 0x1 AND all 8 isEVEN parameter is 0x0, or
all 8 isODD parameters are 0x0 AND all 8 isEVEN parameter is 0x1.

If all 64-bit fields are non-zero and the isODD/isEVEN conditions are not met, the controller command is discarded and the command buffer (e.g., 64 bytes SRAM) is re-initialized to zero. The host driver eventually timeouts and resends the controller command.

In one embodiment, an Odd/Even filter is implemented to discard commands unless the new command has the opposite isODD/isEVEN polarity. This ensures that a command written twice (for whatever reason) is executed once.

If an error is flagged for a command, the opcode of the command is replaced with an error opcode as shown in Table 11. Once the command is passed to the CPM, the command entry in the SRAM is zero'ed out. Error opcodes are available to assist the host and the firmware to debug errors.

TABLE 11

| Error opcode | Meaning |
| --- | --- |
| 0xF6 | ECC Error in Coalesce CmdNumber FIFO |
| 0xF7 | Data Structure CmdNum does not match HIM Address derived CmdNum |
| 0xF8 | HW Cmd Opcode Error |
| 0xF9 | ECC Error in CmdBuf Manager's Input FIFO |
| 0xFA | ECC Error is CmdBuf Manager's Command Buffer |
| 0xFB | ECC Error in Write Entry DMA Transfer |
| 0xFC | Timeout Error in Write Entry Point availability |
| 0xFD | Checksum Error in Write Entry DMA Transfer |
| 0xFE | ECC Error in Host Command |
| 0xFF | Reserved |

There are 3 types of commands, HW assist, write, and CPM. HW assist commands are executed completely in hardware. CPM commands are executed by firmware running in the microprocessor within the CPM. Write commands use both hardware assist and firmware. Table 12 provides an example of hardware commands.

TABLE 12

| Command Name | Notes |
| --- | --- |
| NULL | Cmd NOT forwarded to CPM Status updated by HW |
| GetReg | Cmd NOT forwarded to CPM Status updated by HW |
| PutReg | Cmd NOT forwarded to CPM Status updated by HW |
| RESET | Cmd NOT forwarded to CPM Status updated by HW |
| DEALLOCATE | Cmd NOT forwarded to CPM Status updated by HW |
| Embedded DEALLOCATE | HW extracts the embedded DEALLOCATE and passes to Read Buffer Manager. Cmd forwarded to CPM Status updated by CPM |

As the received HW commands are forwarded, in part, to the status manager 2802, along with the associated ECC error flag.

According to one embodiment, the CMDBM 2801 undertakes special handling of write requests. The write command direct accesses memory data from HFBM 1701 to the respective write entry point buffer (or metadata).

Up to 256 write commands can be active while only a maximum of 8 write entry points are utilized. The metadata buffers are not separable. Even when using metadata exclusively, the main data buffer is effectively reserved by the operation using the metadata buffer. When a write command is received and no ECC error has occurred, the write command is flagged and the src field (i.e., last bits of 2nd command line), dst field (i.e., last bits of 3rd command line), and checksum (i.e., last 64 bits) are captured in flops. The completion of the write command triggers a DMA process for the command in question. A completed DMA command is passed to the CPM for further processing. A write command passed to the CPM has its opcode modified due to an error status (e.g., checksum failure or ECC error). The status manager 2802 is informed that the data from the specified write entry point (WEP) is transferred to the CBM 2807 successfully and is re-utilized for other commands by the host driver.

The DMA process for write data requires an availability check for the incoming data from the host. The availability is determined from events on the write buffer event interface from the HIM. The CMDBM 2801 tracks the status of write events using the host facing write buffers. A host write request comes from either the HIM or a local command buffer input. Examples of local stimulus includes Command Signaled, Retry Signaled, and Complete Signaled. Command Signaled indicates that the CMDBM 2802 has received a complete write command. Retry Signaled indicates that the CMDBM 2802 has completed a write buffer transfer and the checksum did not match. Complete Signaled indicates that the CMDBM 2802 has completed a transfer with a matching checksum, and that the DMA process is completed.

When a command is complete and the status of the corresponding write buffer entry point (or entry points if both data and metadata are required) indicates ready, a DMA transfer is posted to the DRAHM 2804. If the command requires metadata, a separate DMA transfer request is posted. The DRAHM 2804 explicitly acknowledges requests and provides completion signaling. As each request is launched and accepted by the DRAHM 2804, the address to place the returning data is pushed into a FIFO in the CBM 2807. The checksum value is also pushed into a FIFO in the checksum block, along with a flag that indicates whether to continue summing into the next request (e.g., data and metadata pairs), or complete the checksum and provide a pass/fail indication. As each request is posted to the HIM, the request is accompanied by a tag that identifies the write buffer entry point associated with the transfer.

Returning data passes are through the checksum block and then into the CBM 2807. The checksum block performs the checksum and signals completion to the CMDBM 2801 for transferring a checksum completion. As data arrives, the CBM 2807 references the tag to identify a CMDBM request, looks up the active address, and writes the data into its memory array at the correct location. When the last signal is received from the HIM, the active address is popped from the returning address FIFO in preparation for the next inbound DMA.

DMA completions from the checksum block indicate a pass or a fail. When the checksum matches, the completion is considered to be successful, and a successful completion counter is incremented for the write buffer entry point. If the checksum does not match, the transfer is failed, and the DMA completer signals a retry to the write entry point state machine. The DMA completer then waits for an indication of ready again before re-attempting the transfer. A retry counter is incremented and compared to a control register threshold. If the threshold is reached, no further transfer attempts are made, and an error flag is set for the corresponding write buffer entry point. That entry point cannot then be released to the driver until the corresponding command is forwarded to the CPM.

Available credits and a command index in the command sequencing FIFO are necessary to read the next command out of the SRAM array. The write opcodes require a successful transfer indication for the write buffer entry point that are referenced. If the successful transfer count is greater than 0, the command is forwarded to the CPM, and the successful transfer count is decremented. If the associated write entry point has a successful count of zero and the transfer error flag is set, the command is forwarded to the CPM but its opcode is altered to indicate a transfer fail status. The fail status can be either of two values depending on whether the entry point is fully written or if the watchdog timer is expired. When that process is complete, the write buffer entry point error flag is cleared, and the entry point is indicated as available to the host driver again. A similar override of the command opcode occurs on any detection of an un-correctable error when pulling the command out of the local SRAM. In this case, the opcode is replaced with a new opcode that indicates the error condition. For example, if the command was a write but it has an error (e.g., error X), the command gets changed from write to error X.

The entry point status is updated in various circumstances. For example, when a transfer from the host-facing array to the internal array is completed successfully with a matching checksum, or when a transfer is aborted and the command is relayed with modification to the CPM. In either case, an update is a toggle of the write entry point bit in the status buffer.

Status Manager

The status manager 2802 maintains a flop array of 512 bytes worth of regular status and an SRAM array with 512 64-bit lines of extended status. Individual status bytes or 64-bit lines are updated from the CPM on a cycle-by-cycle basis and ultimately DMA'ed to the HIM for placement in the host-facing SRAM array. The criteria to initiate a DMA transfer is either a pending updated regular status byte or a flush indication from the CPM. Whenever a pending regular status update is detected, the half cache line that contains that status is DMA'ed from the ICBM to the HIM. Prior to initiating the DMA, the corresponding extended status is also checked for an update. If an update is detected, the extended status is DMA'ed to the HIM prior to the regular status. If the CPM indicates a status flush event, either a particular half cache line is transferred or all status half cache lines are transferred to HIM.

It is important to preserve ordering between the extended status and the regular status because the extended status is not expected to be updated regularly. Therefore, only the regular status has an odd/even sequencing approach to ensure synchronization with the host driver. Synchronization is achieved by having an odd/even bit in each status word. A command that is received with isEVEN set is considered to be an even command and the odd/even bit is set to even. Similarly, a command with isODD set has the odd/even bit set to odd. Extended status words do not require an odd/even bit because updates are posted by the CPM prior to the corresponding regular status updates. The transfer logic is also expected to preserve ordering by correlating the extended status to the regular status. The operational procedure for preserving ordering occurs under the following conditions: 1) when a status update is detected, a snapshot of outstanding requests are taken; 2) the updated regular status cache line is captured; 3) if there are any updated extended status entries for the half cache line that is to be transferred, they are DMA'ed to the HIM; 4) the regular status half-cache line is DMA'ed to the HIM; and 5) the next updated cache line is captured and the process is repeated.

The DMA interaction for cache line transfers is performed by the DRAHM 2804 in the ICBM. On a cycle-by-cycle basis, the DRAHM 2804 accepts or declines a DMA write request to the HIM. The regular and extended status buffers are cleared at reset. The regular status buffer is an array of registers so the reset action clears the buffer. The extended status is an SRAM, so the state machine cycles through the memory accesses and writes a zero when a reset is de-asserted. The CPM firmware can update the regular status via a software register while hardware mechanisms update the extended status. Whenever a change is detected in the global status, it is pushed out the host facing memories in the HIM. The host facing status buffers in the HIM are not initialized by the hardware but are initialized by the CPM firmware by updating a status byte in each half cache line or by flushing all status and zero'ing out the host facing status locations in the HIM.

According to one embodiment, the status manager 2802 updates the regular status field using a set of commands, for example, GetReg, PutReg, Null, Reset, Write and Deallocate. The host firmware hardware also updates the status on a read allocate after the DMA is completed. The status field is written with success unless an error is detected for the command. The write command status is written with queued. The following error conditions are possible:

- a write to a read-only register is detected for a PutReg command.
- an access to an invalid address for either the PutReg or GetReg command.
- ECC error for any of the commands.

The status interface from the CPM includes a type field that identifies when a transfer of a read buffer to the host-facing SRAM array in the HIM is required. When such a status update is received, it is placed in a FIFO including a command index and an even/odd flag to enable finalizing the status when transfer is complete for processing as host-facing read buffers are available. The host-facing read buffer availability is tracked by the read buffer allocation/de-allocation logic that consumes those buffers and reserves them until a release indication is received from the CMDBM 2801.

When a transfer request is detected in the FIFO and a host-facing read buffer is available, the request is popped and relayed to the DRAHM 2804 with required information including the CBM address to read from, the address to write to in the HIM HFBM, and the number of 64-byte cache-lines to transfer (max 64). Only one such transfer can be in progress at a time, and the DRAHM 2804 indicates a completion when the last line is accepted by the HIM. The read buffer allocation/de-allocation logic requests a status update for the command involved and provides the final status including the index of the consumed host-facing read buffer.

If an un-correctable ECC error occurs on a transfer from a core buffer to a host facing buffer, the status for the corresponding command is updated to indicate a failure, and the host-facing read buffer is not consumed such that the data in the host-facing read buffer is returned to the pool of free buffers and used in a subsequent transaction. A list of allocated buffers is tracked and available via a software register. The read buffer de-allocation commands are decoded in the command buffer, and the buffer de-allocation information is passed to the status manager so that it can de-allocate the buffer and make it available for future allocation requests. A disaster recovery mechanism is available via a software register that de-allocates all buffers.

The status manager 2802 updates the global extended status bits to reflect the current status of the scrubber status. Additionally, a read buffer de-allocation status is passed to the HIM to reset the collision status bits of the read buffers.

Checksum Calculator

The checksum calculator 2806 is an adjunct block to the CMDBM 2801 and sits on the returning read data path between the HIM and the CBM 2807. The checksum calculator 2806 calculates a 128-bit fletcher checksum for buffer transfers initiated by the CMDBM 2801 and compares it to a value provided. The checksum value and a final flag are pushed by the CMDBM 2801 into a FIFO that is used for finishing the checksum and performing the compare. Only returning data tagged with the CMDBM identifier adds to the sum, and it is only when the last data for a burst is signaled that the FIFO is pop'ed and the appropriate action is taken. When a final flag is seen, an event is generated back to the CMDBM 2801 to signal a completion, indicate pass/fail, and return the tag for the transaction that indicates the index of the transferred write buffer.

The register block 2808 in the ICBM contains functional registers for all of the ICBM operations. The register block 2808 forms a part of the chip-wide register chain. The register block 2808 is used for various purposes, for example, command manager FIFO management, command manager DMA timer and retry control, status manager read buffer allocation status, ECC error status indications and management, and regular global status indicators.

Command Validation and Status Buffer Synchronization.

According to one embodiment, the present system and method provides a validation mechanism to validate a completion of a memory access command. The memory controller engages in memory access commands including read/modify/write. For example, the memory controller reads an entire cache line, but updates only a portion of it. In this example, a cache line is composed of N M-bit words, where the minimum granularity of writing values is M-bits. The encoding of commands must be done such that it is certain that command interpretation/execution does not start until all N words have been written. If two bits of each word (i.e., the two most significant bits) are designated EVEN and ODD, and the driver sets all N words to be EVEN (or to be ODD) for a given command. The driver then determines that a new command has been completely written, such as by checking that all words have the same value, and that it is different from the previously accepted command. This mechanism scales easily to a large number of independent command buffers assuming that memory is available as the state machine that performs the validation only requires a single bit (EVEN=1, ODD=0) to remember the previous state.

If the number of command buffers are small, the memory buffer that services the DDR-3 interface can be read by the host as a part of the read/modify/write operation. In this scenario, the memory controller modifies the buffer from the old command to the new command over a series of writes. After each write, the buffer is read by internal logic to have the EVEN/ODD bits checked to determine the completion of the command.

As the number of command buffers grows, it becomes more difficult to scale the size of the memory buffer that can be read by the memory controller at the full bus speed. In this case, the data returned to the host as a part of a read operation (of the read/modify/write) must be all 0s. With this constraint, the data that is written consists of words that are either 0, or words that have one of EVEN or ODD set and the remainder of the word. Each time the buffer is written, the data is passed along to an internal logic (as compared to being stored in the host accessible memory buffer) that performs a logical OR of the new data with the previous data, and the new command is built up over a series of writes. Once the command is complete, the command is sent to the next processing step, and the buffer memory is cleared to all 0s.

The EVEN/ODD bits are also used to signal a status back to the driver. The status buffer contains a set of words that signal the current state of the command. According to one embodiment, at least one status word is assigned for each command. A single bit (e.g. the most significant) contains the ODD/EVEN field and allows the driver to maintain synchronization between the value in the status field and the current command. The driver knows that the last command sent to command buffer N was EVEN, and when it reads the status buffer word N, it can check that the ODD/EVEN field of word N matches. If the ODD/EVEN does not match its expected value, the status is considered to be old and is thus ignored. Once the ODD/EVEN field matches, the status is new and pertains to the new command.

Self-Calibration of Data Buffer to CPIO

Due to the speed of the interface between the data buffer and the CPIO ASIC (or DRAM), it is critical to optimize the timing of signals to improve the signal integrity and performance. According to one embodiment, a self-calibration training algorithm determines the timing of signals for both read and write operations between the data buffer and the CPIO ASIC. Once the channel between the data buffer and the CPIO ASIC is trained, the channel between the host memory controller and the data buffer is trained. The channel training may be performed by BIOS or UEFI as a part of normal memory channel initialization.

In one embodiment, the BIOS/UEFI performs the data buffer to CPIO/DRAM channel training. In another embodiment, a firmware running on the CPIO ASIC device performs the data buffer to CPIO/DRAM channel training during the manufacturing process. The firmware on the CPI ASIC device controls the operation, and optimizes and stores the calibration information on a non-volatile storage of the CPIO DIMM. The calibration is done once for every operating speed/voltage as a part of the manufacturing of the CPIO/DRAM device. The calibration information is loaded into the CPIO ASIC and data buffer from the non-volatile memory every time the device is powered on.

According to one embodiment, the self-calibration hardware in the data buffer includes:
- a control/communications path with the CPIO ASIC for reading/writing control/status registers in the data buffer,
- a storage buffer(s) for data to be sent to the CPIO ASIC (via the data path) that can be loaded via the control path,
- a storage buffer(s) for data that is received from the CPIO ASIC (via the data path) that can be read via the control path, and
- a path from the control registers to internal circuits of the data buffer that are responsible for adjusting the timing of circuits.

The self-calibration hardware in the CPIO ASIC device includes:
- a control/communications path with the data buffer,
- a read/write path between the CPIO micro-processor and the host facing buffers in the DDR-3 PHY layer,
- a path to inject read/write commands into the DDR-3 PHY so that the CPIO micro-processor can cause DDR-3 transactions with the data buffer, and
- a path from control registers to internal circuits of the CPIO ASIC that are responsible for adjusting the timing of circuits.

According to one embodiment, the self-calibration is performed by two independently performed calibration loops, CPIO ASIC/DRAM to data buffer read path and data buffer to CPIO/DRAM write path. The self-calibration is dependent on the underlying PHY circuit design. The basic function of the present self-calibration involves sending data from one device to the other and checking the data that was received. If the received data is incorrect, the timing setting is incorrect; thus, needs to be adjusted. By adjusting the timing setting through a range of operating points, the optimal timing setting is obtained. The data that is transferred between the end devices can be of any pattern; therefore, a variety of patterns is used in order to optimize for signal integrity issues such as cross talk and ground bounce. The self-calibration loop involves:
1. configuring the timing settings in both end devices;
2. configuring the data pattern in the buffer at the originating device;
3. enabling transactions from one device to the other device;
4. reading the data pattern received at the receiving device; and
5. comparing the received pattern against the sent pattern and determining pass/fail.

The total number of calibration loops is dependent on the complexity of the timing controls available at each end device. In one embodiment, the following pseudo code is used to complete the self-calibration:

```
determine the total number of timing settings to test;
while ( tests remaining ) {
    execute calibration loop for current settings;
    store calibration results;
}
analyze calibration loop results;
select optimal timing settings;
```

The DDR3/4 DRAM supports a Multi-Purpose Register (MPR) mode where the DRAM generates read data automatically. This allows for easy calibration of the DRAM to data buffer read path. The data buffer write path to DRAM path is calibrated by writing to the DRAM and then reading the data back. In this case, since the read path is already calibrated, any error occurred in data is due to the write path calibration timing error that is not yet properly calibrated.

The timing characteristics of the various circuit components may be fixed or made to be variable. In the case of the DRAM design, all timing parameters are fixed by design. The data buffer design may be variable for the case where the data buffer communicates with the DRAM. According to one embodiment, if the data buffer communicates only with a CPIO device, the timing characteristic of the data buffer is simplified to be fixed and all timing variability is placed in the CPIO.

On DIMM DRAM to CPIO Direct Memory Access (DMA)

In a conventional memory design, the memory controller (or host processor) is the sole master of the DRAM operating in a DIMM. The memory controller is solely responsible for memory accesses, and the CPIO is prohibited from performing any memory references to the DRAM due to a conflict with the memory controller causing an operational error. The present system allows the CPIO device to perform Direct Memory Access (DMA) to the DRAM of the CPIO device without any changes to the memory controller. The present system may be extended to provide more granular DMA operations with changes to the memory controller.

The present system has a command path from the CPIO to the DRAM and a data path between the CPIO and the DRAM. The memory controller is effectively off the memory bus and not using the DRAM so that the CPIO can access the DRAM.

Figure 29:
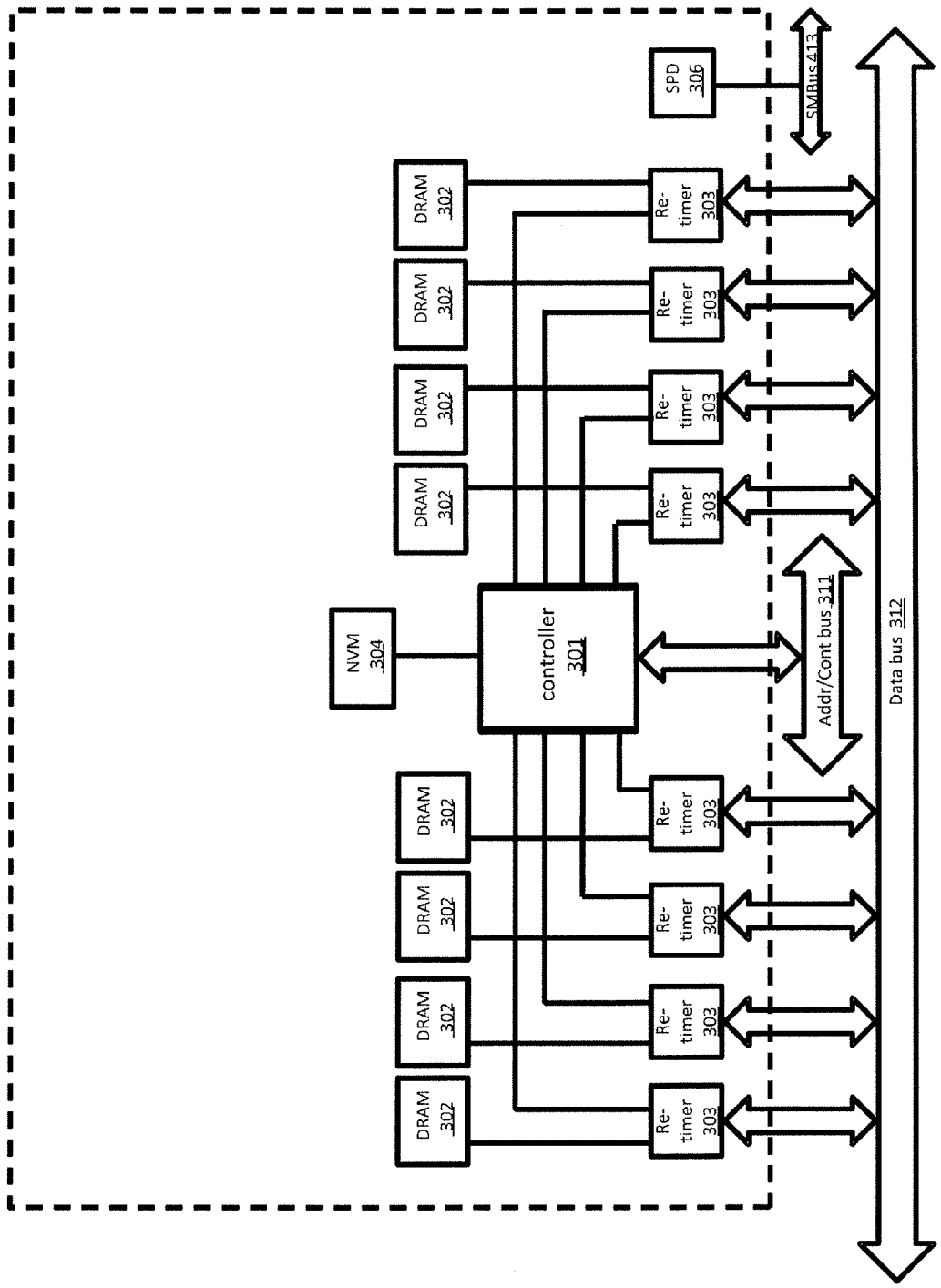
FIG. 29 illustrates a block diagram of an exemplary DIMM including a command path between the CPIO and DRAM, according to one embodiment.

FIG. 29 illustrates a block diagram of an exemplary CPIO DIMM including a command path between the CPIO and DRAM, according to one embodiment. The data buffer device provides a path between DRAM 302 and host, and CPIO 301 and host. By adding a memory (or registers) and a set of multiplexors to the data buffer 303, a command path between the CPIO 301 and the DRAM 302 is created. The data buffer 303 is also referred to as the data buffer DMA buffer. There is at least one buffer in a data buffer 303, but it is understood that multiple buffers may be used in a data buffer 303 without deviating from the scope of the present disclosure. Two or more buffers may improve the efficiency of the data/command transfer. In one embodiment, the buffers used for self-calibration are re-purposed for the DMA operation.

To move data from the DRAM 302 to the CPIO 301, the CPIO 301 requests a read operation to a DRAM 302. This request loads the data into the data buffer 303. The CPIO requests a write operation to itself from the data buffer 303. To move data from the CPIO 301 to the DRAM 302, the CPIO 301 requests a read operation to itself, which moves data into the data buffer 303. The CPIO 301 requests a DRAM write operation from the data buffer 303.

In both of the read and write operations, the CPIO 301 is responsible for generating the addresses within the DRAM 302 and within the CPIO 301 itself to select the correct data for movement and to pass the addresses as well as the appropriate commands to both the DRAM 302 and data buffer 303.

In a conventional memory design, there are no mechanisms to request the memory controller to relinquish its control of the DDR memory bus. The mechanism for doing so may include a single pin per DIMM slot that indicates the requests. The memory controller could then signal the release of the bus via a particular DDR command.

According to one embodiment, the memory controller closes all open memory pages in the DRAM prior to signaling release, allowing the CPIO to start immediately. According to another embodiment, the CPIO maintains a copy of the current DRAM bank state and performs a pre-charge command to close the pages at the beginning of the DMA and activate commands to re-open the pages at the end of the DMA.

DRAMs require refresh cycles to ensure that the memory contents are maintained. There are two key parameters governing refresh operations: tRFC and tREFI. A given DRAM technology/density has a prescribed minimum for tRFC and a prescribed maximum for tREFI. The memory controller must perform a refresh cycle every tREFI on average. The duration of refresh cycles is tRFC, and during a refresh cycle, no other command can be sent to the DRAM, and all banks in the DRAM must be closed.

The present system releases the bus from the host using the refresh characteristics of the memory controller/DRAM to allow the CPIO to perform DMA operations. In one embodiment, the duration of tRFC is increased such that the CPIO allows the DRAM to perform the refresh and begin DMA operations during the extended period of refresh cycle.

In another embodiment, the refresh rate is increased by an integer factor (e.g., N times) and uses N−1 of the refresh cycles for DMA and the remaining one of the refresh cycles to perform an actual refresh.

The SPD of a DDR DIMM contains a field that indicates the required refresh recovery delay (tRFC). The present system uses this field; therefore, no change is required to the BIOS, and only the CPIO SPD needs to be modified. The increasing refresh rate may require a change to the BIOS to recognize that for a CPIO with DMA enablement, the tREFI value must be altered.

The above example embodiments have been described hereinabove to illustrate various embodiments of implementing a system and method for interfacing co-processors and input/output devices via a main memory system. Various modifications and departures from the disclosed example embodiments will occur to those having ordinary skill in the art. The subject matter that is intended to be within the scope of the invention is set forth in the following claims.

What is claimed:

1. A method comprising:
providing a one-hot address cache comprising a plurality of one-hot addresses, wherein each one-hot address of the plurality of one-hot addresses has a bit width;
providing a host interface to a host memory controller of a host system,
wherein the one-hot address cache is configured to:
store data associated with a corresponding memory address in an address space of a memory system; and
provide the data to the host memory controller during a memory map learning process, and
wherein the plurality of one-hot addresses comprises a zero address of the bit width and a plurality of non-zero addresses of the bit width, and
wherein each one-hot address of the plurality of non-zero addresses of the one-hot address cache has only one non-zero address bit of the bit width.

2. The method of claim 1, wherein the bit width is determined based on a bank address length, a row address length and a column address length of the memory system.

3. The method of claim 1, wherein the bit width is 30 bit.

4. The method of claim 1, wherein the host memory controller writes first data to a first one-hot address of the one-hot address cache.

5. The method of claim 4, further comprising:
receiving a read command from the host memory controller at the first one-hot address; and
providing the first data to the host memory controller.

6. The method of claim 1, further comprising initializing the one-hot address cache with a plurality of registers.

7. The method of claim 1, further providing the host memory controller with valid data without an error code correction (ECC) error during the memory map learning process.

8. The method of claim 1, wherein the one hot address cache is configured to have a set of muxes in parallel to a memory of a host-facing buffer manager.

9. The method of claim 8, further comprising updating the one-hot address cache by a plurality of host writes to the host-facing buffer manager.

10. The method of claim 8, further comprising:
receiving a read command from the host memory controller at a non-one-hot address; and
providing data from the memory of the host-facing buffer manager.

11. A circuit to receive a command from a host memory controller, the circuit comprising:
a one-hot address cache comprising a plurality of one-hot addresses, wherein each one-hot address of the plurality of one-hot addresses has a bit width;
a host interface to the host memory controller of a host system,
wherein the one-hot address cache is configured to:
store data associated with a corresponding memory address in an address space of a memory system; and
provide the data to the host memory controller during a memory map learning process, and
wherein the plurality of one-hot addresses comprises a zero address of the bit width and a plurality of non-zero addresses of the bit width, and
wherein each one-hot address of the plurality of non-zero addresses of the one-hot address cache has only one non-zero address bit of the bit width.

12. The circuit of claim 11, wherein the bit width is determined based on a bank address length, a row address length and a column address length of the memory system.

13. The circuit of claim 11, wherein the bit width is 29 bit.

14. The circuit of claim 11, wherein the host memory controller writes first data to a first one-hot address of the one-hot address cache.

15. The circuit of claim 14, wherein the circuit receives a read command from the host memory controller at the first one-hot address and provides the first data to the host memory controller.

16. The circuit of claim 11, wherein the one-hot address cache is initialized with a plurality of registers.

17. The circuit of claim 11, wherein the circuit provides the host memory controller with valid data without an error code correction (ECC) error during the memory map learning process.

18. The circuit of claim 11, further comprising a host-facing memory buffer manager, wherein the one hot address cache is configured to have a set of muxes in parallel to a memory of the host-facing buffer manager.

19. The circuit of claim 18, wherein the circuit updates the one-hot address cache using a plurality of host writes to the host-facing buffer manager.

20. The circuit of claim 18, wherein the circuit receives a read command from the host memory controller at a non-one-hot address and provides data from the memory of the host-facing buffer manager.

* * * * *